(12) United States Patent
Owada et al.

(10) Patent No.: US 9,947,679 B2
(45) Date of Patent: Apr. 17, 2018

(54) METHOD OF MANUFACTURING SEMICONDUCTOR DEVICE WITH SEPARATELY FORMED INSULATING FILMS IN MAIN CIRCUIT AND MEMORY REGIONS

(71) Applicant: Renesas Electronics Corporation, Koutou-ku, Tokyo (JP)

(72) Inventors: Fukuo Owada, Tokyo (JP); Masaaki Shinohara, Tokyo (JP); Takahiro Maruyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/860,700

(22) Filed: Sep. 21, 2015

(65) Prior Publication Data
US 2016/0086961 A1 Mar. 24, 2016

(30) Foreign Application Priority Data
Sep. 24, 2014 (JP) .................................. 2014-193860

(51) Int. Cl.
H01L 27/115 (2017.01)
H01L 27/11546 (2017.01)
H01L 27/11529 (2017.01)

(52) U.S. Cl.
CPC .. *H01L 27/11546* (2013.01); *H01L 27/11529* (2013.01)

(58) Field of Classification Search
None
See application file for complete search history.

(56) References Cited

U.S. PATENT DOCUMENTS 6,750,525 B2   6/2004 Yim et al.
7,060,564 B1 *  6/2006 Kang .................... H01L 27/105
                                              257/202
(Continued)

FOREIGN PATENT DOCUMENTS

JP   2002-324860 A   11/2002
JP   2005-533370 A   11/2005
(Continued)

OTHER PUBLICATIONS

Office Action, dated Feb. 6, 2018, in Japanese Patent Application No. 2014-193860.

*Primary Examiner* — Andres Munoz
(74) *Attorney, Agent, or Firm* — Shapiro, Gabor and Rosenberger, PLLC

(57) ABSTRACT

An improvement is achieved in the performance of a semiconductor device. Over a first insulating film formed over a main surface of a semiconductor substrate located in a memory formation region and having an internal charge storage portion and over a second insulating film formed over the main surface of the semiconductor substrate located in a main circuit formation region, a conductive film is formed. Then, in the memory formation region, the conductive film and the first insulating film are patterned to form a first gate electrode and a first gate insulating film while, in the main circuit formation region, the conductive film and the second insulating film are left. Then, in the main circuit formation region, the conductive film and the second insulating film are patterned to form a second gate electrode and a second gate insulating film.

14 Claims, 61 Drawing Sheets

(56) References Cited

U.S. PATENT DOCUMENTS

| | | |
|---|---|---|
| 7,713,810 B2 | 5/2010 | Hagemeyer et al. |
| 2002/0063277 A1* | 5/2002 | Ramsbey .............. H01L 27/105 |
| | | 257/316 |
| 2007/0102754 A1 | 5/2007 | Chen et al. |
| 2008/0150002 A1 | 6/2008 | Hwang |
| 2008/0296664 A1 | 12/2008 | Ramkumar et al. |
| 2010/0025754 A1* | 2/2010 | Shiba ................ H01L 27/11568 |
| | | 257/326 |
| 2012/0104483 A1* | 5/2012 | Shroff .............. H01L 21/28273 |
| | | 257/324 |

FOREIGN PATENT DOCUMENTS

| | | |
|---|---|---|
| JP | 2009-252876 A | 10/2009 |
| WO | WO 2013/149669 | 10/2013 |

\* cited by examiner

METHOD OF MANUFACTURING SEMICONDUCTOR DEVICE WITH SEPARATELY FORMED INSULATING FILMS IN MAIN CIRCUIT AND MEMORY REGIONS

CROSS-REFERENCE TO RELATED APPLICATIONS

The disclosure of Japanese Patent Application No. 2014-193860 filed on Sep. 24, 2014 including the specification, drawings and abstract is incorporated herein by reference in its entirety.

BACKGROUND

The present invention relates to a manufacturing technique for a semiconductor device and to, e.g., a technique which is effective when applied to a manufacturing technique for a semiconductor device in which a nonvolatile memory is embedded as an add-on circuit which is added to a main circuit including a field effect transistor.

In a semiconductor device formed with a main circuit including a MISFET (Metal Insulator Semiconductor Field Effect Transistor) as a field effect transistor, an additional circuit (add-on circuit) which is added to the main circuit may be formed separately from the main circuit which provides the main function of the semiconductor device. Examples of the additional circuit include an electronic fuse used for the trimming or relief of the main circuit and a memory which stores trimming information.

In recent years, there has been a growing need for an MTP (Multi Time Programmable) electronic fuse which uses a rewritable nonvolatile memory and can be adjusted many times. At present, as a memory which stores trimming information, a nonvolatile memory (NV memory) having a floating gate structure, which is appropriate for being embedded together with the field effect transistor included in a main circuit, is used. However, this increases the size of a memory cell and therefore a change to a nonvolatile memory which allows a reduction in the size of a memory cell is under consideration. In view of such a situation, in recent years, it has been considered to use a nonvolatile memory having a MONOS (Metal Oxide Nitride Oxide Semiconductor) structure as an additional circuit.

Each of US Patent Application Publication No. 2007/0102754 (Patent Document 1) and Japanese Unexamined Patent Publication No. 2002-324860 (Patent Document 2) discloses a technique which forms a nonvolatile memory element in a cell array region and forms a MISFET in a peripheral circuit region.

US Patent Application Publication No. 2008/0296664 (Patent Document 3) discloses a technique which forms a nonvolatile charge-trapping memory element in a first region and forms a logic element in a second region. US Patent Application Publication No. 2008/0150002 (Patent Document 4) discloses a technique which forms a SONOS (Silicon Oxide Nitride Oxide Semiconductor) transistor and a MISFET. International Publication No. WO 2013/149669 (Patent Document 5) discloses a technique which produces a tunnel oxide layer for a semiconductor storage device.

RELATED ART DOCUMENTS

Patent Documents

[Patent Document 1]
   US Patent Application Publication No. 2007/0102754
[Patent Document 2]
   Japanese Unexamined Patent Publication No. 2002-324860
[Patent Document 3]
   US Patent Application Publication No. 2008/0296664
[Patent Document 4]
   US Patent Application Publication No. 2008/0150002
[Patent Document 5]
   International Publication No. WO 2013/149669

SUMMARY

In the manufacturing process of such a semiconductor device in which a nonvolatile memory is embedded as an add-on circuit, when a conductive film and an insulating film are patterned in a memory formation region, the conductive film and the insulating film in a main circuit formation region may be patterned.

However, when the thickness of the insulating film is larger in the memory formation region than in the main circuit formation region, before the insulating film is etched and completely removed from the memory formation region, the insulating film is etched and removed from the main circuit formation region to expose the main surface of a semiconductor substrate. In addition, during the period when the insulating film is etched before completely removed from the memory formation region, the exposed upper surface of the semiconductor substrate is etched. In such a case, the upper surface of the semiconductor substrate may be damaged in the main circuit formation region. This causes the deterioration of the transistor properties of the MISFET formed in the main circuit formation region or the like to result in the deterioration of the performance of the semiconductor device.

Other problems and novel features of the present invention will become apparent from a statement in the present specification and the accompanying drawings.

According to an embodiment, in a method of manufacturing a semiconductor device, a conductive film is formed over a first insulating film formed over a main surface of a semiconductor substrate located in a first region and having an internal charge storage portion and over a second insulating film formed over the main surface of the semiconductor substrate located in a second region. Then, in the first region, the conductive film and the first insulating film are patterned to form a first gate electrode and a first gate insulating film, while the conductive film and the second insulating film are left in the second region. Then, in the second region, the conductive film and the second insulating film are patterned to form a second gate electrode and a second gate insulating film.

According to the embodiment, the performance of the semiconductor device can be improved.

DETAILED DESCRIPTION

Figure 1:
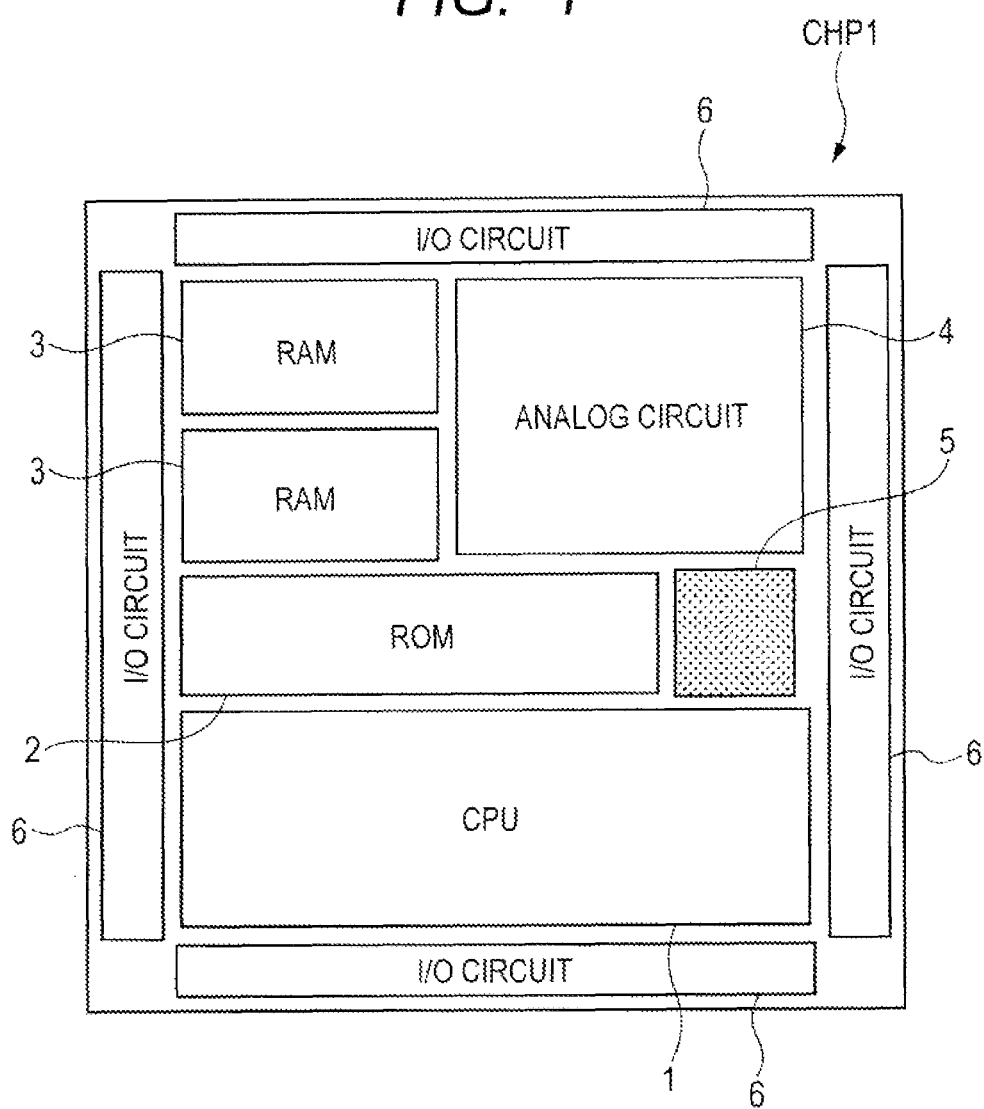
FIG. 1 is a view showing an example of a layout configuration of a semiconductor chip in Embodiment 1.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also, in the following embodiments, it goes without saying that the components thereof (including also elements, steps, and the like) are not necessarily indispensable unless particularly explicitly described otherwise or unless the components are considered to be obviously indispensable in principle.

Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

Also, throughout all the drawings for illustrating the embodiments, the same members are designated by the same reference numerals, and a repeated description thereof is omitted. Note that, for improved clarity of illustration, even a plan view may be hatched.

Embodiment 1

A technical idea in Embodiment 1 relates to a semiconductor device including, in the same semiconductor chip, a main circuit which provides the main function of a semiconductor chip and an additional circuit which is added to the main circuit and referred to as an add-on circuit. In the semiconductor device, the add-on circuit is formed of a MONOS rewritable nonvolatile memory.

For example, a SOC (System On Chip) includes a main circuit as shown below. That is, examples of the main circuit include a memory circuit such as a DRAM (Dynamic Random Access Memory) or an SRAM (Static Random Access Memory), a logic circuit such as a CPU (Central Processing Unit) or an MPU (Micro Processing Unit), and a mixed-signal circuit including a memory circuit and a logic circuit.

On the other hand, examples of the add-on circuit include a storage circuit which stores relatively low capacity information associated with the main circuit and an electronic fuse used to relieve a circuit. Examples of the relatively low capacity information include the location address information of elements used upon trimming in the semiconductor chip, the location address information of memory cells used in relieving the memory circuit, and the manufacturing number of the semiconductor device. When the semiconductor chip is an LCD (Liquid Crystal Display) driver, as the relatively low capacity information, trimming tap information for an adjustment voltage used in adjusting an LCD image can be listed.

<Example of Layout Configuration of Semiconductor Chip>

In Embodiment 1 shown below, a semiconductor chip formed with a system which provides a main function will be described as an example. The semiconductor chip in Embodiment 1 includes a lower-breakdown-voltage MISFET which is driven with a relatively low voltage, a higher-breakdown-voltage MISFET which is driven with a relatively high voltage to be capable of high-voltage driving, and a rewritable nonvolatile memory cell.

In a MISFET, a breakdown voltage refers to a pn-junction breakdown voltage which appears at the boundary between each of source/drain regions and a semiconductor substrate (well) which are included in the MISFET or the dielectric breakdown voltage of a gate insulating film. At this time, in Embodiment 1, a higher-breakdown-voltage MISFET having a relatively high breakdown voltage and a lower-breakdown-voltage MISFET having a relatively low breakdown voltage are formed in the semiconductor substrate.

FIG. 1 is a view showing an example of a layout configuration of a semiconductor chip in Embodiment 1. In FIG. 1, a semiconductor chip CHP1 includes a CPU 1, a ROM (Read Only Memory) 2, a RAM 3, an analog circuit 4, a nonvolatile memory 5, and an I/O (Input/Output) circuit 6.

The CPU 1 is referred to also as a central processing unit and corresponds to the heart of a computer or the like. The CPU 1 reads an instruction from a storage device, decodes the instruction, and performs various arithmetic and control operations on the basis of the decoded instruction and is required to perform high-speed processing. Accordingly, among the elements formed in the semiconductor chip CHP1, the MISFETs included in the CPU 1 need relatively large current driving forces. That is, the CPU 1 is formed of lower-breakdown-voltage MISFETs.

The ROM 2 is a memory in which stored information is fixed and cannot be changed and which is referred to as a read only memory. A configuration of the ROM 2 is subdivided into a NAND type in which MISFETs are coupled in series and a NOR type in which MISFETs are coupled in parallel. In most cases, the NAND type is used for an integration-density-oriented purpose, while the NOR type is used for an operation-speed-oriented purpose. The ROM 2 is also required to perform a high-speed operation so that the MISFETs included in the ROM 2 need relatively large current driving forces. That is, the ROM 2 is formed of lower-breakdown-voltage MISFETs.

The RAM 3 is a memory from which information stored therein can be read randomly, i.e., as necessary or information to be stored therein can be newly be written. The RAM 3 is referred to also as a randomly writable/readable memory. The RAM 3 as an IC memory is subdivided into two types which are a DRAM (Dynamic RAM) using a dynamic circuit and an SRAM (Static RAM) using a static circuit. The DRAM is a randomly writable/readable memory which needs a memory retention operation, while the SRAM is a randomly writable/readable memory which does not need a memory retention operation. The RAM 3 is also required to perform a high-speed operation so that the MISFETs included in the RAM 3 need relatively large current driving forces. That is, the RAM 3 is formed of lower-breakdown-voltage MISFETs.

The analog circuit 4 handles voltage/current signals which continuously change with time, i.e., analog signals and includes, e.g., an amplification circuit, a conversion circuit, a modulation circuit, an oscillation circuit, a power supply circuit, and the like. For the analog circuit 4, among the elements formed in the semiconductor chip CHP1, higher-breakdown-voltage MISFETs having relatively high breakdown voltages are used.

The nonvolatile memory 5 is a type of a nonvolatile memory which is electrically rewritable in each of a write operation and an erase operation and is referred to also as an electrically erasable programmable read only memory. In Embodiment 1, the nonvolatile memory 5 is formed of MONOS transistors. For a write operation and an erase operation to a MONOS transistor, e.g., a Fowler-Nordheim (FN) tunneling phenomenon is used. Note that it is also possible to allow a write operation or an erase operation to be performed using hot electrons or hot holes.

During a write operation to the nonvolatile memory 5 or the like, a large potential difference (of about 12 V) is applied to the MONOS transistors. Accordingly, as the MONOS transistors, relatively-high-breakdown-voltage transistors are needed.

The I/O circuit 6 is an input/output circuit for outputting data from within the semiconductor chip CHP1 to an external device coupled to the semiconductor chip CHP 1 and inputting data from the external device coupled to the semiconductor chip CHP 1 into the semiconductor chip CHP1. The I/O circuit 6 is formed of relatively-high-breakdown-voltage MISFETs.

Here, the CPU 1, the ROM 2, the RAM 3, and the analog circuit 4 form a main circuit, while the nonvolatile memory 5 forms an add-on circuit. That is, in the semiconductor chip CHP1 in Embodiment 1, the main circuit which provides the main function and the add-on circuit which is added to the main circuit are formed. In Embodiment 1, by applying MONOS transistors to the add-on circuit, advantages shown below can be obtained.

For example, the add-on circuit includes an electronic fuse, and the electronic fuse is formed of MONOS transistors as a rewritable nonvolatile memory. This offers the advantage of allowing an MTP (Multi Time Programmable) electronic fuse to be implemented. The MTP electronic fuse can be adjusted many times in a wafer state or in a package state.

Also, for example, as a memory which stores trimming information, a nonvolatile memory (NV memory) having a floating gate structure which is appropriate for being embedded together with the field effect transistor included in the main circuit is used. However, the use of the nonvolatile memory having the floating gate structure increases the size of a memory cell. In view of this, MONOS transistors are used appropriately instead of the nonvolatile memory (NV memory) having the floating gate structure to offer the advantage of allowing a reduction in the size of the memory cell. In addition, since the MONOS transistors use an FN tunneling current for rewriting data, low-current data rewriting can be performed to achieve a reduction in power consumption.

The semiconductor device in Embodiment 1 includes the main circuit and the add-on circuit. In implementing the semiconductor device in which the MONOS transistors are used appropriately as the add-on circuit, the semiconductor device in Embodiment 1 is characterized by a manufacturing technique therefor. That is, the semiconductor device in Embodiment 1 is characterized by the manufacturing technique therefor which embeds the MONOS transistors as the components of the add-on circuit together with lower-breakdown-voltage MISFETs and higher-breakdown-voltage MISFETs as the components of the main circuit.

<Circuit Block Configuration of Nonvolatile Memory>

Figure 2:
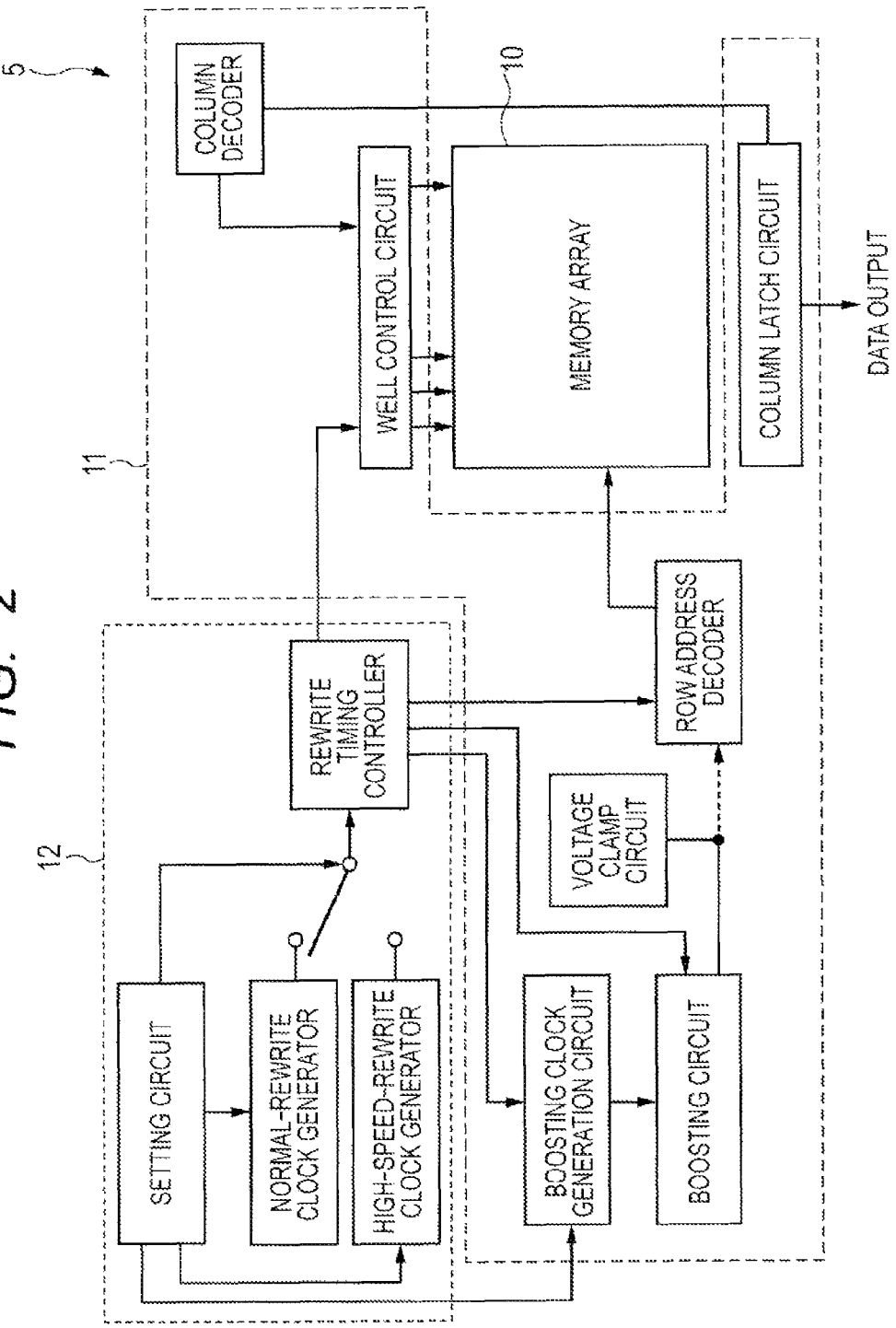
FIG. 2 is a view showing an example of a circuit block configuration of a nonvolatile memory.

FIG. 2 is a view showing an example of a circuit block configuration of the nonvolatile memory. In FIG. 2, the nonvolatile memory 5 includes a memory array 10, a direct peripheral circuit portion 11, and an indirect peripheral circuit portion 12.

The memory array 10 corresponds to the storage portion of the nonvolatile memory 5. The large number of memory cells are arranged vertically and laterally in a two-dimensional configuration (array configuration). Each of the memory cells is a circuit for storing 1-bit unit information and is formed of the MONOS transistor as the storage portion.

The direct peripheral circuit portion 11 is a circuit for driving the memory cell array 10, i.e., a drive circuit and includes, e.g., a boosting circuit which generates, from a power supply voltage, a voltage several times higher than the power supply voltage, a boosting clock generation circuit, a voltage clamp circuit, a column decoder and a row address decoder each for selecting a row and a column, a column latch circuit, a WELL control circuit, and the like. The MISFETs included in the direct peripheral circuit portion 11 are formed of higher-breakdown-voltage MISFETs which need relatively high breakdown voltages among the elements formed in the semiconductor chip CHP1.

The indirect peripheral circuit portion 12 is a circuit which controls rewriting to the memory array and includes a setting circuit, a normal-rewrite clock generator, a high-speed-rewrite clock generator, a rewrite timing controller, and the like. The MISFETs included in the indirect peripheral circuit portion 12 are formed of the lower-breakdown-voltage MISFETs which are driven with relatively low voltages and capable of high-speed operations among the elements formed in the semiconductor chip CHP1.

<Structure of Semiconductor Device>

Figure 3:
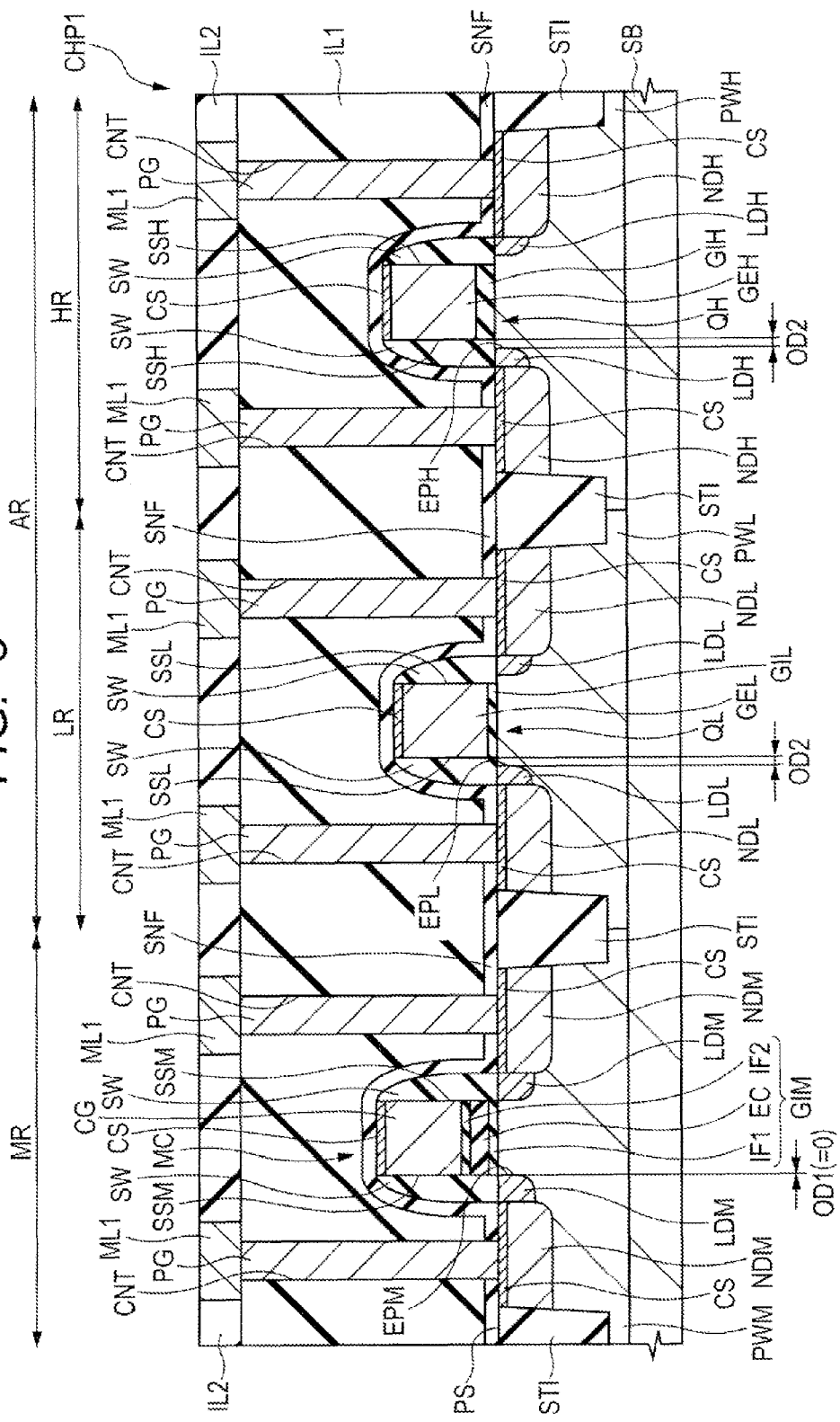
FIG. 3 is a main-portion cross-sectional view of a semiconductor device in Embodiment 1.

Next, a structure of the semiconductor chip CHP1 as the semiconductor device in Embodiment 1 will be described with reference to the drawings. FIG. 3 is a main-portion cross-sectional view of the semiconductor device in Embodiment 1.

As shown in FIG. 3, the semiconductor chip CHP1 as the semiconductor device in Embodiment 1 includes a memory formation region MR and a main circuit formation region AR. The main circuit formation region AR includes a lower-breakdown-voltage MISFET formation region LR and a higher-breakdown-voltage MISFET formation region HR.

In the memory formation region MR, the memory cells of the nonvolatile memory 5 shown in FIG. 1 are formed. The memory cells are formed of MONOS transistors MC.

In the lower-breakdown-voltage MISFET formation region LR, a lower-breakdown-voltage MISFET QL which needs a large current driving force to be capable of a high-speed operation is formed. As examples of a region where the lower-breakdown-voltage MISFET QL is formed, regions where the CPU 1, the ROM 2, and the RAM 3 are formed can be considered. The lower-breakdown-voltage MISFET QL operates with a power supply voltage of, e.g., about 1.5 V.

On the other hand, in the higher-breakdown-voltage MISFET formation region HR, a higher-breakdown-voltage MISFET QH is formed. As examples of a region where the higher-breakdown-voltage MISFET QH is formed, a region where the analog circuit 4 is formed and a region where the I/O circuit 6 is formed can be considered. The higher-breakdown-voltage MISFET QH operates with a power supply voltage of, e.g., about 5 V.

As shown in FIG. 3, the semiconductor chip CHP1 includes a semiconductor substrate SB. In an upper surface PS as the main surface of the semiconductor substrate SB, isolation regions STI which isolate elements from each other are formed. The active regions isolated by the isolation regions STI are the memory formation region MR, the lower-breakdown-voltage MISFET formation region LR, and the higher-breakdown-voltage MISFET formation region HR. That is, the memory formation region MR, the lower-breakdown-voltage MISFET formation region LR, and the higher-breakdown-voltage MISFET formation region HR are local regions of the upper-surface PS of the semiconductor substrate SB. In the memory formation region MR, on the upper surface PS side of the semiconductor substrate SB, a p-type well PWM is formed. Likewise, in the lower-breakdown-voltage MISFET formation region LR, on the upper surface PS side of the semiconductor substrate SB, a p-type well PWL is formed while, in the higher-breakdown-voltage MISFET formation region HR, on the upper surface PS side of the semiconductor substrate SB, a P-type well PWH is formed. Note that "p-type" means a conductivity type using a hole as a main charge carrier.

In Embodiment 1, n-channel MISFETs are described as an example of the MISFETs formed in the lower-breakdown-voltage MISFET formation region LR and the higher-breakdown-voltage MISFET formation region HR. However, p-channel MISFETs may also be formed in each of the regions.

Next, a description will be given of the MONOS transistor MC shown in FIG. 3. The MONOS transistor MC includes the p-type well PWM, a gate insulating film GIM, a gate electrode CG, sidewall spacers SW, n$^-$-type semiconductor regions LDM, and n$^+$-type semiconductor regions NDM. That is, the nonvolatile memory is formed of the gate electrode CG and the gate insulating film GIM. The gate insulating film GIM includes an insulating film IF1 made of, e.g., silicon dioxide, a charge storage film EC as an insulating film made of, e.g., silicon nitride, and an insulating film IF2 made of, e.g., silicon dioxide and is referred to also as an ONO (Oxide-Nitride-Oxide) film. Note that each of "n$^-$-type" and "n$^+$-type" means an conductivity type opposite to the p-type conductivity type and using an electron as a main charge carrier.

Over the p-type well PWM formed on the upper surface PS side of the semiconductor substrate SB, the insulating film IF1 is formed and, over the insulating film IF1, the charge storage film EC is formed. Over the charge storage film EC, the insulating film IF2 is formed and, over the insulating film IF2, the gate electrode CG made of a conductive film is formed. The gate electrode CG is made of, e.g., a polysilicon film.

Over the both side surfaces of the gate electrode CG, the sidewall spacers SW as side-wall portions each made of, e.g., an insulating film are formed to form LDD (lightly Doped Drain) structures. In the upper-layer portions of the parts of the p-type well PWM which are located under the sidewall spacers SW, the n$^-$-type semiconductor regions LDM are formed. In the upper-layer portions of the parts of the p-type well PWM which are located outside the n$^-$-type semiconductor regions LDM in plan view, the n$^+$-type semiconductor regions NDM are formed. The n$^+$-type semiconductor regions NDM are in contact with the n$^-$-type semiconductor regions LDM. An impurity concentration in each of the n$^+$-type semiconductor regions NDM is higher than an impurity concentration in each of the n$^-$-type semiconductor regions LDM. In the upper-layer portion of the part of the p-type well PWM which is located immediately under the insulating film IF1, a channel region is formed. Over the respective upper surfaces of the gate electrode CG and the n$^-$-type semiconductor regions NDM, silicide films CS are formed to reduce resistances.

The insulating film IF1 is made of, e.g., silicon dioxide. When electrons are injected from the semiconductor substrate SB into the charge storage film EC via the insulating film IF1 or the electrons stored in the charge storage film EC are released into the semiconductor substrate SB to store or erase data, the insulating film IF1 functions as a tunnel insulating film.

The charge storage film EC is an insulating film provided as a charge storage portion where charges contributing to data storage are stored and made of, e.g., silicon nitride. Accordingly, the gate insulating film GIM includes the charge storage film EC as the charge storage portion.

Conventionally, as the charge storage film EC, a polysilicon film has mainly been used. However, in the case of using a polysilicon film as the charge storage film EC, when there is a defect in any part of an oxide film surrounding the charge storage film EC, all the charges stored in the charge storage film EC, which is a conductor, may leak away as a result of abnormal leakage.

Accordingly, as described above, an insulating film made of silicon nitride has been used as the charge storage film EC. In this case, the charges contributing to data storage are stored at discrete trap levels (capture levels) present in the charge storage film EC. As a result, even when a defect occurs in a part of the oxide film surrounding the charge storage film EC, since the charges are stored at the discrete trap levels in the charge storage film EC, there is no situation where all the charges leak away from the charge storage film EC. This allows an improvement in the reliability of data retention.

For a reason as stated above, by using not only an insulating film made of silicon nitride, but also a film containing discrete trap levels as the charge storage film EC, it is possible to achieve an improvement in the reliability of data retention.

The insulating film IF2 is made of, e.g., silicon dioxide. When data is stored or erased by injecting electrons from the gate electrode CG into the charge storage film EC via the insulating film IF2 or releasing the electrons stored in the charge storage film EC into the gate electrode CG, the insulating film IF2 functions as a tunnel insulating film.

The sidewall spacers SW are formed to provide each of the source region and the drain region as the semiconductor regions of the MONOS transistor MC with an LDD structure. That is, each of the source region and the drain region of the MONOS transistor MC is formed of the $n^-$-type semiconductor region LDM and the $n^+$-type semiconductor region NDM. At this time, by forming each of the source region under the gate electrode CG and the drain region under the gate electrode CG of the $n^-$-type semiconductor region LDM, it is possible to suppress the concentration of an electric field under each of the end portions of the gate electrode CG.

Next, a description will be given of a lower-breakdown-voltage MISFET QL. The lower-breakdown-voltage MISFET QL includes the p-type well PWL, a gate insulating film GIL, a gate electrode GEL, the sidewall spacers SW, $n^-$-type semiconductor regions LDL, and $n^+$-type semiconductor regions NDL.

Over the p-type well PWL formed on the upper surface PS side as the main surface of the semiconductor substrate SB, the gate insulating film GIL is formed and, over the gate insulating film GIL, the gate electrode GEL is formed. The gate insulating film GIL is made of, e.g., silicon dioxide. The gate electrode GEL is made of, e.g., a polysilicon film.

Over the both side surfaces of the gate electrode GEL, the sidewall spacers SW as side-wall portions each made of, e.g., an insulating film are formed. In the upper-layer portions of the parts of the p-type well PWL which are located under the sidewall spacers SW, the $n^-$-type semiconductor regions LDL are formed. In the upper-layer portions of the parts of the p-type well PWL which are located outside the $n^-$-type semiconductor regions LDL in plan view, the $n^+$-type semiconductor regions NDL are formed. The $n^+$-type semiconductor regions NDL are in contact with the $n^-$-type semiconductor regions LDL. An impurity concentration in each of the $n^+$-type semiconductor regions NDL is higher than an impurity concentration in each of the $n^-$-type semiconductor regions LDL. In the upper-layer portion of the part of the p-type well PWL which is located immediately under the gate insulating film GIL, a channel region is formed. Over the respective upper surfaces of the gate electrode GEL and the $n^+$-type semiconductor regions NDL, the silicide layers CS are formed to reduce resistances.

Subsequently, a description will be given of the higher-breakdown-voltage MISFET QH. The higher-breakdown-voltage MISFET QH includes a p-type well PWH, a gate insulating film GIH, a gate electrode GEH, the sidewall spacers SW, $n^-$-type semiconductor regions LDH, and $n^+$-type semiconductor regions NDH.

Over the p-type well PWH formed on the upper surface PS side as the main surface of the semiconductor substrate SB, the gate insulating film GIH is formed and, over the gate insulating film GIH, the gate electrode GEH is formed. The gate insulating film GIH is made of, e.g., silicon dioxide. The gate electrode GEH is made of, e.g., a polysilicon film.

Over the both side surfaces of the gate electrode GEH, the sidewall spacers SW as side-wall portions each made of, e.g., an insulating film are formed. In the upper-layer portions of the parts of the p-type well PWH which are located under the sidewall spacers SW, the $n^-$-type semiconductor regions LDH are formed. In the upper-layer portions of the parts of the p-type well PWH which are located outside the $n^-$-type semiconductor regions LDH in plan view, the $n^+$-type semiconductor regions NDH are formed. The $n^+$-type semiconductor regions NDH are in contact with the $n^-$-type semiconductor regions LDH. An impurity concentration in each of the $n^+$-type semiconductor regions NDH is higher than an impurity concentration in each of the $n^-$-type semiconductor regions LDH. In the upper-layer portion of the part of the p-type well PWH which is located immediately under the gate insulating film GIH, a channel region is formed. Over the respective upper surfaces of the gate electrode GEH and the $n^+$-type semiconductor regions NDH, the silicide layers CS are formed to reduce resistances.

To the higher-breakdown-voltage MISFET QH, a voltage higher than that applied to the lower-breakdown-voltage MISFET QL is applied. Accordingly, the thickness of the gate insulating film GIH of the higher-breakdown-voltage MISFET QH is larger than the thickness of the gate insulating film GIL of the lower-breakdown-voltage MISFET QL. This can improve the dielectric strength of the gate insulating film GI of the higher-breakdown-voltage MISFET QH. That is, it is possible to increase the breakdown voltage of the higher-breakdown-voltage MISFET QH.

Note that, in FIG. 3, the difference between the respective gate lengths of the gate electrodes GEH and GEL is not shown, but the gate length of the gate electrode GEH may also be longer than the gate length of the gate electrode GEL. By reducing the gate length of the gate electrode GEL in the lower-breakdown-voltage MISFET QL, it is possible to reduce the resistance between the source region and the drain region and improve a current driving force. On the other hand, by increasing the gate length of the gate electrode GEH in the higher-breakdown-voltage MISFET QH, even when a relatively high potential is applied, it is possible to prevent a punch-through from occurring between the source region and the drain region.

Note that the thickness of the gate insulating film GIM of the MONOS transistor MC is larger than the thickness of the gate insulating film GIL of the lower-breakdown-voltage MISFET QL. In such a case, the effect of forming the gate insulating film GIL in a step subsequent to the step of forming the gate insulating film GIM becomes prominent.

Over the semiconductor substrate SB, an insulating film SNF has been formed so as to cover the MONOS transistor MC, the lower-breakdown-voltage MISFET QL, and the higher-breakdown-voltage MISFET QH. For example, the insulating film SNF is made of, e.g., silicon nitride or the like.

Over the insulating film SNF, an interlayer insulating film IL1 is formed. The interlayer insulating film IL is made of an insulating film made of silicon dioxide, a laminated film including an insulating film made of silicon nitride and an insulating film made of silicon dioxide, or the like. The upper surface of the interlayer insulating film IL1 has been planarized.

In the interlayer insulating film IL1, contact holes CNT are formed and, in the contact holes CNT, plugs PG each made of a conductor film are embedded. Each of the plugs PG is formed of a thin barrier conductor film formed over the bottom portion and side wall, i.e., side surface of the contact hole CNT and a main conductor film formed over the barrier conductor film so as to be embedded in the contact hole CNT. In FIG. 3, for simpler illustration, the barrier conductor film and the main conductor film which are included in each of the plugs PG are integrally shown. Note that the barrier conductor film included in the plug PG can be, e.g., a titanium (Ti) film, a titanium nitride (TiN) film, or a laminated film thereof. The main conductor film included in the plug PG can be, e.g., a tungsten (W) film.

The plugs PG are formed over the respective $n^+$-type semiconductor regions NDM, NDL, and NDH and are also formed over the gate electrodes CG, GEL, and GEH, though the illustration thereof is omitted. The plugs PG are electrically coupled the respective $n^+$-type semiconductor regions NDM, NDL, and NDH and are also electrically coupled to the gate electrodes CG, GEL, and GEH, though the illustration thereof is omitted.

Over the interlayer insulating film IL1 in which the plugs PG are embedded, an interlayer insulating film IL2 is formed. In the wire trenches formed in the interlayer insulating film IL2, first-layer wires ML1 are formed as damascene wires as embedded wires using, e.g., copper (Cu) as a main conductive material. Above the first-layer wires ML1, upper-layer wires are also formed as damascene wires, but the illustration and description thereof is omitted herein. The first-layer wires ML1 and the wires in the layers located thereabove are not limited to the damascene wires and can also be formed by patterning conductive films for wires. For example, the first-layer wires ML1 and the wires in the layers located thereabove can also be tungsten (W) wires, aluminum (Al) wires, or the like.

In Embodiment 1, an amount of offset OD1 of each of the $n^-$-type semiconductor regions LDM from the gate electrode CG is 1 or 0 or smaller than an amount of offset OD2 of each of the $n^-$-type semiconductor regions LDL from the gate electrode GEL, i.e., the amount of offset OD2 of each of the $n^-$-type semiconductor regions LDH from the gate electrode GEL.

The amount of offset OD1 mentioned herein is the distance of the position of an end portion EPM of each of the $n^-$-type semiconductor regions LDM which is located closer to the gate electrode CG and spaced outward from the one of the both side surfaces SSM of the gate electrode CG which is located closer to the $n^-$-type semiconductor region LDM in plan view to the side surface SSM. On the other hand, the amount of offset OD2 mentioned herein is the distance of the position of an end portion EPL of each of the $n^-$-type semiconductor regions LDL which is located closer to the gate electrode GEL and spaced outward in the gate length direction of the gate electrode GEL from the one of the both side surfaces SSL of the gate electrode GEL which is located closer to the $n^-$-type semiconductor region LDL in plan view to the side surface SSL. The amount of offset OD2 is also the distance of the position of an end portion EPH of each of the $n^-$-type semiconductor regions LDH which is located closer to the gate electrode GEH and spaced outward in the gate length direction of the gate electrode GEH from the one of the both side surfaces SSH of the gate electrode GEH which is located closer to the $n^-$-type semiconductor region LDH in plan view to the side surface SSH.

This allows a reduction in the amount of offset OD1 of each of the $n^-$-type semiconductor regions LDM from the gate electrode CG. As a result, even when the $n^-$-type semiconductor region LDM is expanded as a result of impurity diffusion during activation anneal, the length of the portion of the $n^-$-type semiconductor region LDM overlapping the gate electrode CG in plan view in the gate length direction of the gate electrode CG increases so that an electric field due to the gate electrode CG is more likely to reach the channel region. Accordingly, even when the gate length decreases in the MONOS transistor MC, the voltage difference between a threshold voltage Vth1 during a write operation and a threshold voltage Vth2 during an erase operation is less likely to decrease.

Note that the amount of offset OD2 of each of the $n^-$-type semiconductor regions LDL from the gate electrode GEL and the amount of offset OD2 of each of the $n^-$-type semiconductor regions LDH from the gate electrode GEH may be either equal to or different from each other.

<Operation of Nonvolatile Memory>

The semiconductor device in Embodiment 1 is configured as described above. The following will describe operations to the memory cells (nonvolatile memory cells) included in the semiconductor device.

Figure 4:
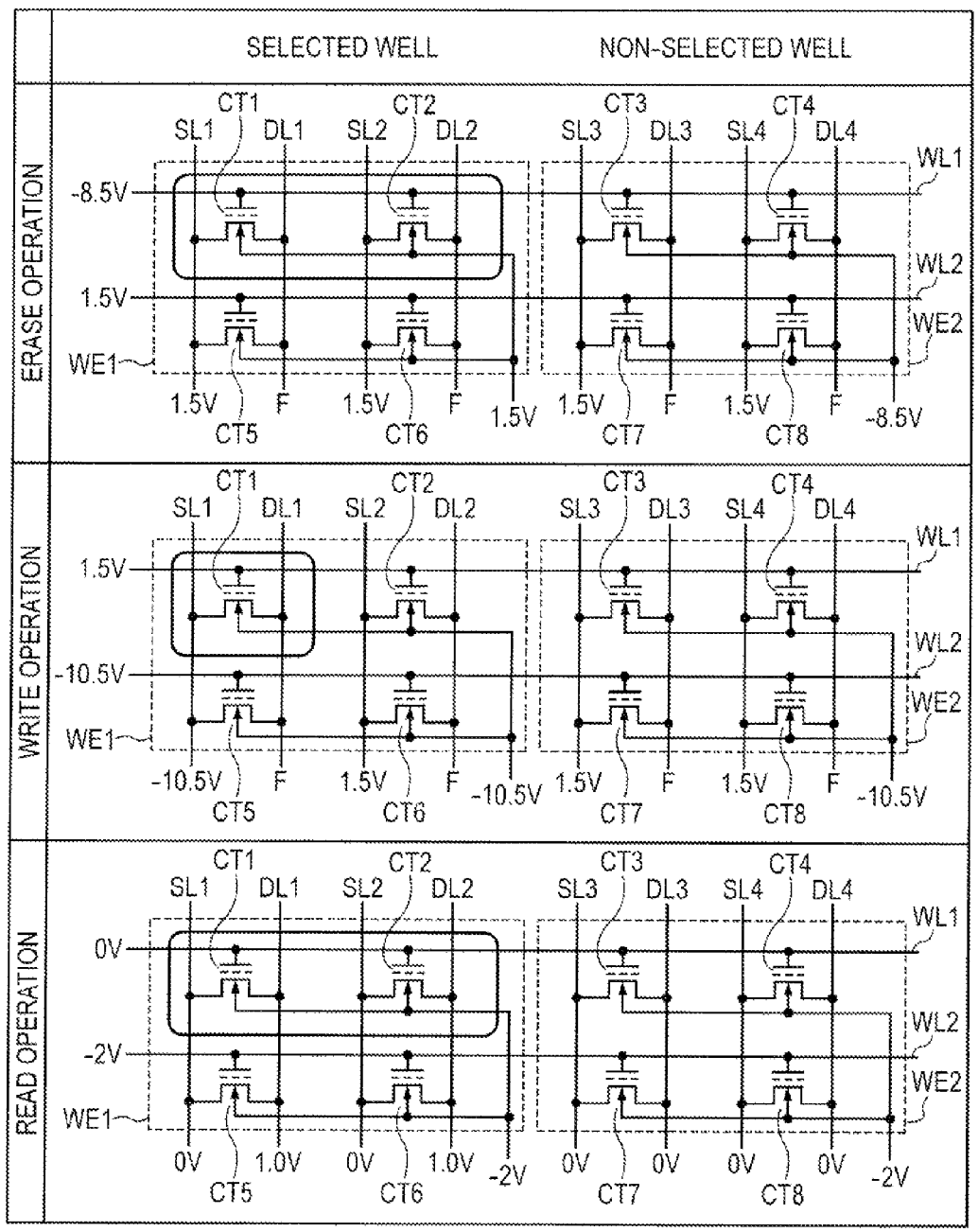
FIG. 4 is an illustrative view showing a memory array structure of the nonvolatile memory and an example of operating conditions.

FIG. 4 is an illustrative view showing a memory array structure of the nonvolatile memory and an example of operating conditions (1 cell/1 transistor). In FIG. 4, each of cell transistors CT1 to CT8 corresponds to a memory cell formed of the MONOS transistor MC shown in FIG. 3. The respective gate electrodes of the cell transistors CT1 to CT4 are coupled to a word line WL1. The respective gate electrodes of the cell transistors CT5 to CT8 are coupled to a word line WL2.

The respective source regions of the cell transistors CT1 and CT5 are coupled to a source line SL1. The respective source regions of the cell transistors CT2 and CT6 are coupled to a source line SL2. The respective source regions of the cell transistors CT3 and CT7 are coupled to a source line SL3. The respective source regions of the cell transistors CT4 and CT8 are coupled to a source line SL4.

The respective drain regions of the cell transistors CT1 and CT5 are coupled to a data line DL1. The respective drain regions of the cell transistors CT2 and CT6 are coupled to a data line DL2. The respective drain regions of the cell transistors CT3 and CT7 are coupled to a data line DL3. The respective drain regions of the cell transistors CT4 and CT8 are coupled to a data line DL4.

The respective back gates of the cell transistors CT1, CT2, CT5, and CT6 are coupled to a well WE1. The respective back gates of the cell transistors CT3, CT4, CT7, and CT8 are coupled to a well WE2.

For ease of description, FIG. 4 shows a case where the memory cells are arranged in two rows and four columns, but the arrangement of the memory cells is not limited thereto. In an actual situation, a larger number of memory cells are arranged in a matrix configuration to form a memory array. Also, a memory cell arrangement over the same well and the same word line is in, e.g., a 2-column configuration shown in FIG. 4 in which the cell transistors CT1 and CT2 are arranged in two columns. However, in the case of using a 8-bit (1-byte) configuration, cell transistors are formed in eight columns over the same well. In this case, each of an erase operation and a write operation is performed on a per byte basis.

Next, using FIG. 4, an erase operation, a write operation, and a read operation to a 1-cell/1-transistor memory cell will be described.

First, the erase operation will be described. For example, consideration is given to a case where data stored in the cell transistors CT1 and CT2 as memory cells (selected memory cells) from which data is to be erased is erased. A potential in the selected well WE1 is set to 1.5 V, a potential in the word line WL1 is set to −8.5 V, a potential in each of the source lines SL1 and SL2 is set to 1.5 V, and a potential in each of the data lines DL1 and DL2 is brought into a floating state (denoted by F in FIG. 4). Consequently, the charges stored in the charge storage films of the cell transistors CT1 and CT2 are pulled out toward the semiconductor substrate so that data is erased.

At this time, in the cell transistors CT3 to CT8 as the other memory cells (non-selected memory cells) to which an erase operation is not performed, a potential in the non-selected well WE2 is set to −8.5 V, a potential in the word line WL2 is set to 1.5 V, a potential in each of the source lines SL3 and SL4 is set to 1.5 V, and a potential in each of the data lines DL3 and DL4 is brought into a floating state. Thus, the charges stored in the charge storage films of the cell transistors CT3 to CT8 are prevented from escaping to prevent data from being erased.

Next, the write operation will be described. For example, consideration is given to a case where data is written to the cell transistor CT1 as a memory cell (selected memory cell) to which data is to be written. The potential in the selected well WE1 is set to −10.5 V, the potential in the word line WL1 is set to 1.5 V, the potential in the source line SL1 is set to −10.5 V, and the potential in the data line DL1 is brought into a floating state. Consequently, charges are injected into the charge storage film of the cell transistor CT1 so that data is written.

At this time, in the cell transistors CT2 to CT8 as the other cell transistors (non-selected memory cells) to which a write operation is not performed, the potential in the non-selected well WE2 is set to −10.5 V, the potential in the word line WL2 is set to −10.5 V, the potential in each of the source lines SL2 to SL4 is set to 1.5 V, and the potential in each of the data lines DL2 to DL4 is brought into a floating state. Thus, charges are prevented from being injected into the charge storage films of the cell transistors CT2 to CT8.

Next, the read operation will be described. For example, it is assumed that data "1" has been written to the cell transistor CT1 to result in a higher threshold voltage of the transistor and the cell transistor CT2 has data "0" to result in a lower threshold voltage of the transistor. When the data in the cell transistors CT1 and CT2 is to be read out, the potential in the selected well WE1 is set to −2V, the potential in the word line WL1 is set to 0 V, the potential in each of the source lines SL1 and S12 is set to 0 V, and the potential in each of the data lines DL1 and DL2 is set to 1.0 V. Thus, the data is read out of the cell transistors CT1 and CT2. In this case, the threshold voltage of the cell transistor CT1 is higher and the threshold voltage of the cell transistor CT2 is lower. Accordingly, the potential in the data line DL1 remains unchanged, while the potential in the data line DL2 decreases.

In the other cell transistors CT3 to CT8 to which a read operation is not performed, the potential in the non-selected well WE2 is set to −2 V, the potential in the word line WL2 is set to −2 V, the potential in each of the source lines SL3 and SL4 is set to 0 V, and the potential in each of the data lines DL3 and DL4 is set to 0 V to prevent the cell transistors CT3 to CT8 from being turned ON. By reducing the back-gate potential of each of the non-selected memory cells upon a read operation, the memory cell no longer needs a selection transistor.

<Method of Manufacturing Semiconductor Device>

Next, a method of manufacturing a semiconductor device in Embodiment 1 will be described.

Figure 5:
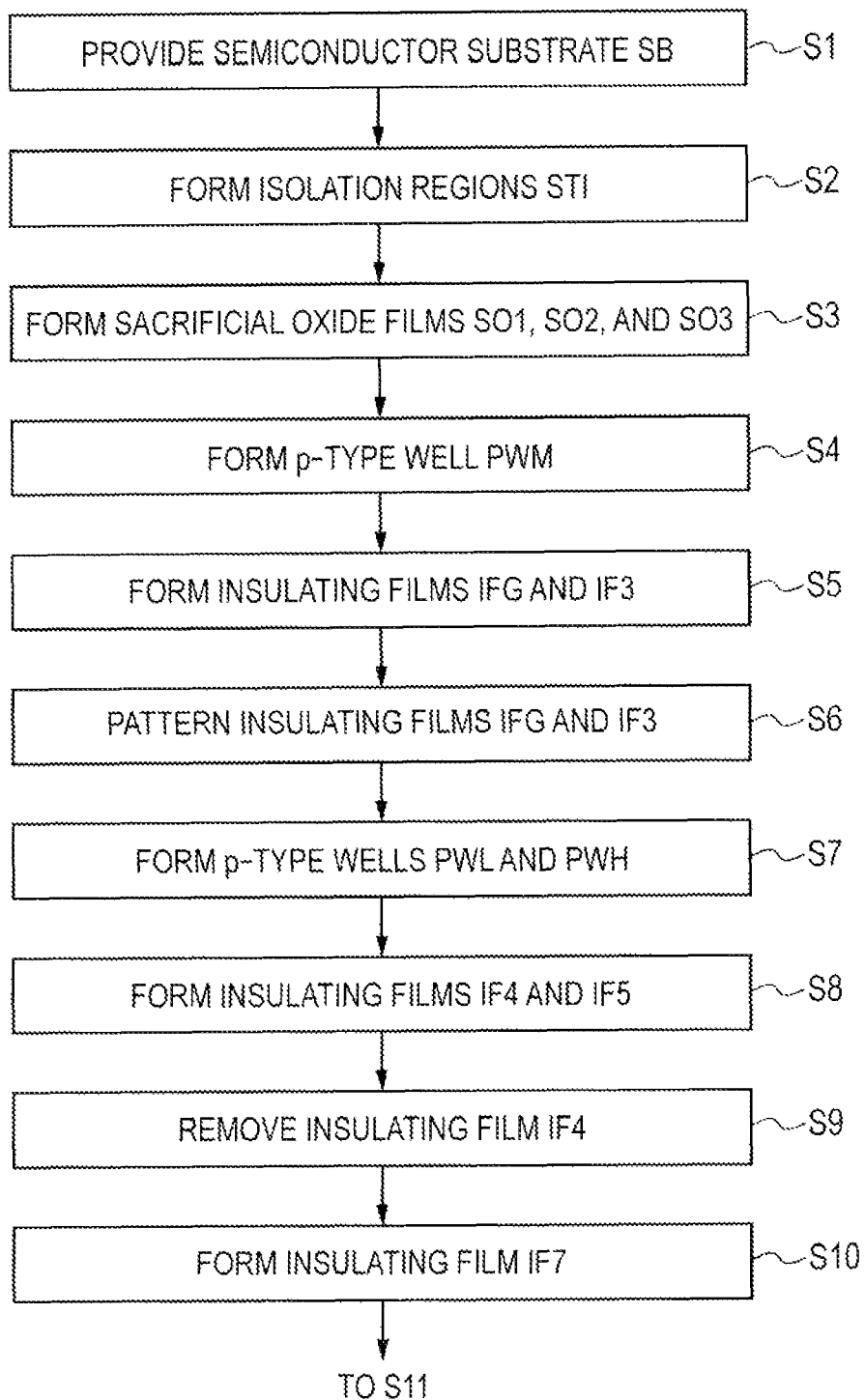
FIG. 5 is a process flow chart showing a part of the manufacturing process of the semiconductor device in Embodiment 1.
Figure 6:
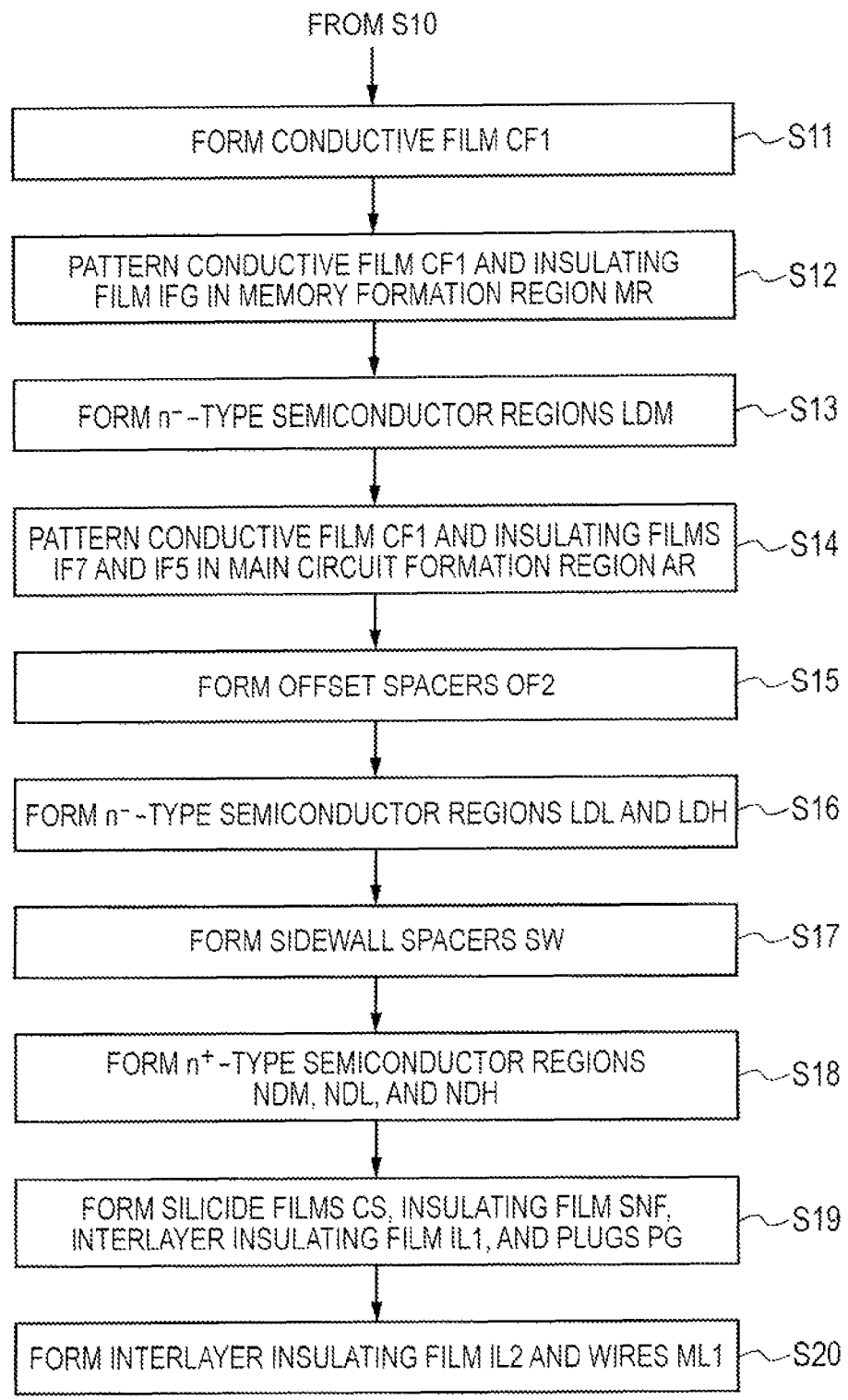
FIG. 6 is a process flow chart showing a part of the manufacturing process of the semiconductor device in Embodiment 1.

FIGS. 5 and 6 are process flow charts each showing a part of the manufacturing process of the semiconductor device in Embodiment 1. FIGS. 7 to 39 are main-portion cross-sectional views of the semiconductor device in Embodiment 1 during the manufacturing process thereof. FIGS. 7 to 39 show main-portion cross-sectional views of the memory formation region MR and the main circuit formation region AR.

Embodiment 1 will describe the case where the n-channel MONOS transistor MC is formed in the memory formation region MR. However, it is also possible to invert the conductivity type and form the p-channel MONOS transistor MC (the same applies also to the following embodiments).

Likewise, Embodiment 1 will describe the case where the n-channel lower-breakdown-voltage MISFET QL is formed in the lower-breakdown-voltage MISFET formation region LR of the main circuit formation region AR. However, it is also possible to invert the conductivity type and form the p-channel lower-breakdown-voltage MISFET QL and a CMISFET (Complementary MISFET) or the like in the lower-breakdown-voltage MISFET formation region LR (the same applies also to the following embodiments).

Likewise, Embodiment 1 will describe the case where the n-channel higher-breakdown-voltage MISFET QH is formed in the higher-breakdown-voltage MISFET formation region HR of the main circuit formation region AR. However, it is also possible to invert the conductivity type and form the p-channel higher-breakdown-voltage MISFET QH and a CMISFET or the like in the higher-breakdown-voltage MISFET formation region HR (the same applies also to the following embodiments).

Figure 7:
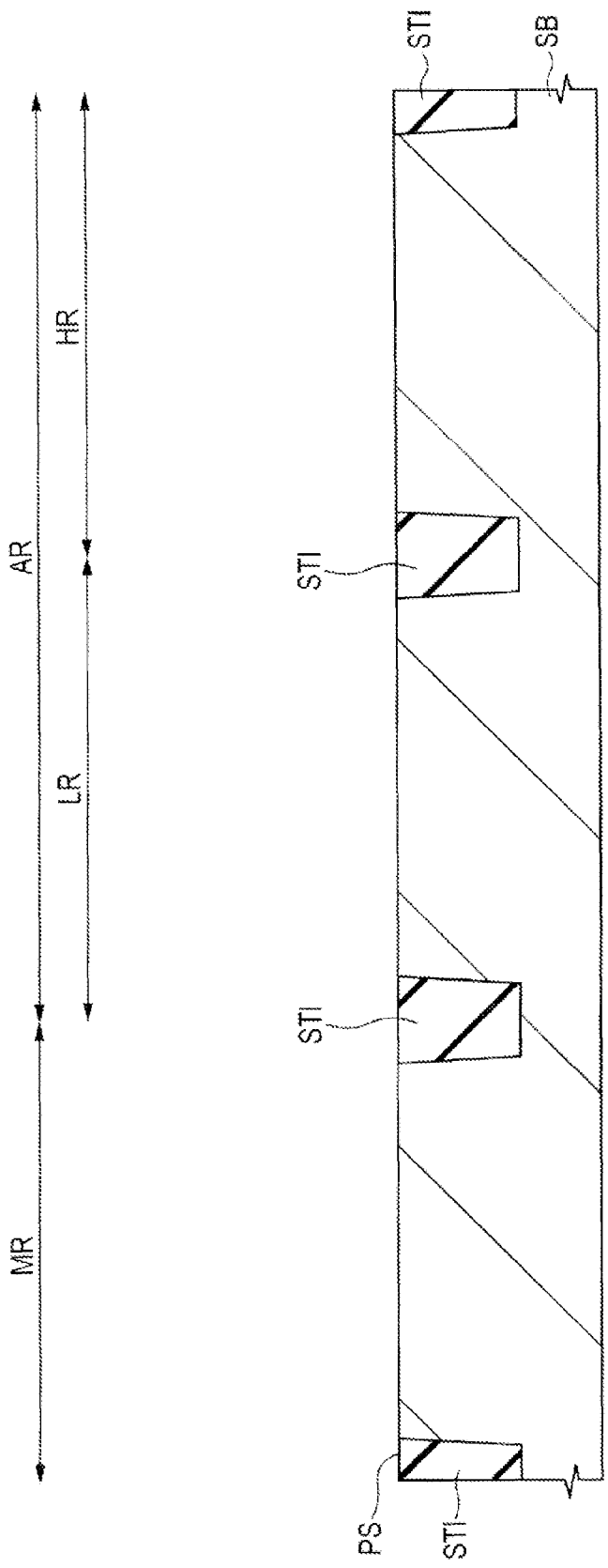
FIG. 7 is a main-portion cross-sectional view of the semiconductor device in Embodiment 1 during the manufacturing process thereof.

First, as shown in FIG. 7, the semiconductor substrate SB is provided, i.e., prepared (Step S1 in FIG. 5). In Step S1, the semiconductor substrate SB is provided which is made of a silicon single crystal having a specific resistance of, e.g., about 1 to 10 Ωcm and into which a p-type impurity such as, e.g., boron has been introduced. At this time, the semiconductor substrate SB is in a state of a semiconductor wafer having a generally disc shape.

Next, as shown in FIG. 7, the isolation regions STI are formed (Step S2 in FIG. 5). In Step S2, the isolation regions STI are formed using, e.g., an STI (Shallow Trench Isolation) method.

In the STI method, first, using a photolithographic technique and an etching technique, isolation trenches are formed in the semiconductor substrate SB. Then, over the semiconductor substrate SB, an insulating film made of, e.g., a silicon dioxide film is formed so as to be embedded in the isolation trenches. Then, using a chemical mechanical polishing (CMP) method, the unneeded insulating film formed over the semiconductor substrate SB is removed. This can form the isolation regions STI where the insulating film is embedded only in the isolation trenches.

By thus forming the isolation regions STI, the memory formation region MR and the main circuit formation region AR are defined by the isolation regions STI, while the main circuit formation region AR is partitioned into the lower-breakdown-voltage MISFET formation region LR and the higher-breakdown-voltage MISFET formation region HR.

Figure 8:
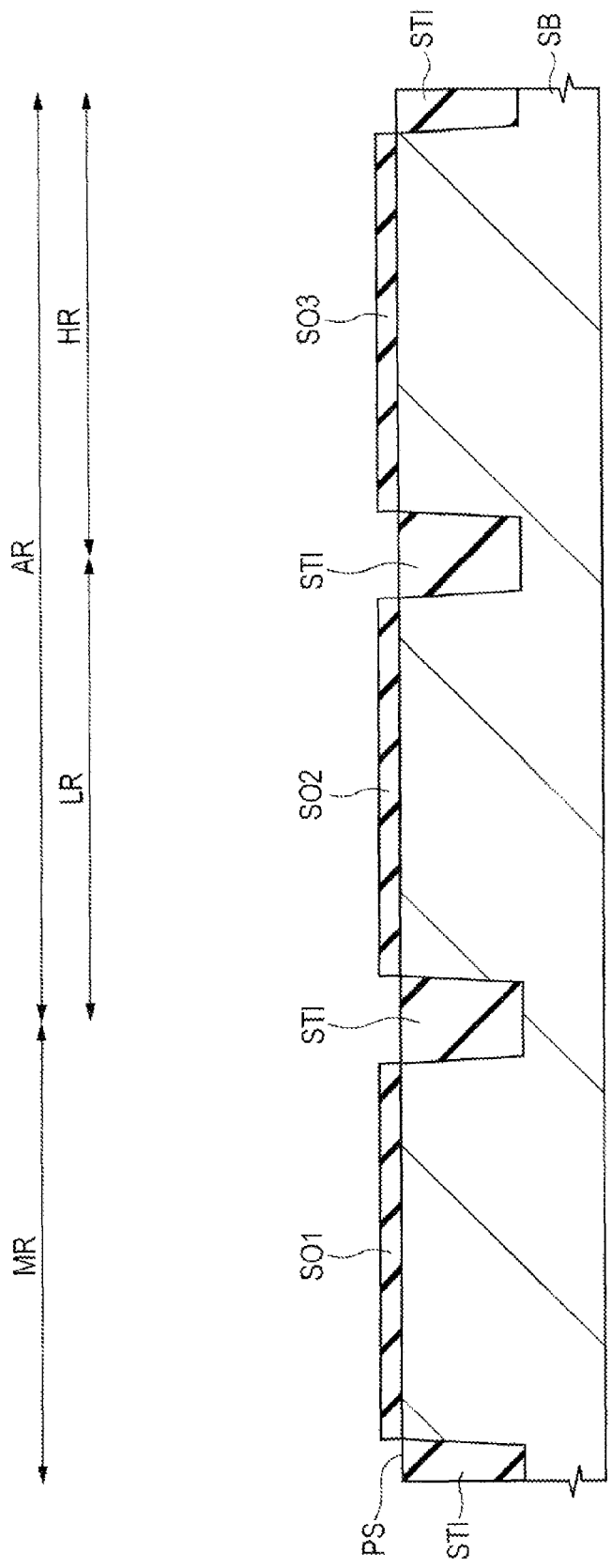
FIG. 8 is a main-portion cross-sectional view of the semiconductor device in Embodiment 1 during the manufacturing process thereof.

Next, as shown in FIG. 8, sacrificial oxide films SO1, SO2, and SO3 are formed (Step S3 in FIG. 5). In Step S3, in the memory formation region MR and the main circuit formation region AR, over the upper surface PS as the main surface of the semiconductor substrate SB, the sacrificial oxide films SO1, SO2, and SO3 are formed by, e.g., a thermal oxidation method or the like.

At this time, in the memory formation region MR, over the upper surface PS of the semiconductor substrate SB, the sacrificial oxide film SO1 is formed. Also, in the lower-breakdown-voltage MISFET formation region LR of the main circuit formation region AR, over the upper surface PS of the semiconductor substrate SB, the sacrificial oxide film SO2 is formed. Also, in the higher-breakdown-voltage MISFET formation region HR of the main circuit formation region AR, over the upper surface PS of the semiconductor substrate SB, the sacrificial oxide film SO3 is formed. Each of the sacrificial oxide films SO1, SO2, and SO3 is made of, e.g., silicon dioxide.

By forming the sacrificial oxide film SO1, when the p-type well PWM is formed in Step S4 described later, it is possible to prevent the upper surface of the p-type well PWM from being damaged. Also, by forming the sacrificial oxide film SO2, when the p-type wells PWL and PWH are formed in Step S7 described later, it is possible to prevent the upper surfaces of the p-type wells PWL and PWH from being damaged.

Figure 9:
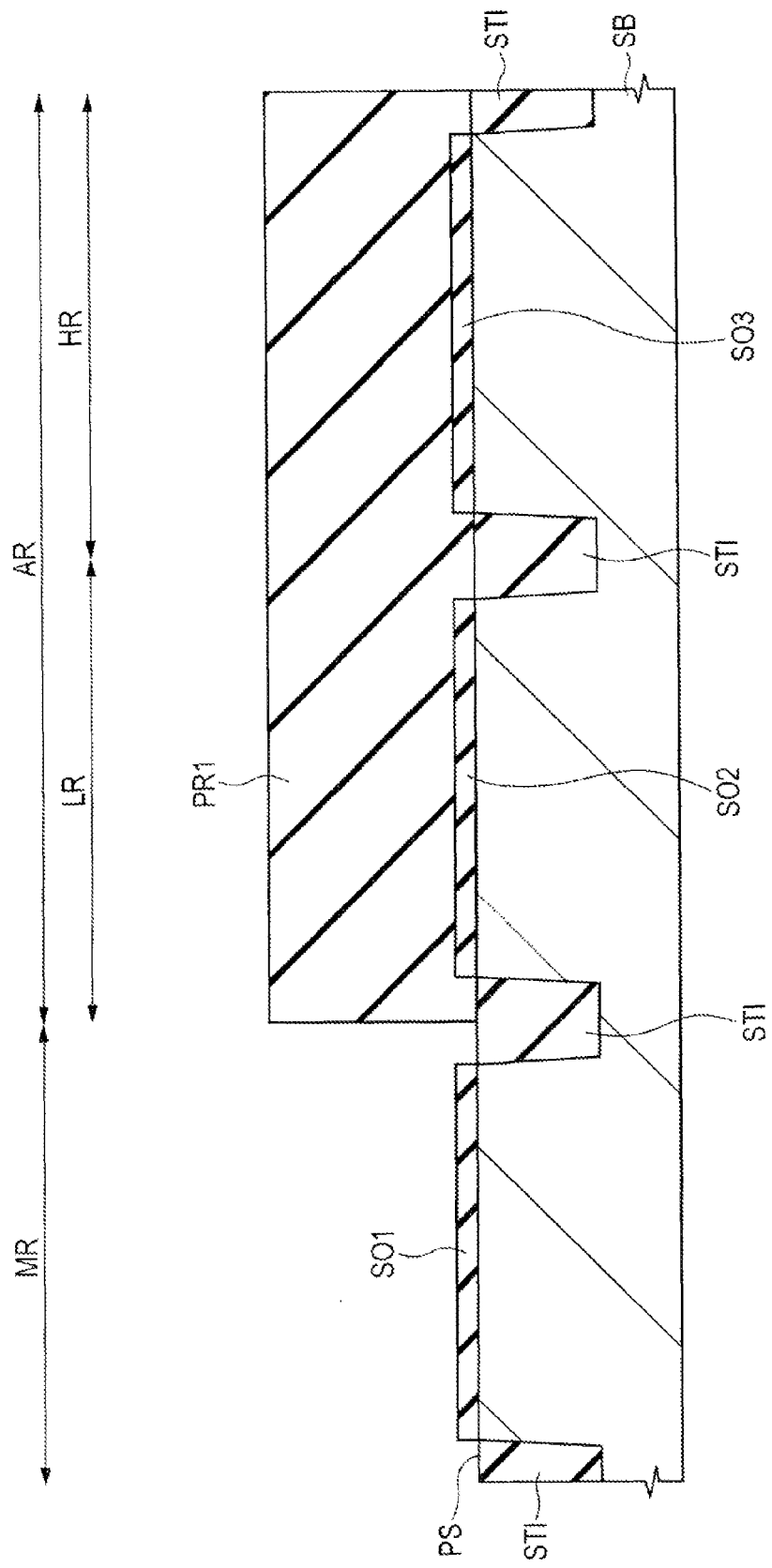
FIG. 9 is a main-portion cross-sectional view of the semiconductor device in Embodiment 1 during the manufacturing process thereof.
Figure 10:
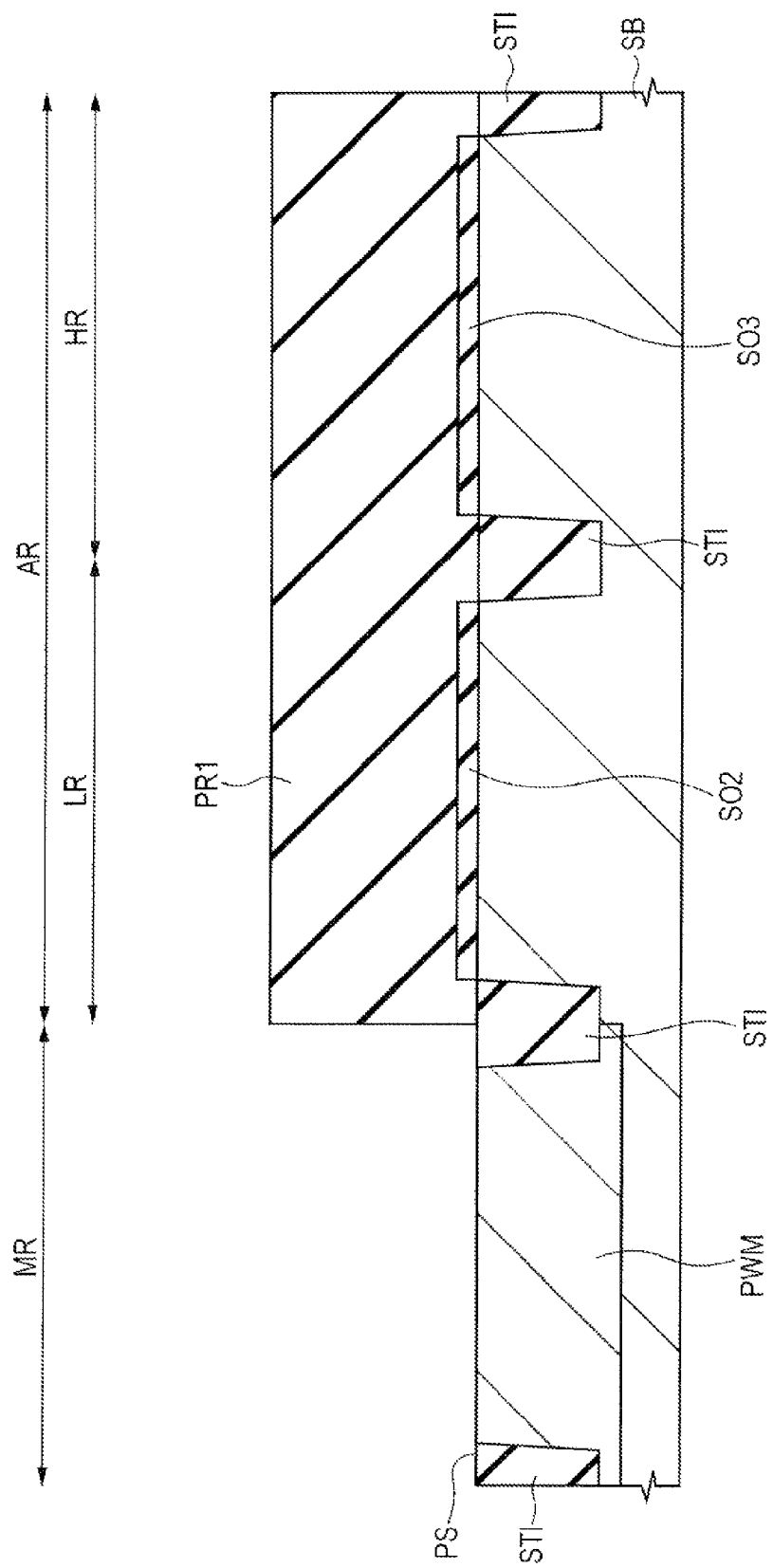
FIG. 10 is a main-portion cross-sectional view of the semiconductor device in Embodiment 1 during the manufacturing process thereof.

Next, as shown in FIGS. 9 and 10, the p-type well PWM is formed (Step S4 in FIG. 5).

In Step S4, first, as shown in FIG. 9, a resist film PR1 is applied to the upper surface PS of the semiconductor substrate SB. Then, using a photolithographic technique, the resist film PR1 is patterned. The resist film PR1 is patterned so as to cover the main circuit formation region AR and expose the memory formation region MR.

In Step S4, next, as shown in FIG. 10, by an ion implantation method using the patterned resist film PR1 as a mask, a p-type impurity such as, e.g., boron (B) is introduced into the semiconductor substrate SB. At this time, in the memory formation region MR, p-type impurity ions are implanted into the semiconductor substrate SB.

Thus, in the memory formation region MR, the p-type well PWM is formed on the upper surface PS side of the semiconductor substrate SB. At this time, since the sacrificial oxide film SO1 has been formed over the upper surface PS of the semiconductor substrate SB in the memory formation region MR, when the p-type well PWM is formed by an ion implantation method, it is possible to prevent the upper surface of the p-type well PWM from being damaged.

In Step 34, next, as shown in FIG. 10, from the memory formation region MR, the sacrificial oxide film SO1 formed over the upper surface PS of the semiconductor substrate SB is removed by wet etching using, e.g., a hydrofluoric acid (HF).

Figure 11:
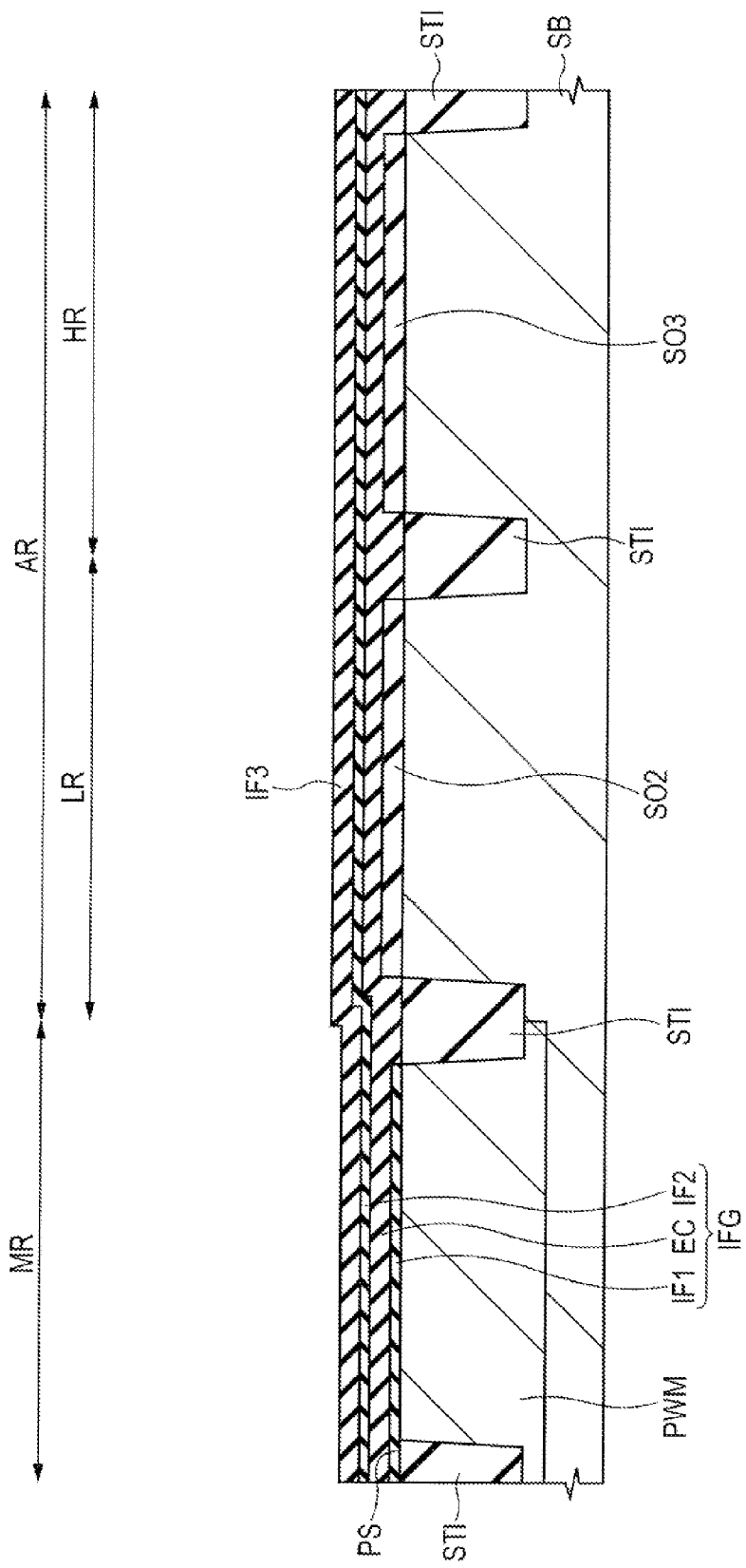
FIG. 11 is a main-portion cross-sectional view of the semiconductor device in Embodiment 1 during the manufacturing process thereof.

Next, as shown in FIG. 11, insulating films IFG and IF3 are formed (Step S5 in FIG. 4).

In Step S5, first, as shown in FIG. 11, the resist film PR1 is removed. Then, in the memory formation region MR, over the upper surface PS of the semiconductor substrate SB, the insulating film IF1 is formed. Over the insulating film IF1, the charge storage film EC is formed and, over the charge storage film EC, the insulating film IF2 is formed. The insulating film IF1, the charge storage film EC, and the insulating film IF2 form the insulating film IFG. The insulating film IFG includes the charge storage film EC as the internal charge storage portion.

At this time, in the lower-breakdown-voltage MISFET formation region LR, over the sacrificial oxide film OS2, the charge storage film EC is formed and, over the charge storage film EC, the insulating film IF2 is formed. On the other hand, in the higher-breakdown-voltage MISFET formation region HR, over the sacrificial oxide film OS3, the charge storage film EC is formed and, over the charge storage film EC, the insulating film IF2 is formed.

The insulating film IF1 is made of, e.g., silicon dioxide. Preferably, the insulating film IF1 can be formed by an ISSG (In Situ Steam Generation) oxidation method. The ISSG oxidation method introduces hydrogen and oxygen directly into an evacuated heat treatment chamber and causes a radical oxidation reaction at the top surface of a semiconductor substrate made of silicon or the like and heated to a temperature of, e.g., 800 to 1100° C. to thus form an oxide film made of, e.g., silicon dioxide over the top surface of the semiconductor substrate. An oxidizing power in the ISSG oxidation method using the radial oxidation reaction is higher than an oxidizing power in, e.g., a thermal oxidation method or the like. Accordingly, by using the ISSG oxidation method, it is possible to form the insulating film IF1 which is dense and has an excellent film quality. The thickness of the insulating film IF1 is, e.g., about 2 nm.

The charge storage film EC is made of, e.g., silicon nitride. For example, the charge storage film EC can be formed by a CVD (Chemical Vapor Deposition) method. The thickness of the charge storage film EC is, e.g., about 8 nm.

The insulating film IF2 is made of, e.g., silicon dioxide. Preferably, the insulating film IF2 can be formed by, e.g., a HTO (High Temperature Oxide) method. This allows the dense insulating film IF2 made of silicon oxide and having an excellent film quality to be formed. The thickness of the insulating film IF2 is, e.g., about 3 nm.

In this manner, over the upper surface PS of the semiconductor substrate SB, the insulating film IFG can be formed as a laminated insulating film which is dense and has a high dielectric strength and an excellent film quality. The insulating film IFG is referred to also as an ONO (Oxide Nitride Oxide) film. The p-type well PWM is formed in a state where the sacrificial oxide film SO1 is formed over the upper surface PS of the semiconductor substrate SB and, after the sacrificial oxide film SO1 is removed, the insulating film IFG is formed. This can bring the interface between the insulating film IF1 of the insulating film IFG and the p-type well PWM into an excellent state.

In Step S5, next, as shown in FIG. 11, the insulating film IF3 can be formed. That is, in each of the memory formation region MR, the lower-breakdown-voltage MISFET formation region LR, and the higher-breakdown-voltage MISFET formation region HR, over the insulating film IF2, i.e., over the insulating film IFG, the insulating film IF3 is formed. The insulating film IF3 is made of, e.g., silicon nitride. Preferably, the insulating film IF3 can be formed by a CVD method. The thickness of the insulating film IF3 is, e.g., about not less than 4 nm. It is also possible to omit the formation of the insulating film IF3.

Figure 12:
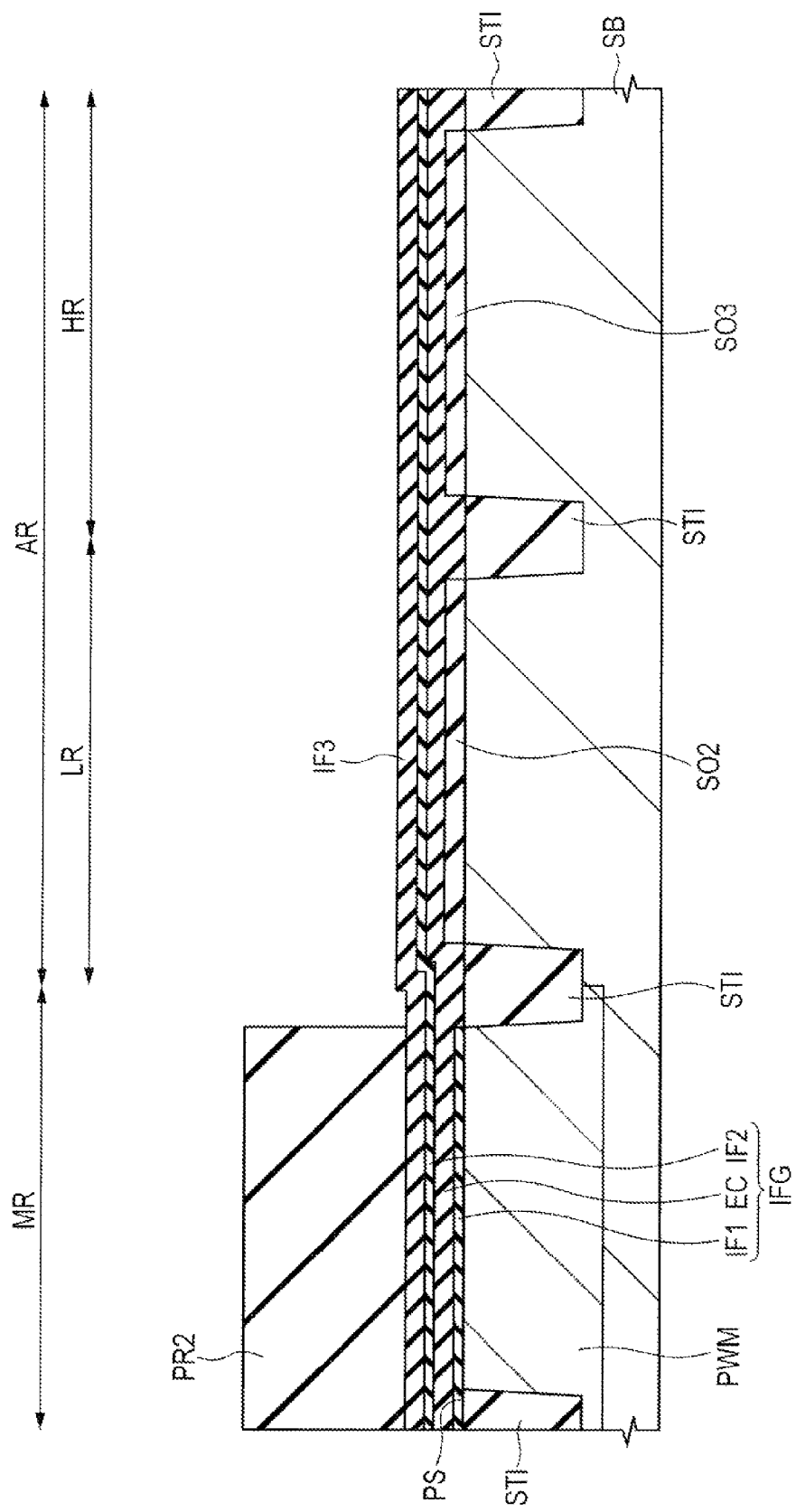
FIG. 12 is a main-portion cross-sectional view of the semiconductor device in Embodiment 1 during the manufacturing process thereof.
Figure 13:
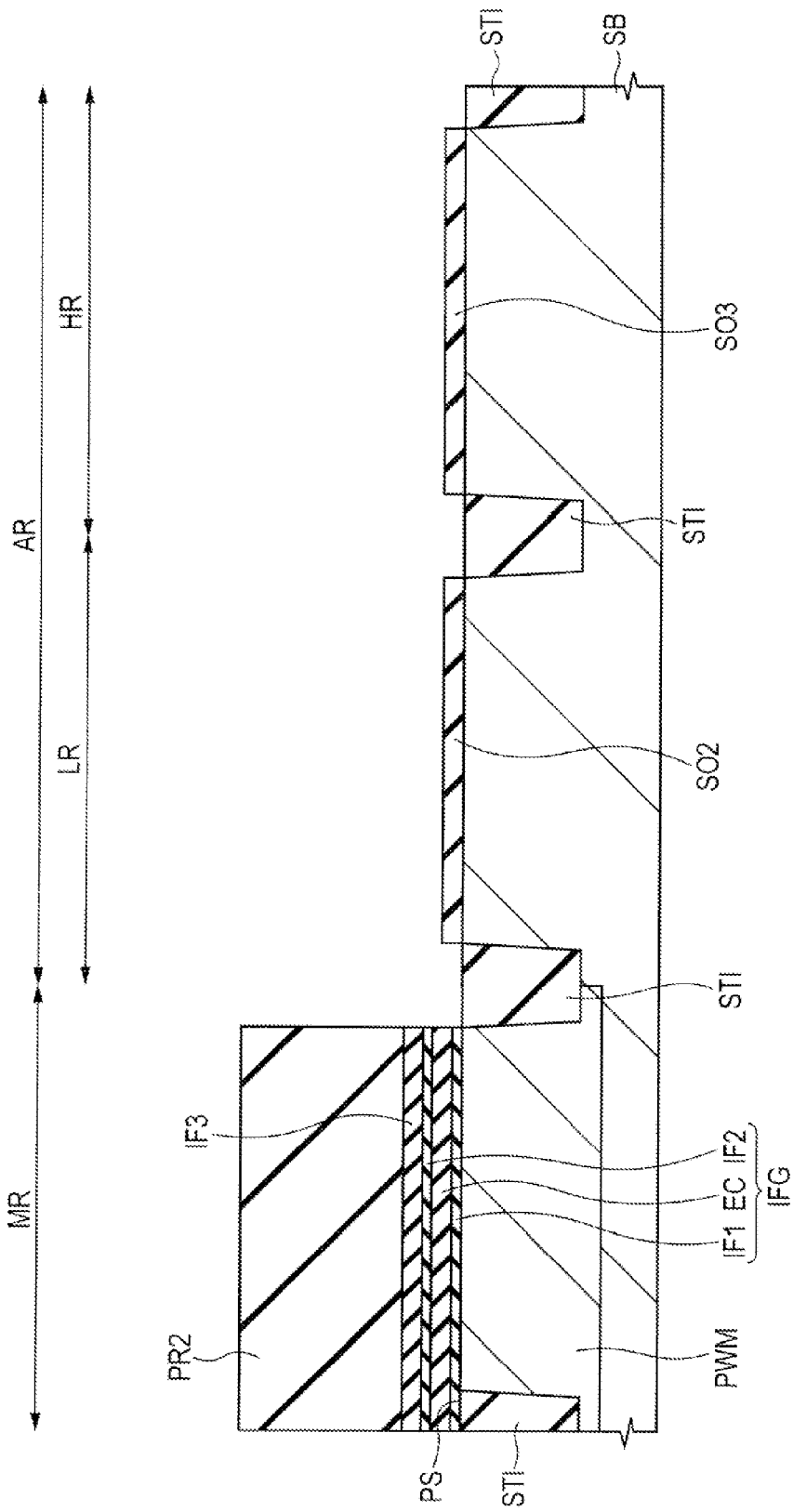
FIG. 13 is a main-portion cross-sectional view of the semiconductor device in Embodiment 1 during the manufacturing process thereof.
Figure 14:
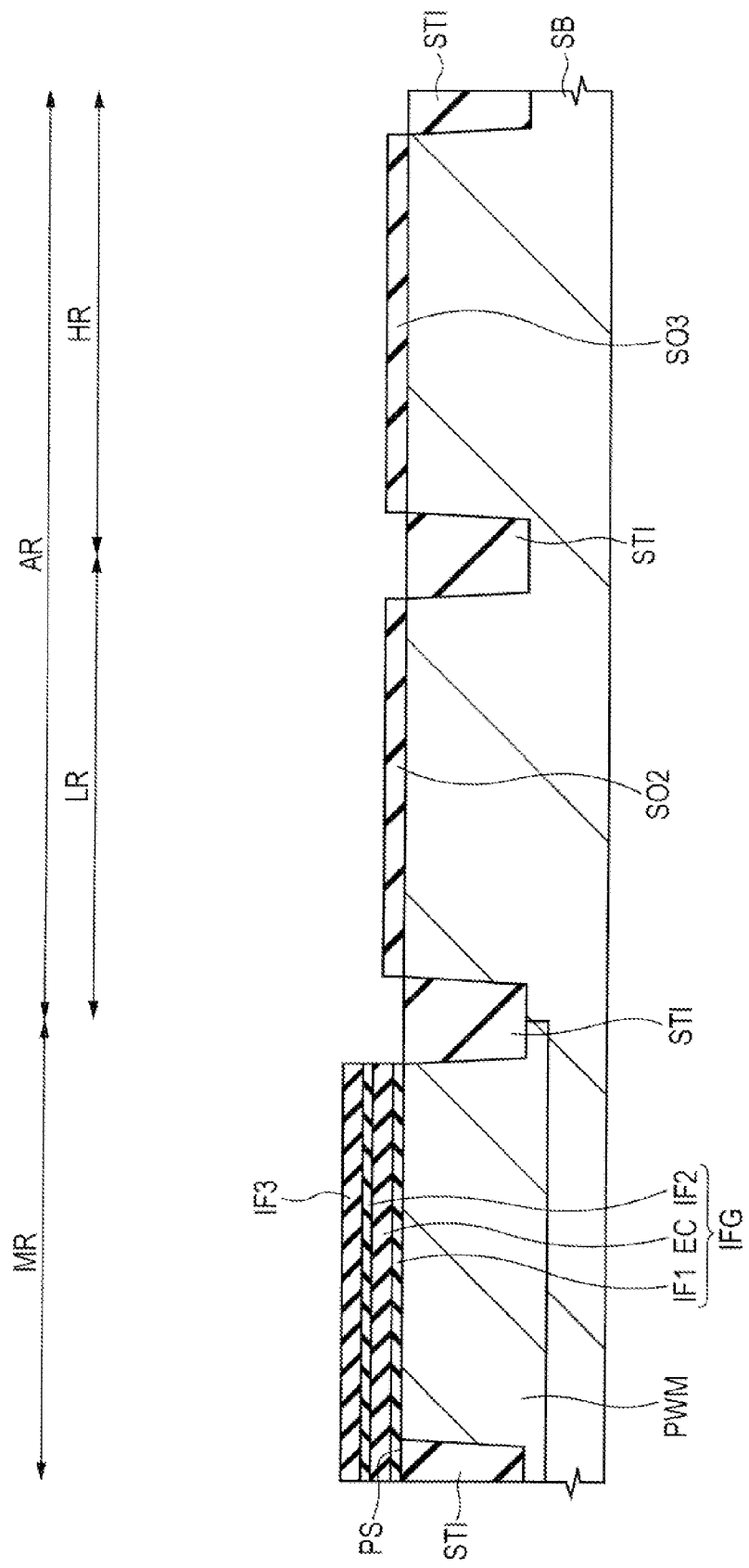
FIG. 14 is a main-portion cross-sectional view of the semiconductor device in Embodiment 1 during the manufacturing process thereof.

Next, as shown in FIGS. 12 to 14, the insulating films IFG and IF3 are patterned (Step S6 in FIG. 5).

In Step S6, first, as shown in FIG. 12, a resist film PR2 is applied onto the insulating film IF3. Then, using a photolithographic technique, the resist film PR2 is patterned. The resist film PR2 is patterned such that the insulating film IF3 is covered with the resist film PR2 in the memory formation region MR and exposed from the resist film PR2 in each of the lower-breakdown-voltage MISFET formation region LR and the higher-breakdown-voltage MISFET formation region HR.

In Step S6, next, as shown in FIG. 13, using an etching technique using the patterned resist film PR2 as a mask, the respective portions of the insulating films IF3 and IF2 and the charge storage film EC which are formed in the lower-breakdown-voltage MISFET formation region LR and the higher-breakdown-voltage MISFET formation region HR are removed. That is, the insulating films IFG and IF3 are patterned.

In Step S6, next, as shown in FIG. 14, the patterned resist film PR2 is removed by, e.g., ashing.

Figure 15:
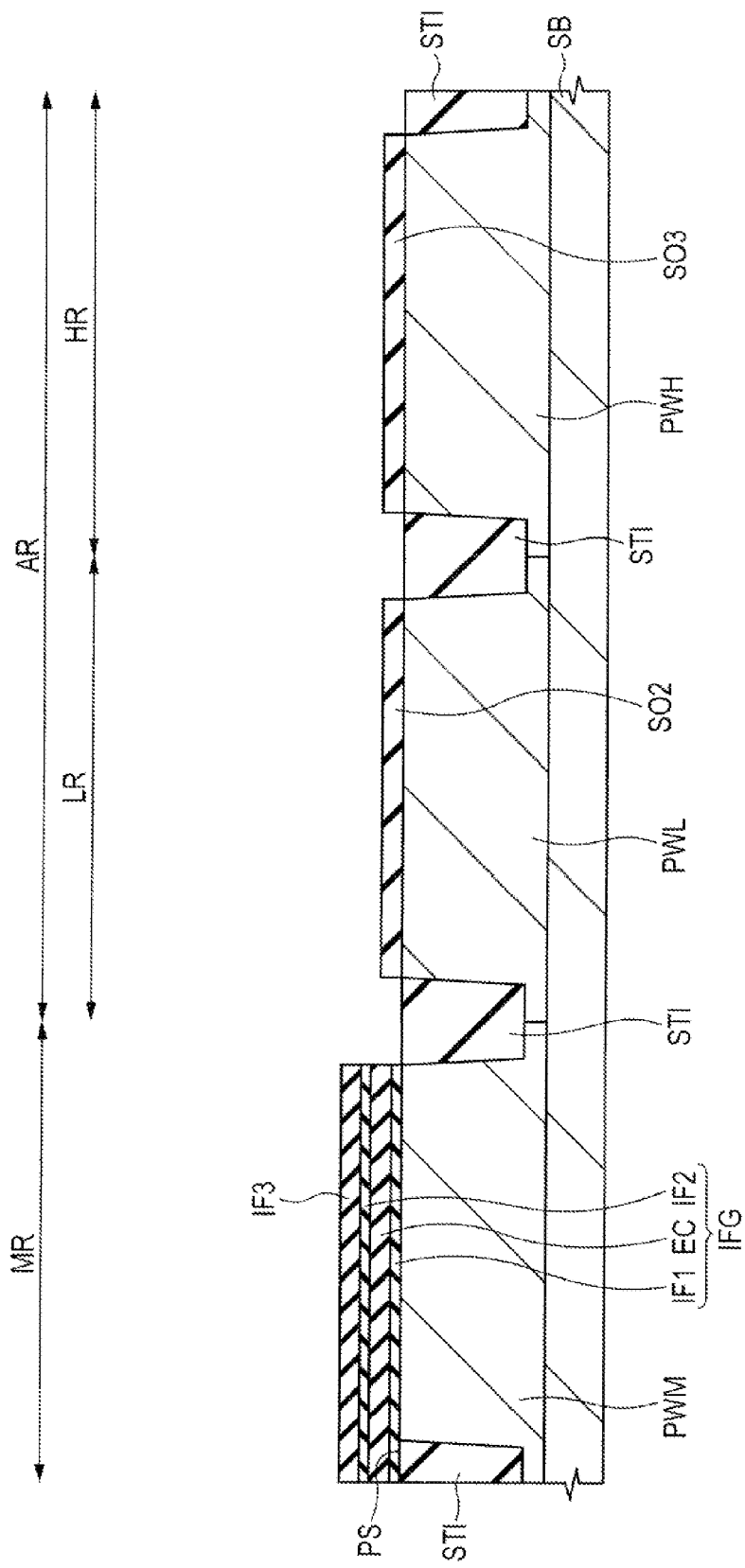
FIG. 15 is a main-portion cross-sectional view of the semiconductor device in Embodiment 1 during the manufacturing process thereof.
Figure 16:
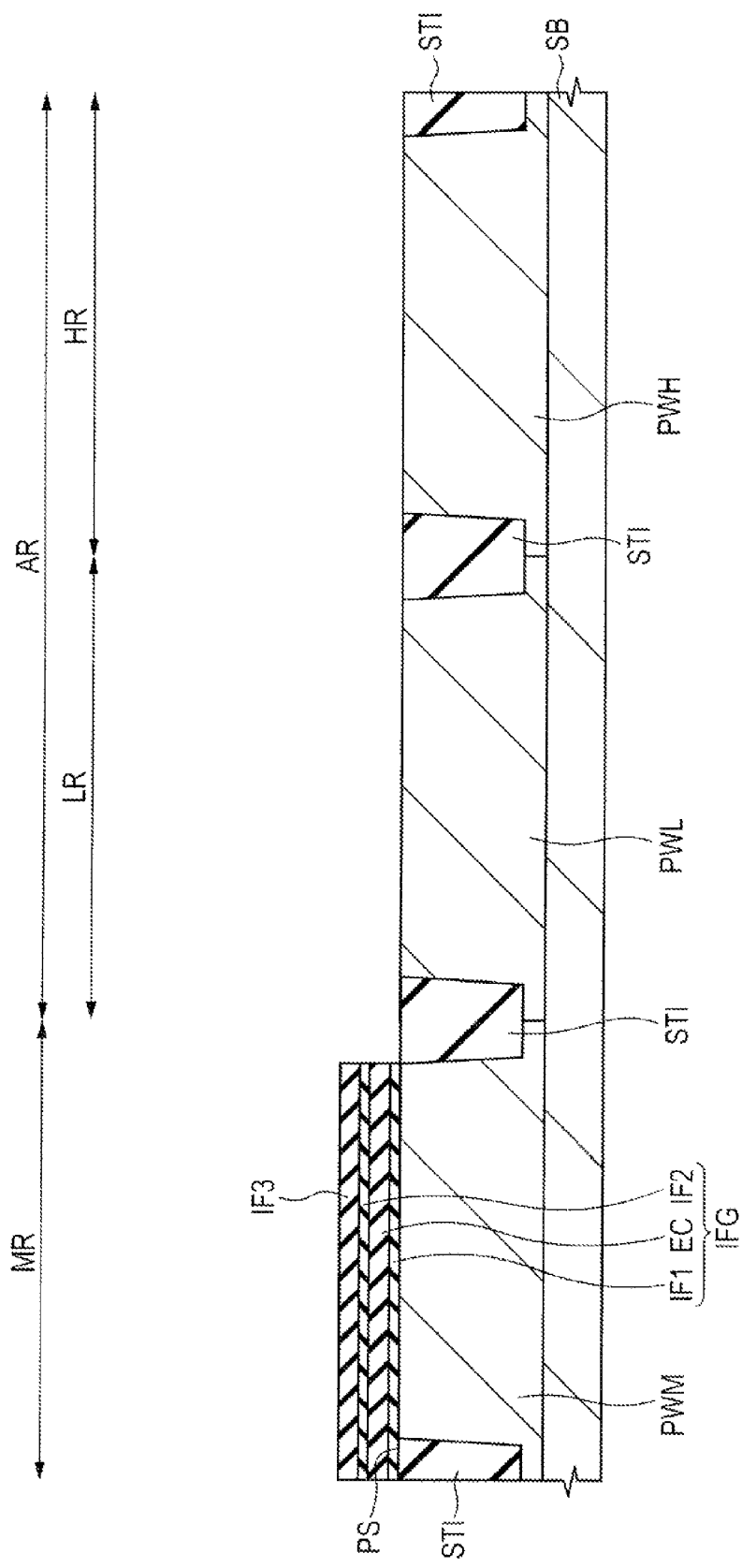
FIG. 16 is a main-portion cross-sectional view of the semiconductor device in Embodiment 1 during the manufacturing process thereof.

Next, as shown in FIGS. 15 and 16, the p-type wells PWL and PWH are formed (Step S7 in FIG. 5). Note that a resist film required for the formation thereof and the step of removing the resist film are omitted.

In Step S7, first, as shown in FIG. 15, a p-type impurity such as, e.g., boron (B) is introduced into the semiconductor substrate SB by an ion implantation method. At this time, in the lower-breakdown-voltage MISFET formation region LR and the higher-breakdown-voltage MISFET formation region HR, p-type impurity ions are implanted into the semiconductor substrate SB.

As a result, in the lower-breakdown-voltage MISFET formation region LR, the p-type well PWL is formed on the upper surface PS side of the semiconductor substrate SB while, in the higher-breakdown-voltage MISFET formation region HR, the p-type well PWH is formed on the upper surface PS side of the semiconductor substrate SB.

In the lower-breakdown-voltage MISFET formation region LR, the sacrificial oxide film SO2 has been formed over the upper surface PS of the semiconductor substrate SB. This can prevent the upper surface of the p-type well PWL from being damaged when the p-type well PWL is formed by an ion implantation method. Also, in the higher-breakdown-voltage MISFET formation region HR, the sacrificial oxide film SO3 has been formed over the upper surface PS of the semiconductor substrate SB. This can prevent the upper surface of the p-type well PWH from being damaged when the p-type well PWH is formed by an ion implantation method.

In Step S7, next, as shown in FIG. 16, the sacrificial oxide film SO2 formed over the upper surface PS of the semiconductor substrate SB in the lower-breakdown-voltage MISFET formation region LR is removed by wet etching using, e.g., a hydrofluoric acid (HF). Also, the sacrificial oxide film SO3 formed over the upper surface PS of the semiconductor substrate SB in the higher-breakdown-voltage MISFET formation region HR is removed by wet etching using, e.g., a hydrofluoric acid (HF).

As shown in FIG. 16, when the insulating film IF3 made of, e.g., silicon nitride has been formed over the insulating film IF2, the insulating film IF3 is not removed by wet etching using, e.g., a hydrofluoric acid. This allows the insulating film IFG including the respective portions of the insulating film IF2, the charge storage film EC, and the insulating film IF1 which are left in the memory formation region MR to be protected from the hydrofluoric acid.

Figure 17:
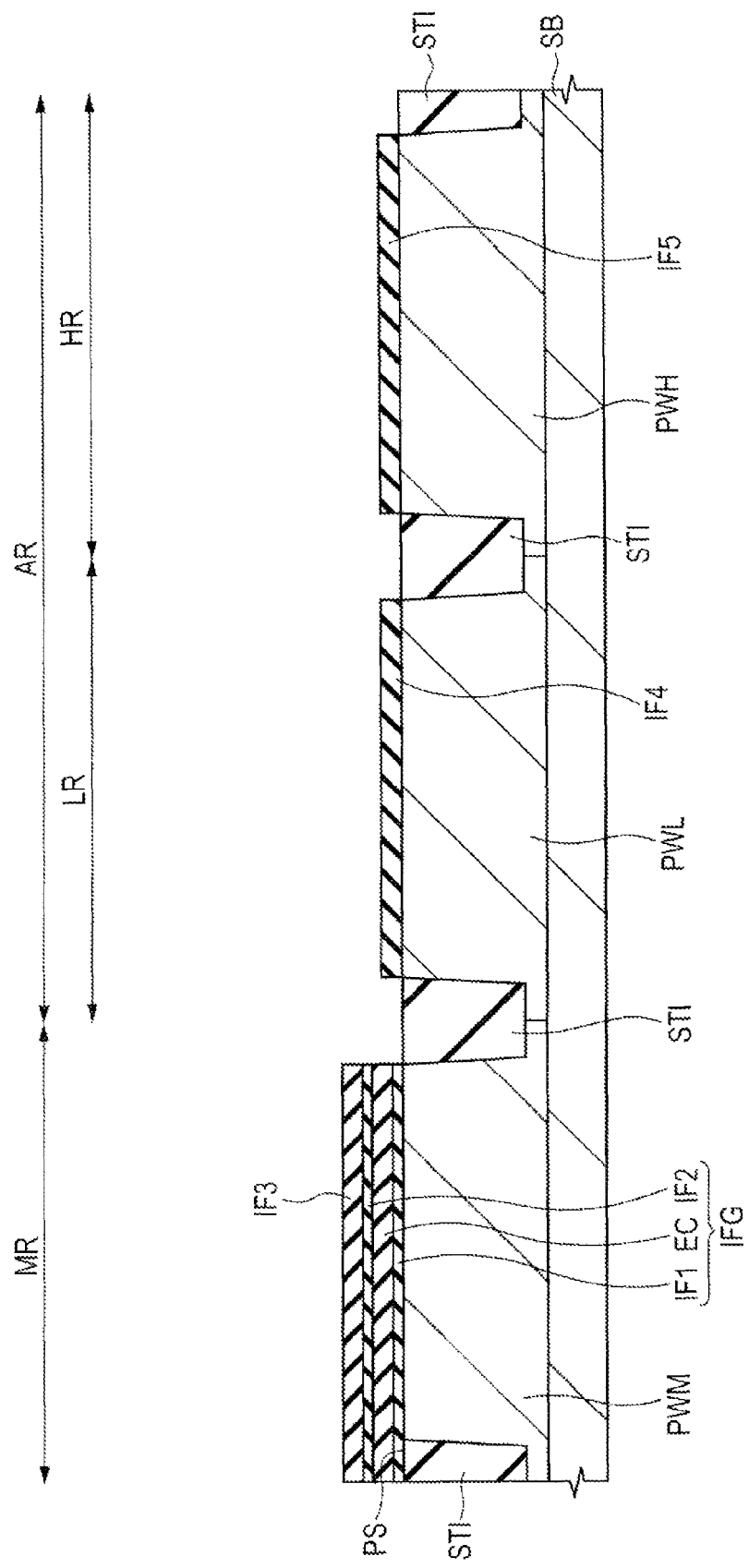
FIG. 17 is a main-portion cross-sectional view of the semiconductor device in Embodiment 1 during the manufacturing process thereof.

Next, as shown in FIG. 17, insulating films IF4 and IF5 are formed (Step S8 in FIG. 5).

In Step S8, as shown in FIG. 17, in the lower-breakdown-voltage MISFET formation region LR, the insulating film IF4 for the gate insulating film is formed over the upper surface PS of the semiconductor substrate SB. In the higher-breakdown-voltage MISFET formation region HR, the insulating film IF5 for the gate insulating film is formed over the upper surface PS of the semiconductor substrate SB. In the lower-breakdown-voltage MISFET formation region LR, the insulating film IF4 is formed over the p-type well PWL.

In the higher-breakdown-voltage MISFET formation region HR, the insulating film IF5 is formed over the p-type well PWH.

The p-type well PWL is formed in a state where the sacrificial oxide film SO2 is formed over the upper surface PS of the semiconductor substrate SB and, after the sacrificial oxide film SO2 is removed, the insulating film IF4 is formed. This can bring the interface between the insulating film IF4 and the p-type well PWL into an excellent state. Also, the p-type well PWH is formed in a state where the sacrificial oxide film SO3 is formed over the upper surface PS of the semiconductor substrate SB and, after the sacrificial oxide film SO3 is removed, the insulating film IF5 is formed. This can bring the interface between the insulating film IF5 and the p-type well PWH into an excellent state.

As each of the insulating films IF4 and IF5, e.g., an insulating film made of silicon dioxide or silicon oxynitride or a High-k film, e.g., high-dielectric-constant film can be used. The insulating films IF4 and IF5 can be formed using a thermal oxidation method, a sputtering method, an atomic layer deposition (ALD) method, a CVD method, or the like.

Note that, in Step S8, the insulating films IF4 and IF5 each made of silicon dioxide can be formed using an ISSG oxidation method. The case where the insulating films IF4 and IF5 are formed using the ISSG oxidation method is shown in FIGS. 18 and 19.

When, in Step S8, the insulating films IF4 and IF5 are formed using the ISSG oxidation method, as described above, the oxidizing power in the ISSG oxidation method is higher than an oxidizing power in another oxidation method such as, e.g., a thermal oxidation method. Accordingly, by forming the insulating film IF5 by the ISSG oxidation method and forming an insulating film IF7 (see FIG. 24) by another oxidation method other than the ISSG oxidation method, the thickness of the insulating film IF5 can easily be adjusted to be larger than the thickness of the insulating film IF7.

Figure 18:
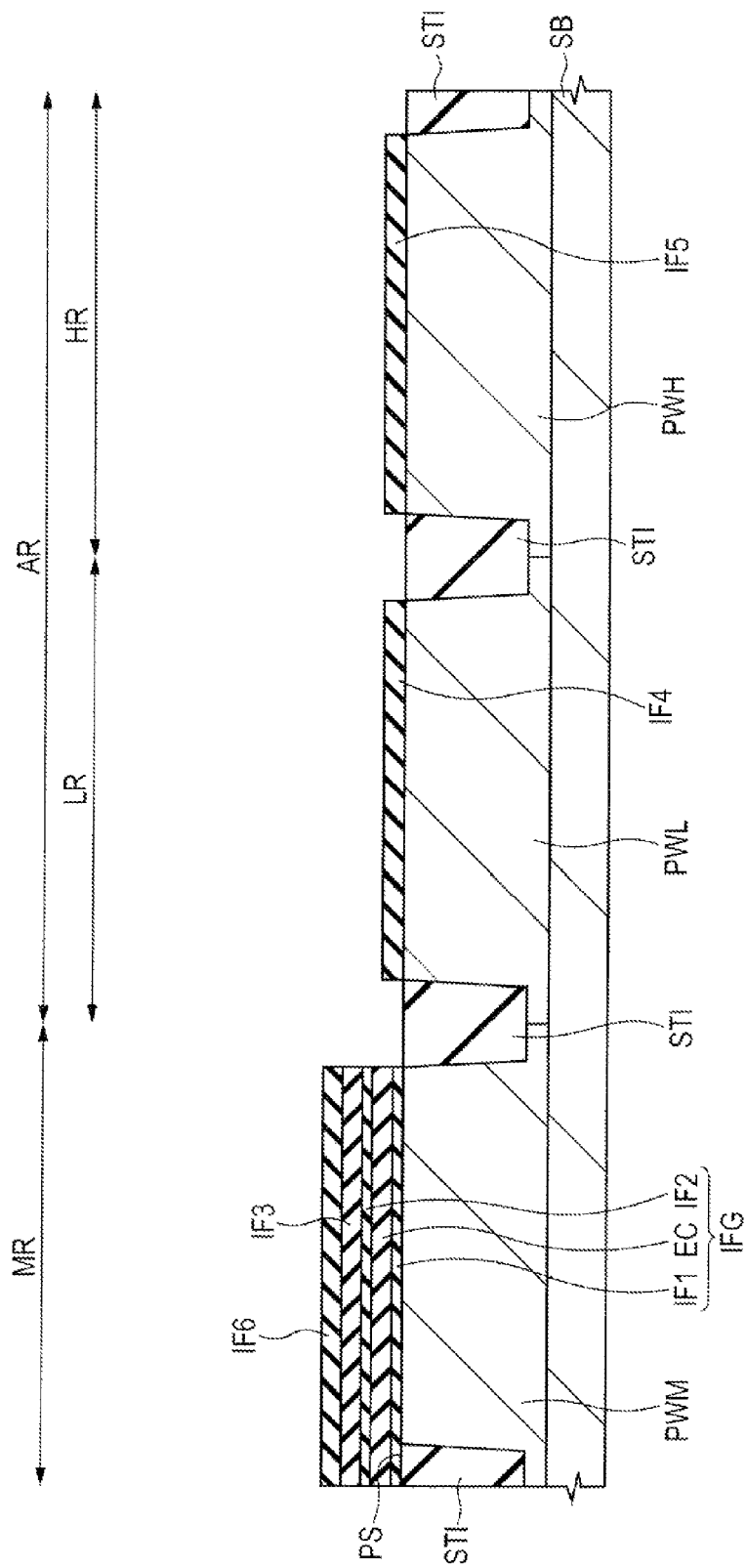
FIG. 18 is a main-portion cross-sectional view of the semiconductor device in Embodiment 1 during the manufacturing process thereof.

On the other hand, in Step S8, when the insulating films IF4 and IF5 are formed using the ISSG oxidation method, as shown in FIG. 18, the top surface of the insulating film IF3 made of, e.g., silicon nitride is oxidized and, over the insulating film IF3, an insulating film IF6 containing oxygen and silicon, such as, e.g., a silicon dioxide film, is formed.

Figure 19:
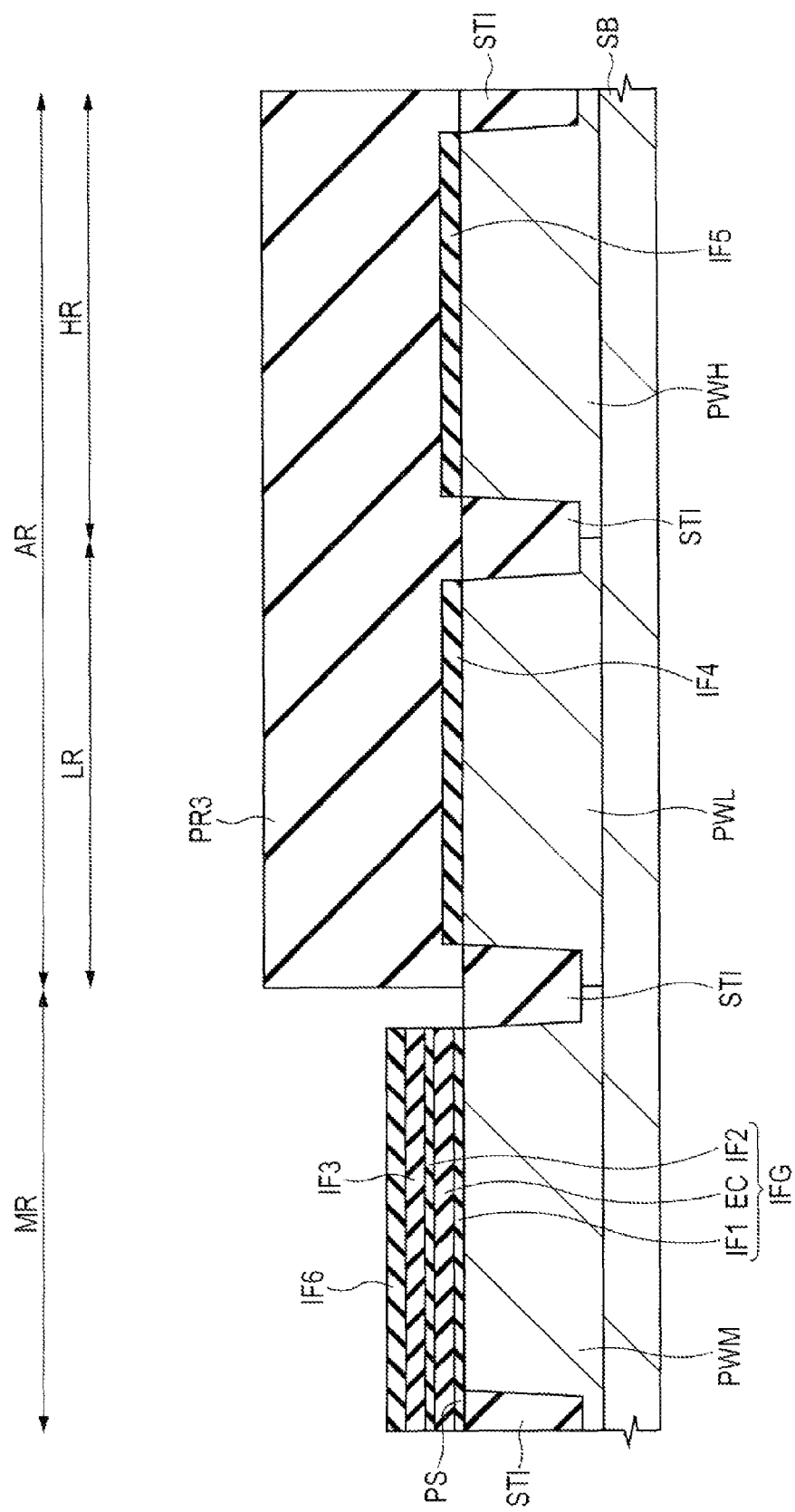
FIG. 19 is a main-portion cross-sectional view of the semiconductor device in Embodiment 1 during the manufacturing process thereof.

When the insulating films IF4 and IF5 are thus formed using the ISSG oxidation method, next, in Step S8, as shown in FIG. 19, a resist film PR3 is applied to the upper surface PS of the semiconductor substrate SB and then patterned using a photolithographic technique. The resist film PR3 is patterned such that the insulating film IF4 is covered with the resist film PR3 in the lower-breakdown-voltage MISFET formation region LR, the insulating film IF5 is covered with the resist film PR3 in the higher-breakdown-voltage MISFET formation region, and the insulating film IF6 is exposed from the resist film PR3 in the memory formation region MR. After the resist film PR3 is patterned, the insulating film IF6 made of, e.g., a silicon dioxide film is removed from the memory formation region MR by wet etching using, e.g., a hydrofluoric acid (HF). At this time, in the lower-breakdown-voltage MISFET formation region LR, the insulating film IF4 is left while, in the higher-breakdown-voltage MISFET formation region HR, the insulating film IF5 is left.

Then, the patterned resist film PR3 is removed by, e.g., ashing so that the structure shown in FIG. 17 is obtained.

Next, as shown in FIGS. 20 to 23, the insulating film IF4 is removed (Step S9 in FIG. 5).

Figure 20:
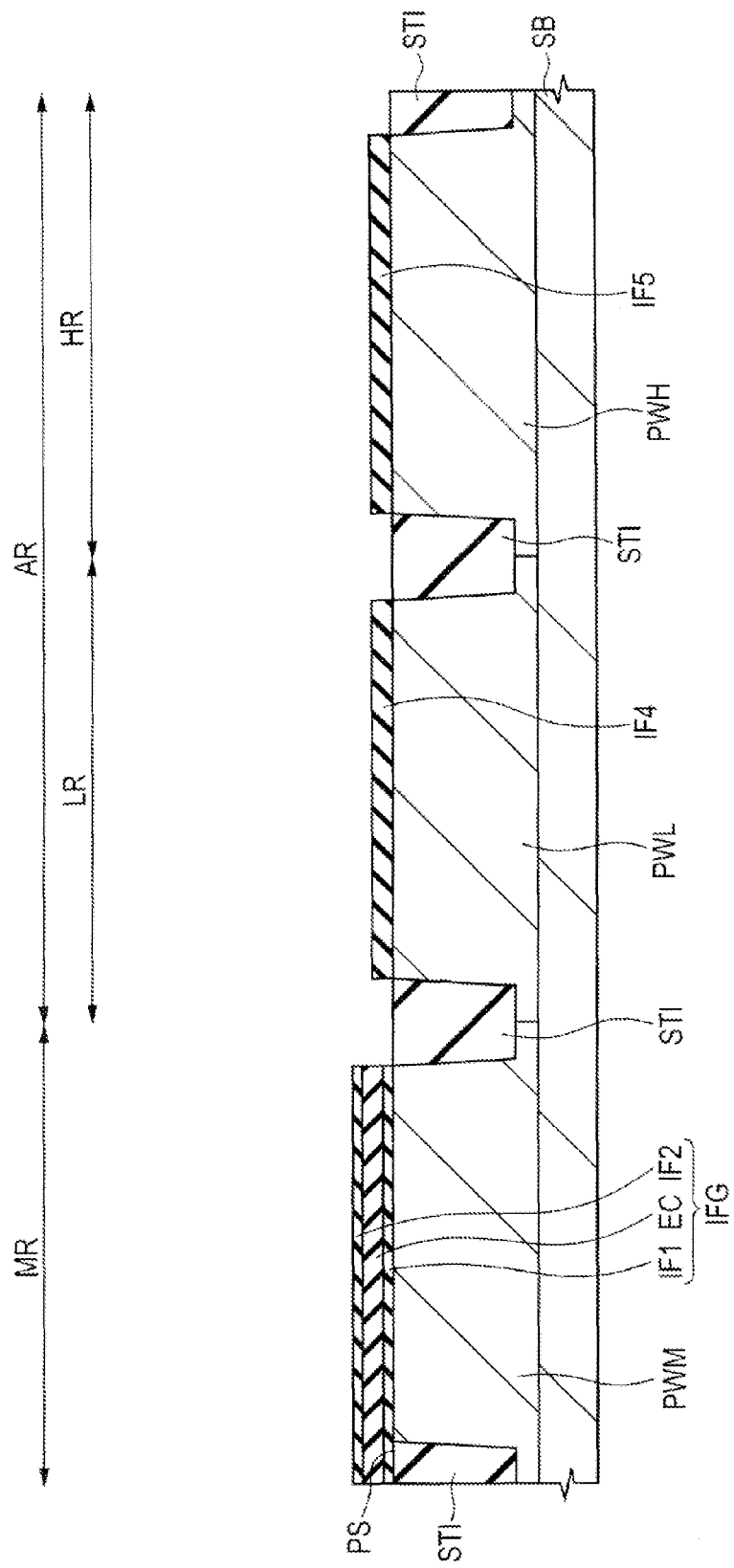
FIG. 20 is a main-portion cross-sectional view of the semiconductor device in Embodiment 1 during the manufacturing process thereof.

In Step S9, first, as shown in FIG. 20, the insulating film IF3 made of, e.g., silicon nitride is removed from the memory formation region MR by wet etching using, e.g., a hot phosphoric acid. As a result, in the memory formation region MR, the insulating film IF2 made of, e.g., silicon dioxide is exposed. At this time, in the lower-breakdown-voltage MISFET formation region LR, the insulating film IF4 made of, e.g., silicon dioxide is left without being removed and, in the higher-breakdown-voltage MISFET formation region HR, the insulating film IF5 made of, e.g., silicon dioxide is left without being removed.

Figure 21:
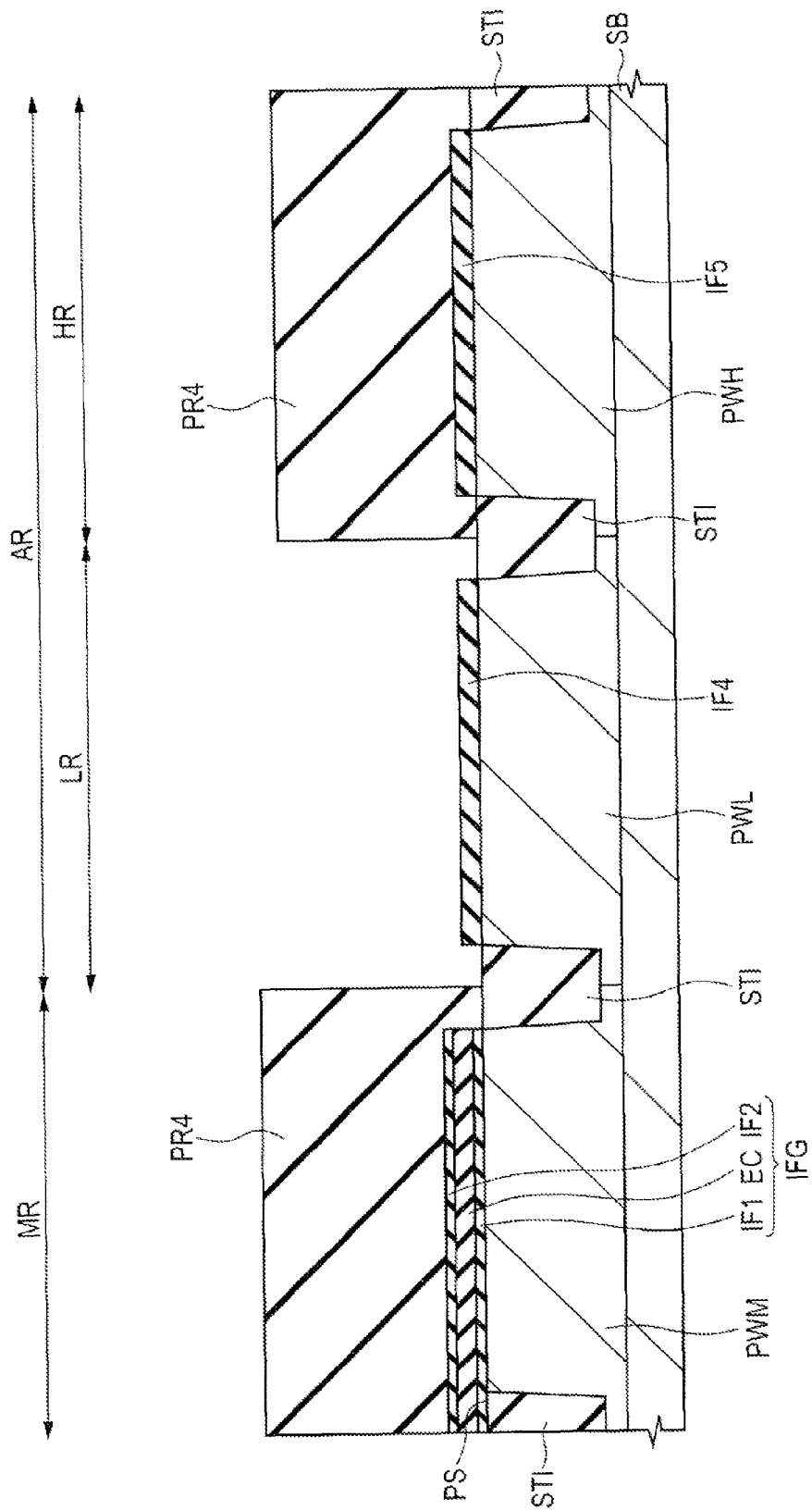
FIG. 21 is a main-portion cross-sectional view of the semiconductor device in Embodiment 1 during the manufacturing process thereof.

In Step S9, next, as shown in FIG. 21, a resist film PR4 is applied to the upper surface PS of the semiconductor substrate SB and then patterned using a photolithographic technique. The resist film PR4 is patterned such that the insulating film IFG is covered with the resist film PR4 in the memory formation region MR, the insulating film IF5 is covered with the resist film PR4 in the higher-breakdown-voltage MISFET formation region HR, and the insulating film IF4 is exposed from the resist film PR4 in the lower-breakdown-voltage MISFET formation region LR.

Figure 22:
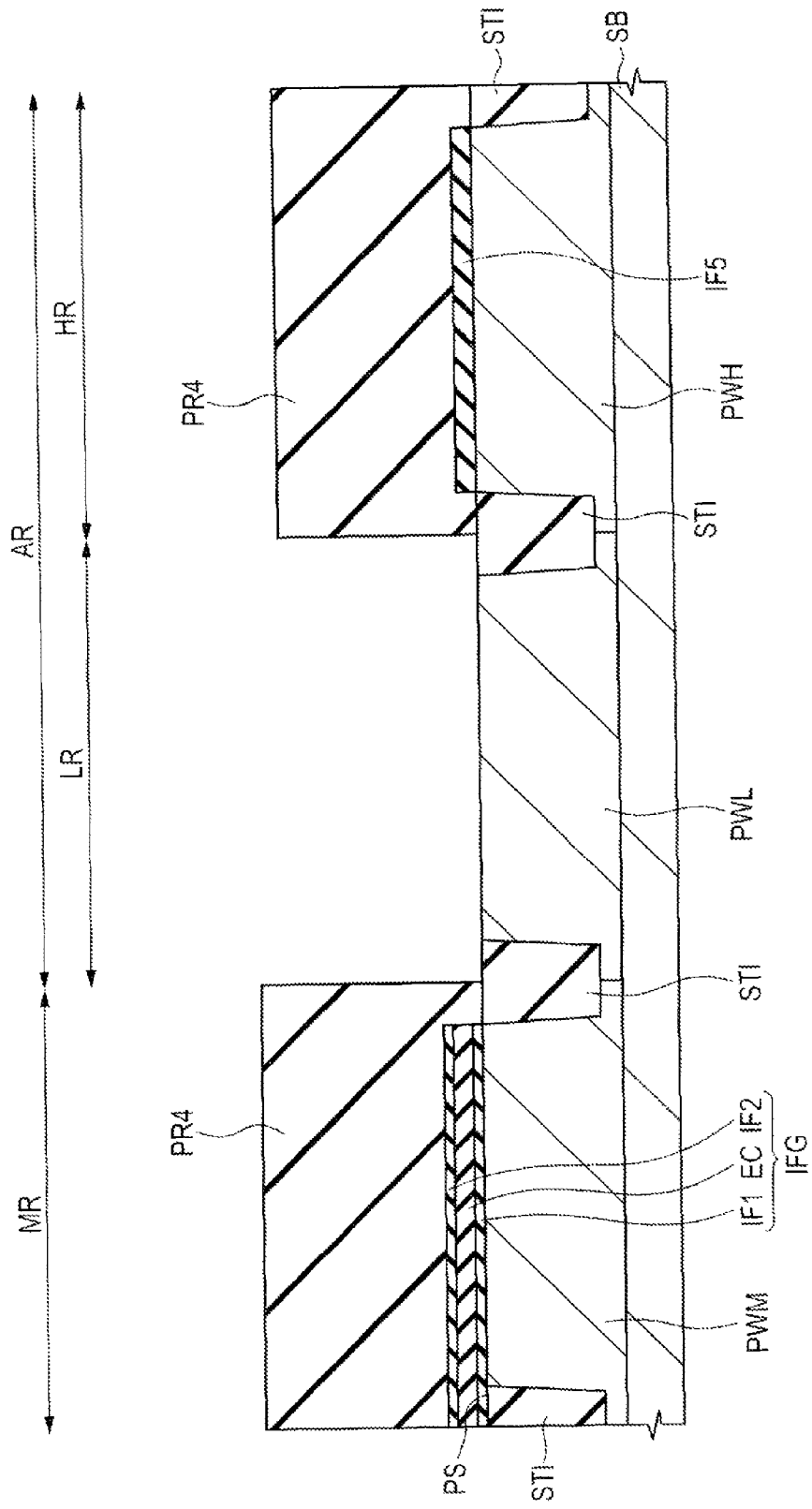
FIG. 22 is a main-portion cross-sectional view of the semiconductor device in Embodiment 1 during the manufacturing process thereof.
Figure 23:
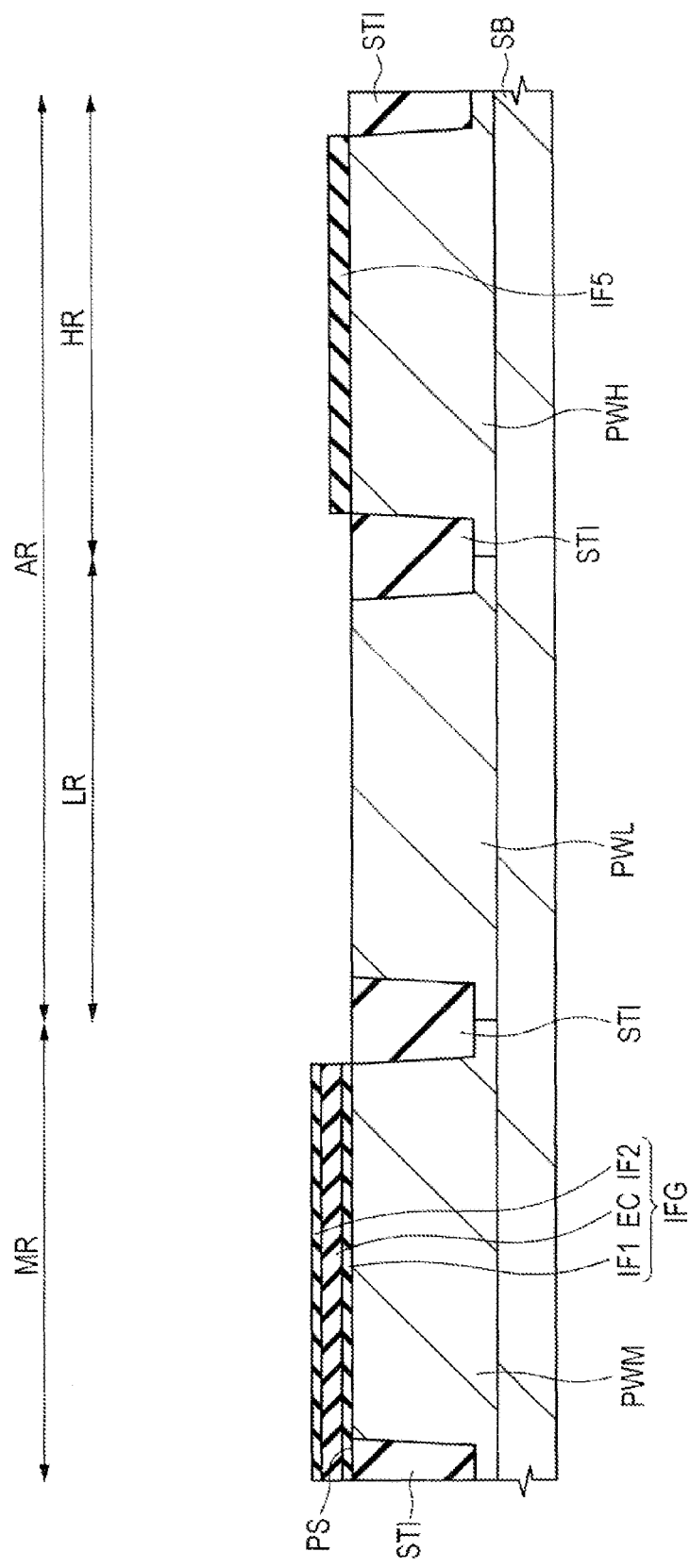
FIG. 23 is a main-portion cross-sectional view of the semiconductor device in Embodiment 1 during the manufacturing process thereof.

In Step S9, next, as shown in FIG. 22, the insulating film IF4 made of, e.g., silicon dioxide is removed from the lower-breakdown-voltage MISFET formation region LR by wet etching using, e.g., a hydrofluoric acid (HF). At this time, in the memory formation region MR, the insulating film IF2 is left and, in the higher-breakdown-voltage MISFET formation region HR, the insulating film IF5 is left. Then, as shown in FIG. 23, the patterned resist film PR4 is removed by, e.g., ashing.

Figure 24:
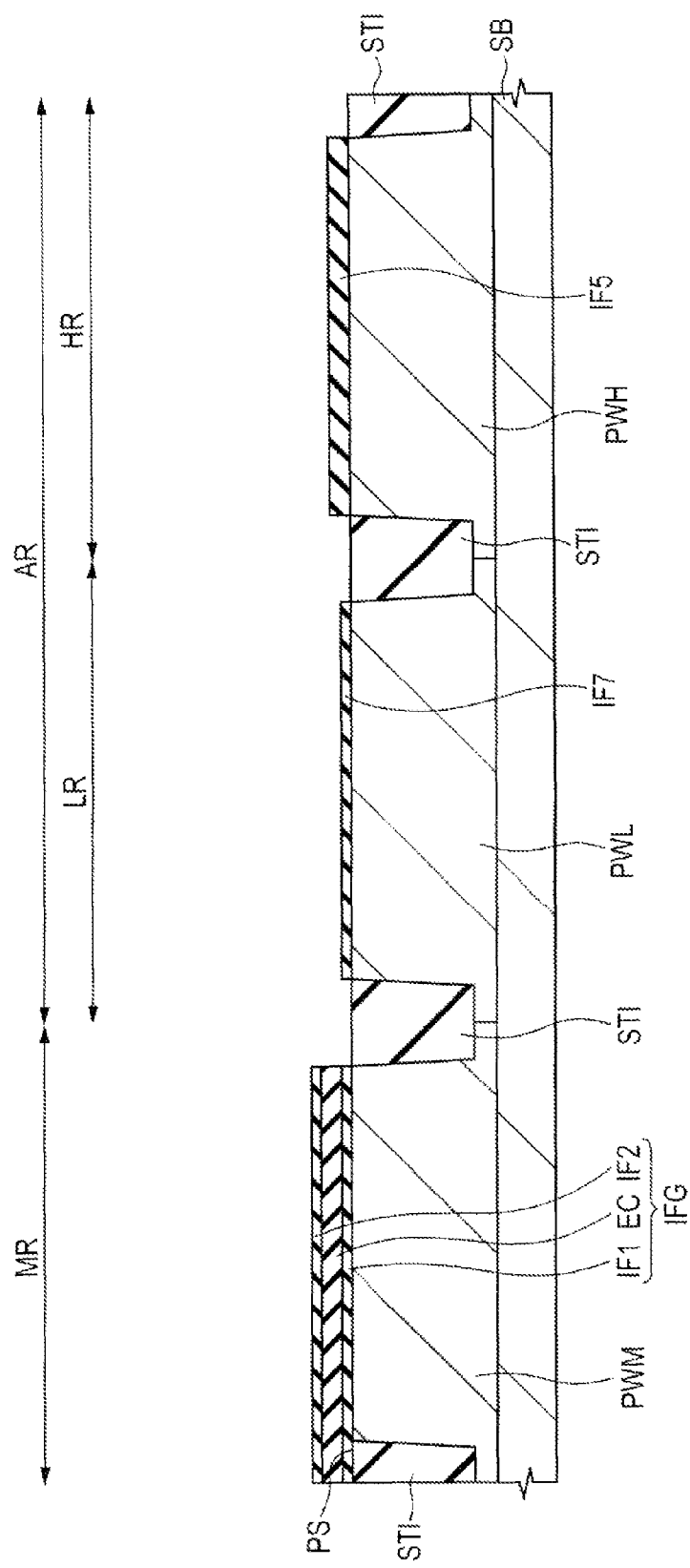
FIG. 24 is a main-portion cross-sectional view of the semiconductor device in Embodiment 1 during the manufacturing process thereof.

Next, as shown in FIG. 24, the insulating film IF7 is formed (Step S10 in FIG. 5). In Step S10, in the lower-breakdown-voltage MISFET formation region LR, over the upper surface PS of the semiconductor substrate SB, the insulating film IF7 for the gate insulating film is formed. In the lower-breakdown-voltage MISFET formation region LR, the insulating film IF7 is formed over the p-type well PWL.

The insulating film IF7 is formed after the insulating film IF4 is removed while the interface between the insulating film IF4 and the p-type well PWL remains in an excellent state. This can bring the interface between the insulating film IF7 and the p-type well PWL into an excellent state.

As the insulating film IF7, e.g., an insulating film made of, e.g., silicon dioxide, silicon nitride, or silicon oxynitride or a High-k film, i.e., high-dielectric-constant film can be used. The insulating film IF7 can be formed using a thermal oxidation method, an ISSG oxidation method, a sputtering method, an ALD method, a CVD method, or the like.

The thickness of the insulating film IF7 is smaller than the thickness of the insulating film IF5. That is, the thickness of the insulating film IF5 is larger than the thickness of the insulating film IF7. This allows the drive voltage for the lower-breakdown-voltage MISFET QL (see FIG. 39) formed in the lower-breakdown-voltage MISFET formation region LR to be set lower than the drive voltage for the higher-breakdown-voltage MISFET QH (see FIG. 39) formed in the higher-breakdown-voltage MISFET formation region HR. Note that the thickness of the insulating film IF7 is smaller than the thickness of the insulating film IFG.

By performing the process steps prior to and including Step S10, the insulating film IFG is formed over the upper surface PS of the semiconductor substrate SB in the memory formation region MR, the insulating film IF7 is formed over the upper surface PS of the semiconductor substrate SB in the lower-breakdown-voltage MISFET formation region LR, and the insulating film IF5 is formed over the upper surface PS of the semiconductor substrate SB in the higher-breakdown-voltage MISFET formation region HR.

Figure 25:
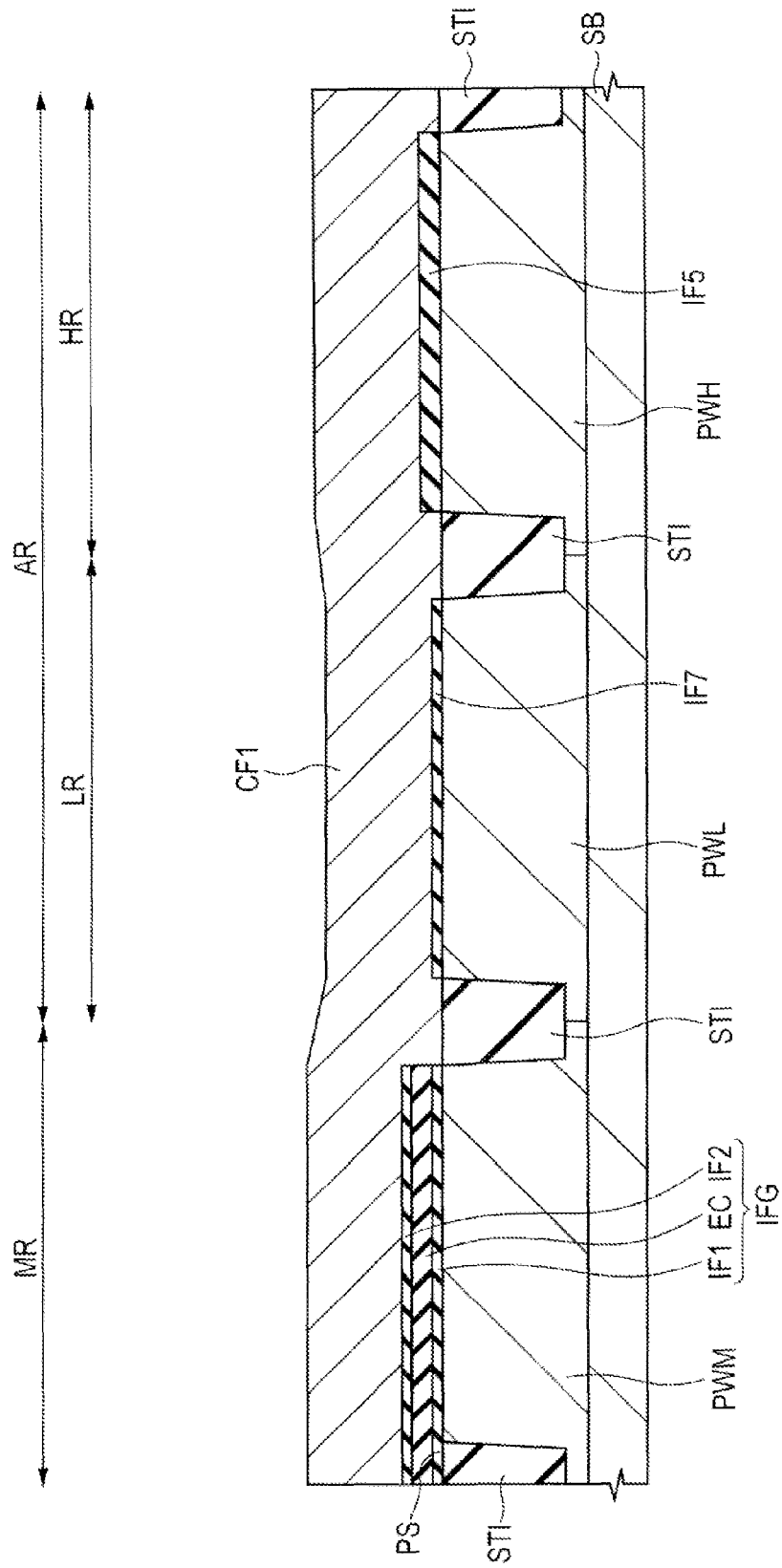
FIG. 25 is a main-portion cross-sectional view of the semiconductor device in Embodiment 1 during the manufacturing process thereof.

Next, as shown in FIG. 25, a conductive film CF1 is formed (Step S11 in FIG. 6). In Step S11, the conductive film CF1 for the gate electrodes is formed over the insulating films IFG, IF7, and IF5 in the memory formation region MR, the lower-breakdown-voltage MISFET formation region LR, and the higher-breakdown-voltage MISFET formation region HR.

Preferably, the conductive film CF1 is made of a polycrystalline silicon film, i.e., polysilicon film. The conductive film CF1 can be formed using a CVD method or the like. The conductive film CF1 is allowed to have a sufficient thickness to cover the insulating films IFG, IF7, and IF5. It is also possible to deposit an amorphous silicon film as the conductive film CF1 and then change the amorphous silicon film to a polycrystalline silicon film by subsequent heat treatment.

As the conductive film CF1, a conductive film having a low resistivity due to, e.g., an n-type impurity such as phosphorus (P) or arsenic (As) or a p-type impurity such as boron (B) introduced therein is preferably used. The impurity can be introduced during or after the deposition of the conductive film CF1. When the impurity is introduced during the deposition of the conductive film CF1, by causing a gas for depositing the conductive film CF1 to include a doping gas, the conductive film CF1 into which the impurity has been introduced can be deposited. Note that "n-type" means a conductivity type opposite to the p-type conductivity type and using an electron as a main charge carrier.

On the other hand, when the impurity is introduced after the deposition of the silicon film, the silicon film is deposited without intentional introduction of the impurity. Then, by introducing the impurity into the silicon film by an ion implantation method or the like, the conductive film CF1 into which an impurity has been introduced can be formed.

Figure 26:
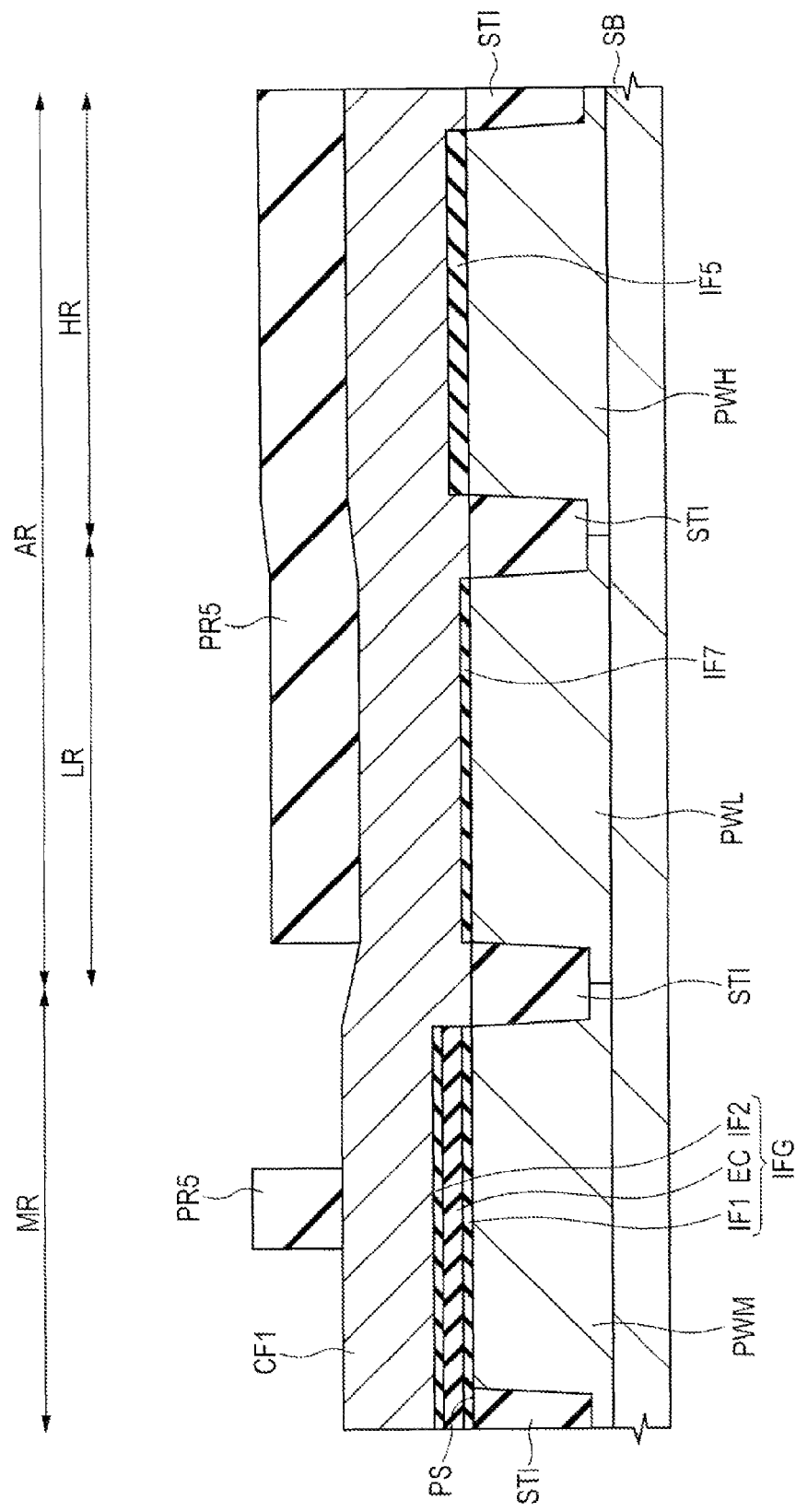
FIG. 26 is a main-portion cross-sectional view of the semiconductor device in Embodiment 1 during the manufacturing process thereof.
Figure 27:
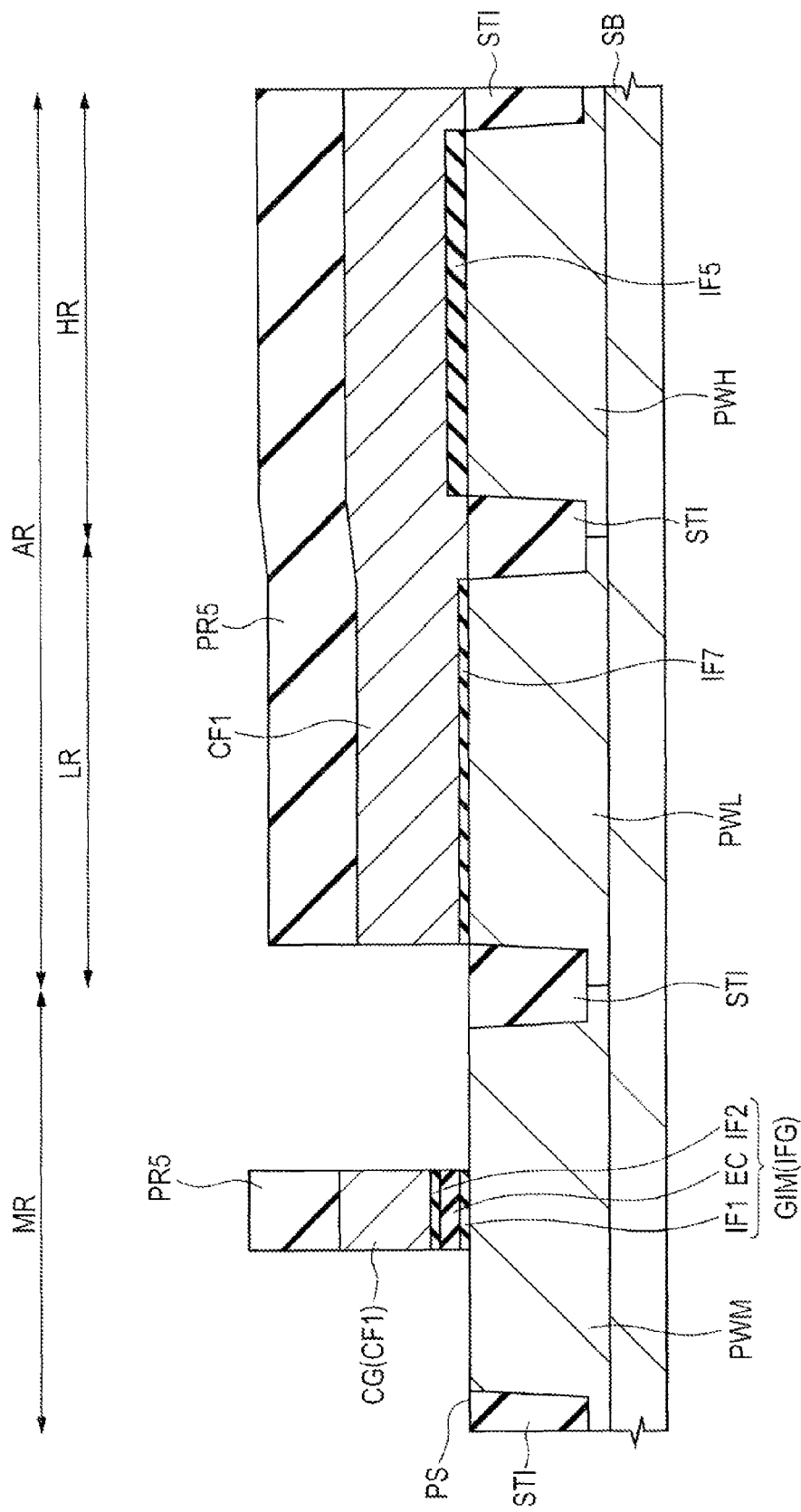
FIG. 27 is a main-portion cross-sectional view of the semiconductor device in Embodiment 1 during the manufacturing process thereof.

Next, as shown in FIGS. 26 and 27, in the memory formation region MR, the conductive film CF1 and the insulating film IFG are patterned (Step S12 in FIG. 6).

In Step S12, first, as shown in FIG. 26, a resist film PR5 is applied to the upper surface PS of the semiconductor substrate SB and then patterned by using a photolithographic technique. The resist film PR5 is patterned such that the portion of the conductive film CF1 which is located in the area of the memory formation region MR where the gate electrode CG is to be formed is covered with the resist film PR5 and the portion of the conductive film CF1 which is located in the area of the memory formation region MR other than the area thereof where the gate electrode CG is to be formed is exposed from the resist film PR5. The resist film PR5 is patterned such that the conductive film CF1 is covered with the resist film PR5 in the lower-breakdown-voltage MISFET formation region LR and the higher-breakdown-voltage MISFET formation region HR.

In Step S12, next, as shown in FIG. 27, using the patterned resist film PR5 as a mask, the conductive film CF1 and the insulating film IFG are etched by, e.g., dry etching or the like to be patterned.

As a result, in the memory formation region MR, the gate electrode CG made of the conductive film CF1 is formed, and the gate insulating film GIM made of the portion of the insulating film IFG which is located between the gate electrode CG and the p-type well PWM of the semiconductor substrate SB is formed. That is, in the memory formation region MR, the gate electrode CG is formed over the p-type well PWM of the semiconductor substrate SB via the gate insulating film GIM. On the other hand, in the lower-breakdown-voltage MISFET formation region LR, the conductive film CF1 and the insulating film IF7 are left and, in the higher-breakdown-voltage MISFET formation region HR, the conductive film CF1 and the insulating film IF5 are left.

Figure 28:
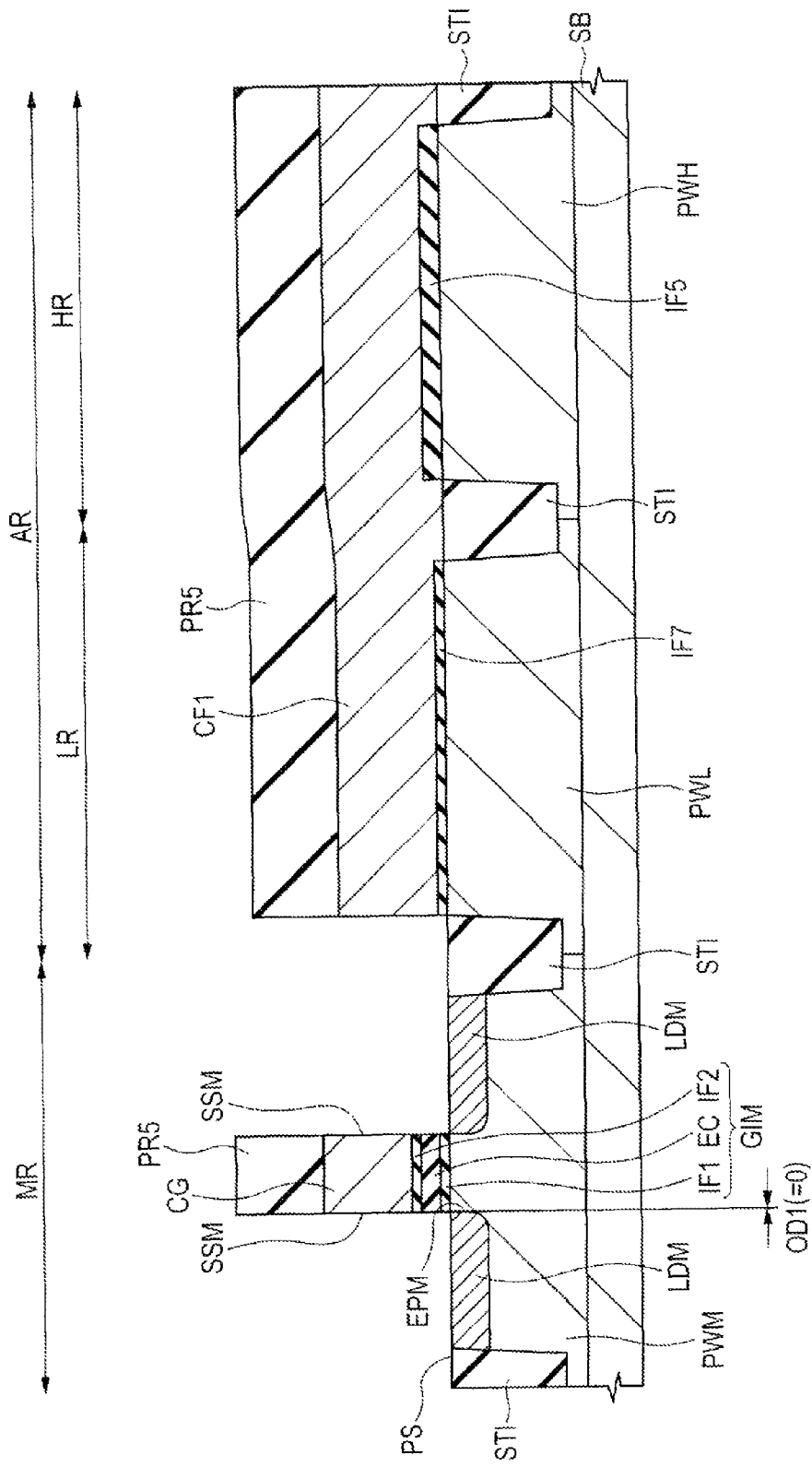
FIG. 28 is a main-portion cross-sectional view of the semiconductor device in Embodiment 1 during the manufacturing process thereof.
Figure 29:
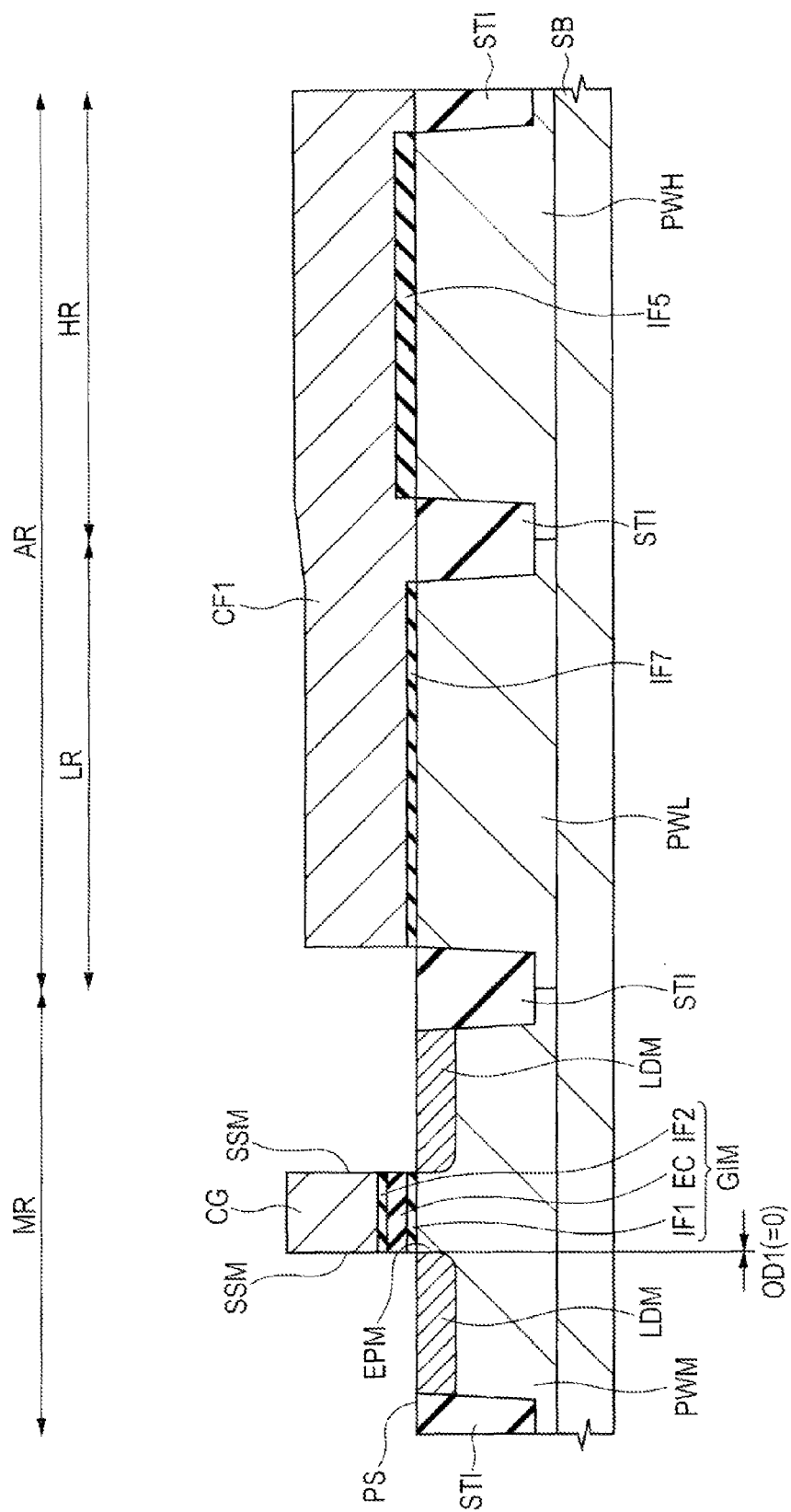
FIG. 29 is a main-portion cross-sectional view of the semiconductor device in Embodiment 1 during the manufacturing process thereof.

Next, as shown in FIGS. 28 and 29, the n⁻-type semiconductor regions LDH are formed (Step S13 in FIG. 5).

In Step S13, first, as shown in FIG. 28, in the memory formation region MR, using the gate electrode CG and the portion of the resist film PR5 which is left over the gate electrode CG as a mask, an n-type impurity such as, e.g., arsenic (As) or phosphorus (P) is introduced into the semiconductor substrate SB by an ion implantation method. At this time, in the memory formation region MR, n-type impurity ions are implanted into the semiconductor substrate SB using the gate electrode CG as a mask.

As a result, in the memory formation region MR, in plan view, the n⁻-type semiconductor regions LDM are formed in the respective upper-layer portions of the parts of the p-type well PWM which are located on both sides of the gate electrode CG interposed therebetween. The n⁻-type semiconductor regions LDM are formed by self-alignment with the both side surfaces SSM of the gate electrode CG. That is, in plan view, in the upper-layer portions of the parts of the p-type well PWM which are adjacent to the gate electrode CG, the n⁻-type semiconductor regions LDM are formed.

As shown in FIG. 28, the amount of offset of each of the n⁻-type semiconductor regions LDM from the gate electrode CG is assumed to be the amount of offset OD1. The amount of offset OD1 is defined as the distance of the position of the end portion EPM of each of the n⁻-type semiconductor regions LDM which is located closer to the gate electrode CG and spaced outward in the gate length direction of the gate electrode CG from the one of the both side surfaces SSM of the gate electrode CG which is located closer to the n⁻-type semiconductor region LDM to the side surface SSM. At this time, the amount of offset OD1 of each of the n⁻-type semiconductor regions LDM from the gate electrode CG is either 0 or generally equal to 0.

In Embodiment 1, when ion implantation is performed in Step S13, the resist pattern made of the resist film PR5 formed in Step S12 is used as mask without being altered. Accordingly, there is no need to provide a dedicated mask for forming the n⁻-type semiconductor regions LDM in the memory formation region MR.

In Step S13, next, as shown in FIG. 29, the patterned resist film PR5 is removed by, e.g., ashing.

Figure 30:
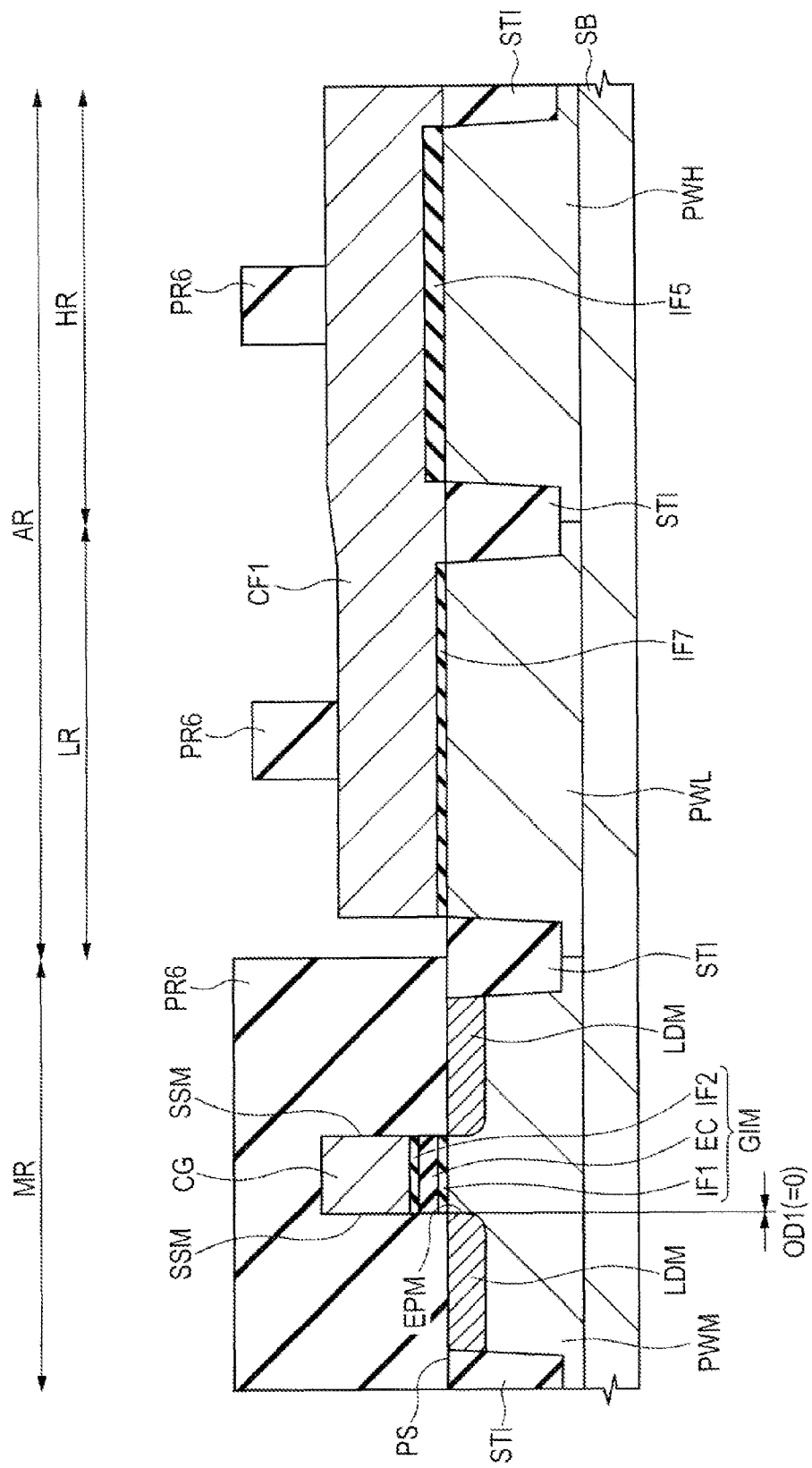
FIG. 30 is a main-portion cross-sectional view of the semiconductor device in Embodiment 1 during the manufacturing process thereof.
Figure 31:
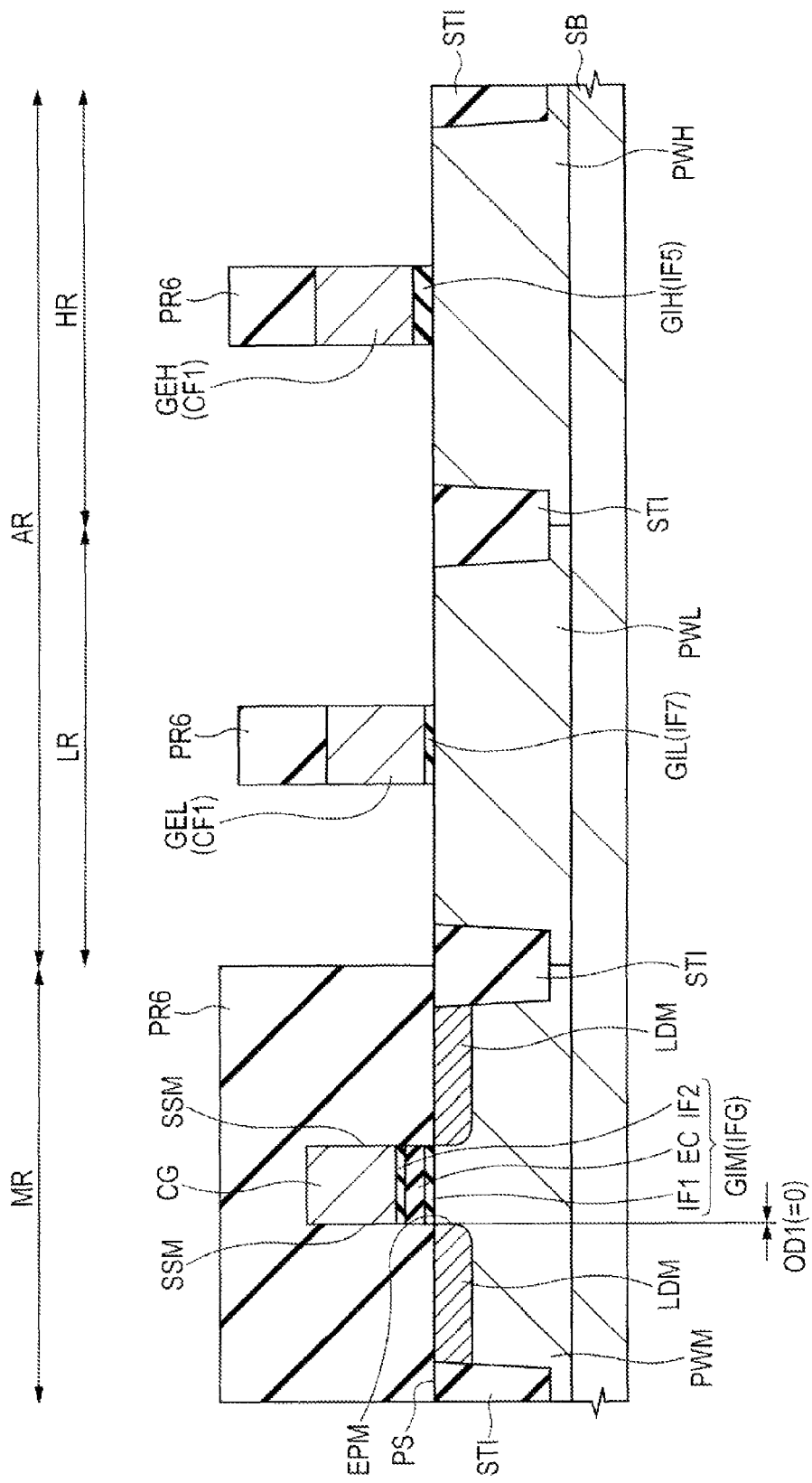
FIG. 31 is a main-portion cross-sectional view of the semiconductor device in Embodiment 1 during the manufacturing process thereof.
Figure 32:
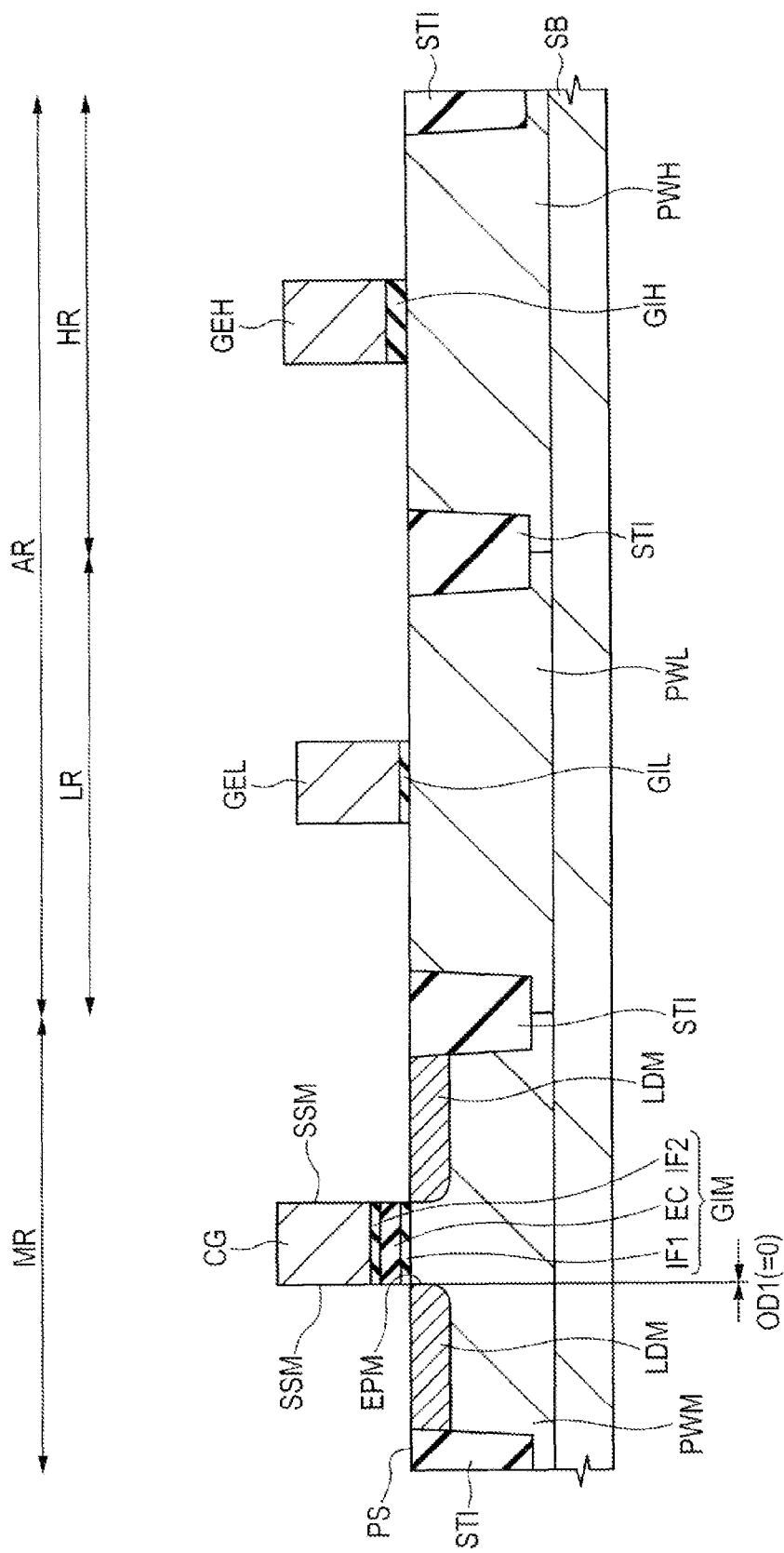
FIG. 32 is a main-portion cross-sectional view of the semiconductor device in Embodiment 1 during the manufacturing process thereof.

Next, as shown in FIGS. 30 to 32, in the main circuit formation region AR, the conductive film CF1 and the insulating films IF7 and IF5 are patterned (Step S14 in FIG. 6).

In Step S14, first, as shown in FIG. 30, a resist film PR6 is applied to the upper surface PS of the semiconductor substrate SB and then patterned using a photolithographic technique. The resist film PR6 is patterned so as to cover the portion of the conductive film CF1 which is located in the area of the lower-breakdown-voltage MISFET formation region LR where the gate electrode GEL is to be formed. The resist film PR6 is also patterned so as to cover the portion of the conductive film CF1 which is located in the area of the higher-breakdown-voltage MISFET formation region HR where the gate electrode GEH is to be formed. The resist film PR6 is also patterned so as to cover the gate electrode CG and the gate insulating film GIM in the memory formation region MR.

In Step S14, next, as shown in FIG. 31, using the patterned resist film PR6 as a mask, the conductive film CF1 and the insulating films IF7 and IF5 are etched by, e.g., dry etching or the like to be patterned.

As a result, in the lower-breakdown-voltage MISFET formation region LR, the gate electrode GEL made of the conductive film CF1 is formed, and the gate insulating film GIL made of the portion of the insulating film IF7 which is located between the gate electrode GEL and the p-type well PWL of the semiconductor substrate SB is formed. That is, in the lower-breakdown-voltage MISFET formation region LR, the gate electrode GEL is formed over the p-type well PWL of the semiconductor substrate SB via the gate insulating film GIL.

On the other hand, in the higher-breakdown-voltage MISFET formation region HR, the gate electrode GEH made of the conductive film CF1 is formed, and the gate insulating film GIH made of the portion of the insulating film IF5 which is located between the gate electrode GEH and the p-type well PWH of the semiconductor substrate SB is formed. That is, in the higher-breakdown-voltage MISFET formation region HR, the gate electrode GEH is formed over the p-type well PWH of the semiconductor substrate SB via the gate insulating film GIH.

In Step S14, next, as shown in FIG. 32, the patterned resist film PR6 is removed by, e.g., ashing.

Figure 33:
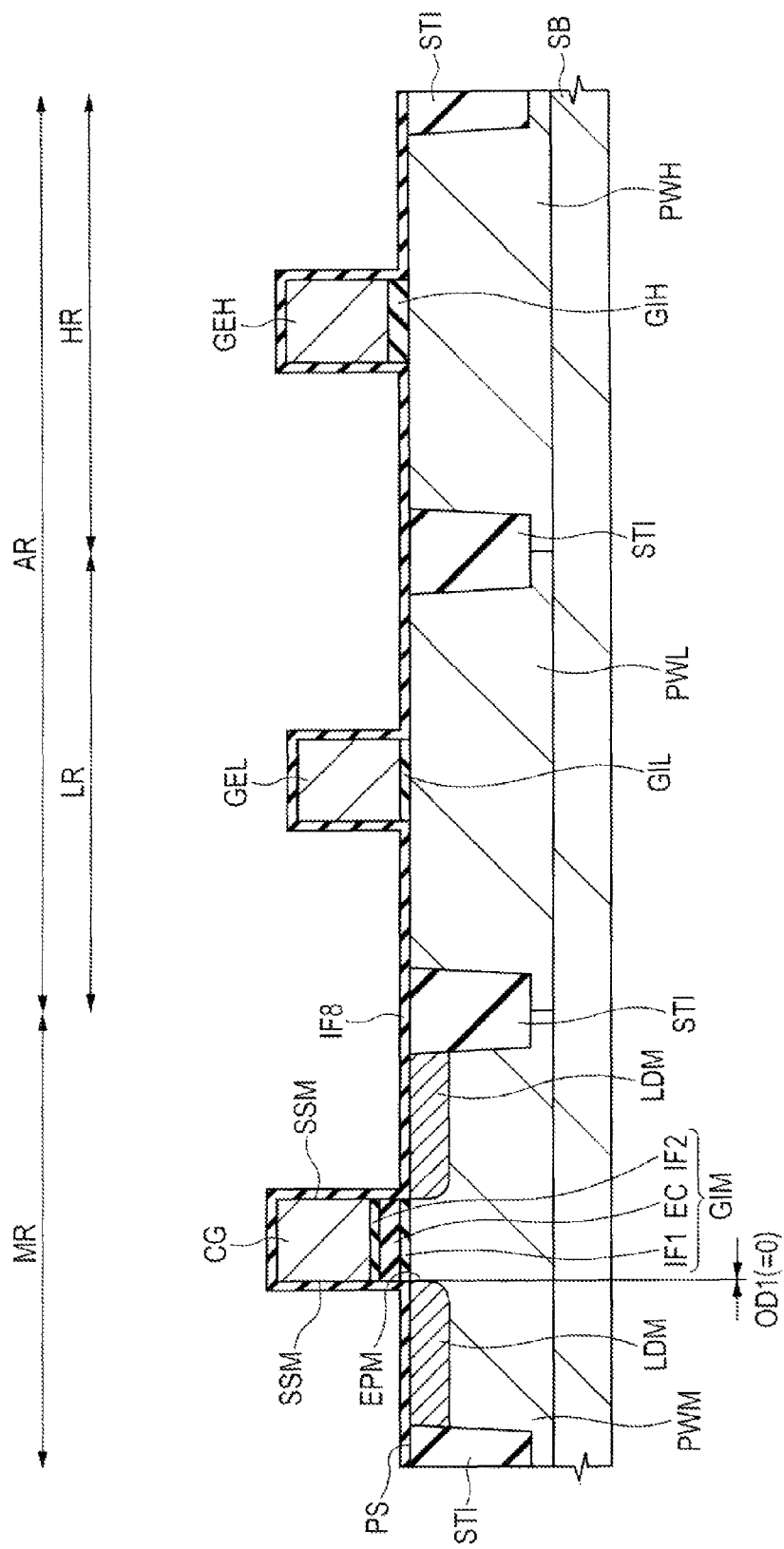
FIG. 33 is a main-portion cross-sectional view of the semiconductor device in Embodiment 1 during the manufacturing process thereof.
Figure 34:
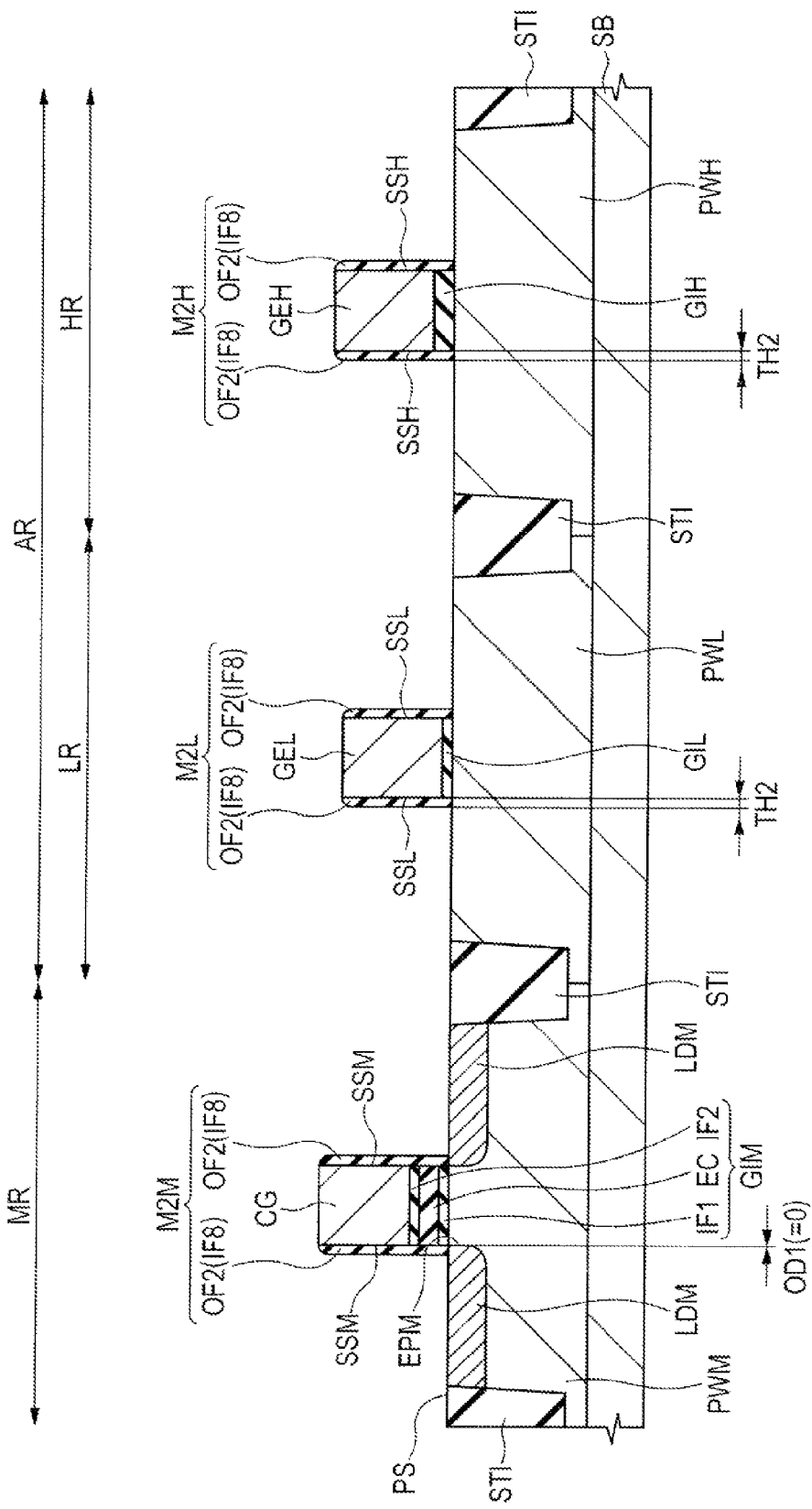
FIG. 34 is a main-portion cross-sectional view of the semiconductor device in Embodiment 1 during the manufacturing process thereof.

Next, as shown in FIGS. 33 and 34, offset spacers OF2 are formed (Step S15 in FIG. 6).

In Step S15, first, as shown in FIG. 33, over the entire upper surface PS of the semiconductor substrate SB, an insulating film IF8 for the offset spacers is formed by, e.g., a CVD method. The insulating film IF8 is made of, e.g., an insulating film made of silicon dioxide, an insulating film made of silicon nitride, a laminated film thereof, or the like. Note that the insulating film IF8 can also be formed by a thermal oxidation method.

At this time, in the memory formation region MR, the insulating film IF8 is formed over the upper surfaces of the n⁻-type semiconductor regions LDM, the side surfaces of the gate insulating film GIM, and the side and upper surfaces of the gate electrode CG. In the lower-breakdown-voltage MISFET formation region LR, the insulating film IF8 is formed over the side surfaces of the gate insulating film GIL and the side and upper surfaces of the gate electrode GEL. In the higher-breakdown-voltage MISFET formation region HR, the insulating film IF8 is formed over the side surfaces of the gate insulating film GIH and the side and upper surfaces of the gate electrode GEH.

In Step S15, next, as shown in FIG. 34, the insulating film IF8 is etched back by, e.g., anisotropic etching. By thus selectively leaving the insulating film IF8 over the both side surfaces SSM of the gate electrode CG in the memory formation region MR, the offset spacers OF2 as side-wall portions each made of the insulating film IF8 are formed individually over the both side surfaces SSM of the gate electrode CG. Thus, a mask body M2M including the gate electrode CG and the two offset spacers OF2 is formed. Note that the offset spacers OF2 are formed also over the respective side surfaces of the gate insulating film GIM.

By also selectively leaving the insulating film IF8 over the both side surfaces SSL of the gate electrode GEL in the lower-breakdown-voltage MISFET formation region LR, the offset spacers OF2 each made of the insulating film IF8 are formed individually over the both side surfaces SSL of the gate electrode GEL. Thus, a mask body M2L including the gate electrode GEL and the two offset spacers OF2 is formed. Note that the offset spacers OF2 are formed also over the respective side surfaces of the gate insulating film GIL.

By also selectively leaving the insulating film IF8 over the both side surfaces SSH of the gate electrode GEH in the higher-breakdown-voltage MISFET formation region HR, the offset spacers OF2 each made of the insulating film IF8 are formed individually over the both side surfaces SSH of the gate electrode GEH. Thus, a mask body M2H including the gate electrode GEH and the two offset spacers OF2 is formed. Note that the offset spacers OF2 are formed also over the respective side surfaces of the gate insulating film GIH.

As shown in FIG. 34, the thickness of each of the offset spacers OF2 is assumed to be a thickness TH2. The thickness HT2 of the offset spacer OF2 is equal to the thickness of the insulating film IF8. In the lower-breakdown-voltage MISFET formation region LR, the thickness TH2 is the thickness of each of the offset spacers OF2 in the gate length direction of the gate electrode GEL, i.e., in a direction perpendicular to the side surfaces SSL of the gate electrode GEL. In the higher-breakdown-voltage MISFET formation region HR, the thickness TH2 is the thickness of each of the offset spacers OF2 in the gate length direction of the gate electrode GEH, i.e., in a direction perpendicular to the side surfaces SSH of the gate electrode GEH.

Figure 35:
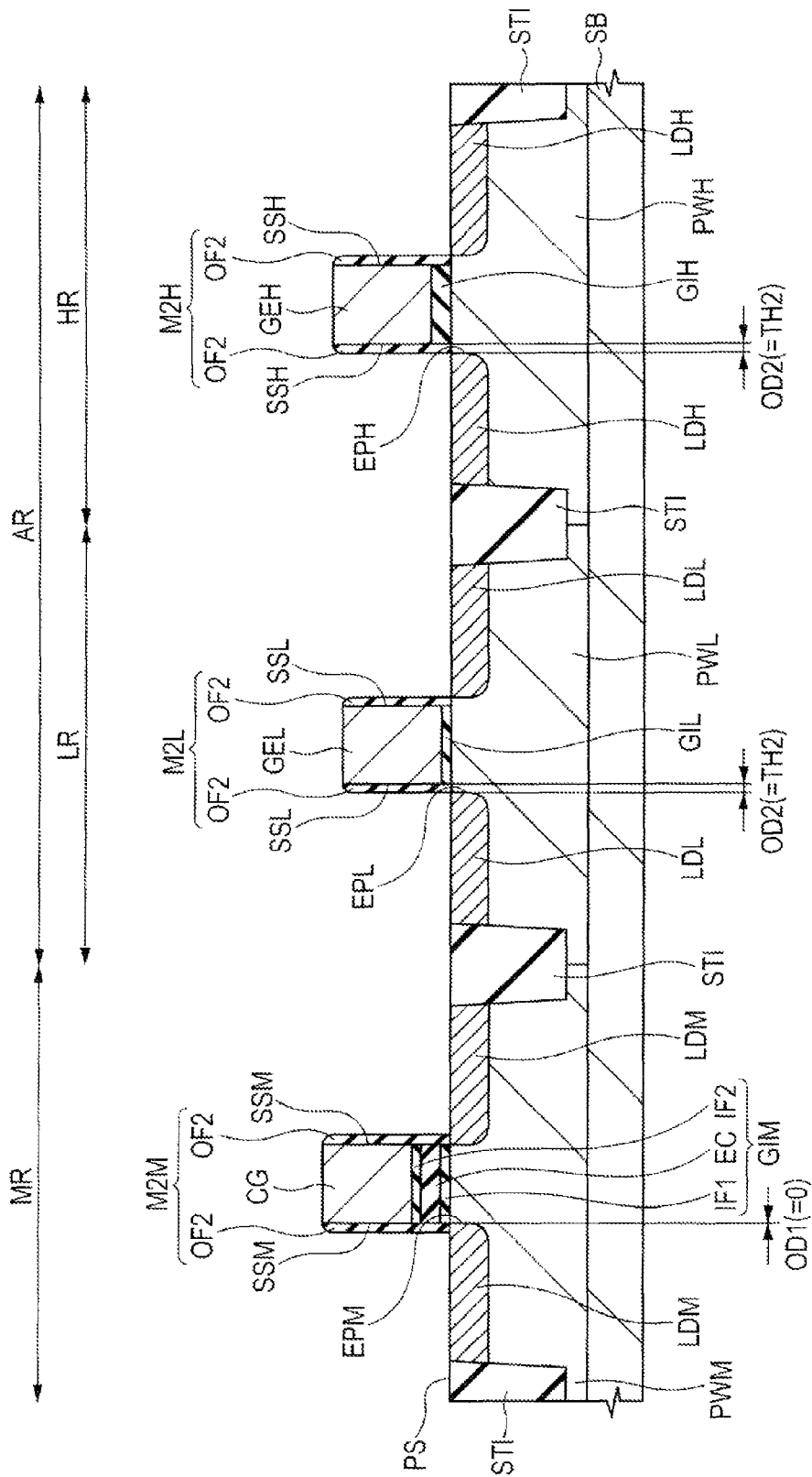
FIG. 35 is a main-portion cross-sectional view of the semiconductor device in Embodiment 1 during the manufacturing process thereof.

Next, as shown in FIG. 35, the n$^-$-type semiconductor regions LDL and LDH are formed (Step S16 in FIG. 5). In Step S16, in the lower-breakdown-voltage MISFET formation region LR, using the mask body M2L as a mask, an n-type impurity such as, e.g., arsenic (As) or phosphorus (P) is introduced into the semiconductor substrate SB by an ion implantation method. In the higher-breakdown-voltage MISFET formation region HR, using the mask body M2H as a mask, an n-type impurity such as, e.g., arsenic or phosphorus is introduced into the semiconductor substrate SB by an ion implantation method.

At this time, in the lower-breakdown-voltage MISFET formation region LR, using the gate electrode GEL and the offset spacers OF2 as a mask, n-type impurity ions are implanted into the semiconductor substrate SB. Also, in the higher-breakdown-voltage MISFET formation region HR, using the gate electrode GEH and the offset spacers OF2 as a mask, n-type impurity ions are implanted into the semiconductor substrate SB.

As a result, in the lower-breakdown-voltage MISFET formation region LR, in the respective upper-layer portions of the parts of the p-type well PWL which are located on both sides of the mask body M2L interposed therebetween in plan view, the n$^-$-type semiconductor regions LDL are formed. Also, in the higher-breakdown-voltage MISFET formation region HR, in the respective upper-layer portions of the parts of the p-type well PWH which are located on both sides of the mask body M2H interposed therebetween in plan view, the n$^-$-type semiconductor regions LDH are formed. In the lower-breakdown-voltage MISFET formation region LR, the n$^-$-type semiconductor regions LDL are formed by self-alignment with the both side surfaces of the mask body M2L. In the higher-breakdown-voltage MISFET formation region HR, the n$^-$-type semiconductor regions LDH are formed by self-alignment with the both side surfaces of the mask body M2H.

That is, in the lower-breakdown-voltage MISFET formation region LR, in the upper-layer portions of the parts of the p-type well PWL which are adjacent to the gate electrode GEL via the offset spacers OF2 in plan view, the n$^-$-type semiconductor regions LDL are formed. In the higher-breakdown-voltage MISFET formation region HR, in the upper-layer portions of the parts of the p-type well PWH which are adjacent to the gate electrode GEH via the offset spacers OF2 in plan view, the n$^-$-type semiconductor regions LDH are formed.

As shown in FIG. 35, the amount of offset of each of the n$^-$-type semiconductor regions LDL from the gate electrode GEL and the amount of offset of each of the n$^-$-type semiconductor regions LDH from the gate electrode GEH are each assumed to be the amount of offset OD2. The amount of offset OD2 is defined as the distance of the position of the end portion EPL of each of the n$^-$-type semiconductor regions LDL which is located closer to the gate electrode GEL and spaced outward in the gate length direction of the gate electrode GEL from the one of the both side surfaces SSL of the gate electrode GEL which is located closer to the n$^-$-type semiconductor region LDL to the side surface SSL. The amount of offset OD2 is also defined as the distance of the position of the end portion EPH of each of the n$^-$-type semiconductor regions LDH which is located closer to the gate electrode GEH and spaced outward in the gate length direction of the gate electrode GEH from the one of the both side surfaces SSH of the gate electrode GEH which is located closer to the n$^-$-type semiconductor region LDH to the side surface SSH. The amount of offset OD2 is equal to the thickness TH2 of the offset spacer OF2.

Since the amount of offset OD2 has a finite value larger than 0, it is possible to prevent the length of the portion of the n$^-$-type semiconductor region LDL overlapping the gate electrode GEL in plan view in the gate length direction of the gate electrode GEL from increasing or varying as a result of the expansion of the n$^-$-type semiconductor region LDL due to impurity diffusion during activation anneal. Also, since the amount of offset OD2 has a finite value larger than 0, it is possible to prevent the length of the portion of the n$^-$-type semiconductor region LDH overlapping the gate electrode GEH in plan view in the gate length direction of the gate electrode GEH from increasing or varying as a result of the expansion of the n$^-$-type semiconductor region LDH due to impurity diffusion during activation anneal.

As described above, the amount of offset OD1 of each of the n$^-$-type semiconductor regions LDM from the gate electrode CG is 0 or generally equal to 0. Accordingly, the amount of offset OD1 of each of the n$^-$-type semiconductor regions LDM from the gate electrode CG is either 0 or smaller than the amount of offset OD2 of each of the n$^-$-type semiconductor regions LDL from the gate electrode GEL, e.g., the amount of offset OD2 of each of the n$^-$-type semiconductor regions LDH from the gate electrode GER.

That is, in Embodiment 1, after the n$^-$-type semiconductor regions LDM are formed in the memory formation region MR, the gate electrode GEL and the gate insulating film GIL are formed in the lower-breakdown-voltage MISFET formation region LR, while the gate electrode GEH and the gate insulating film GIH are formed in the higher-breakdown-voltage MISFET formation region HR. This allows the amount of offset OD1 of each of the n$^-$-type semiconductor regions LDM from the gate electrode CG to be different from the amount of offset OD2 of each of the n$^-$-type semiconductor regions LDL from the gate electrode GEL, i.e., the amount of offset OD2 of each of the n$^-$-type semiconductor regions LDH from the gate electrode GEH.

Figure 41:
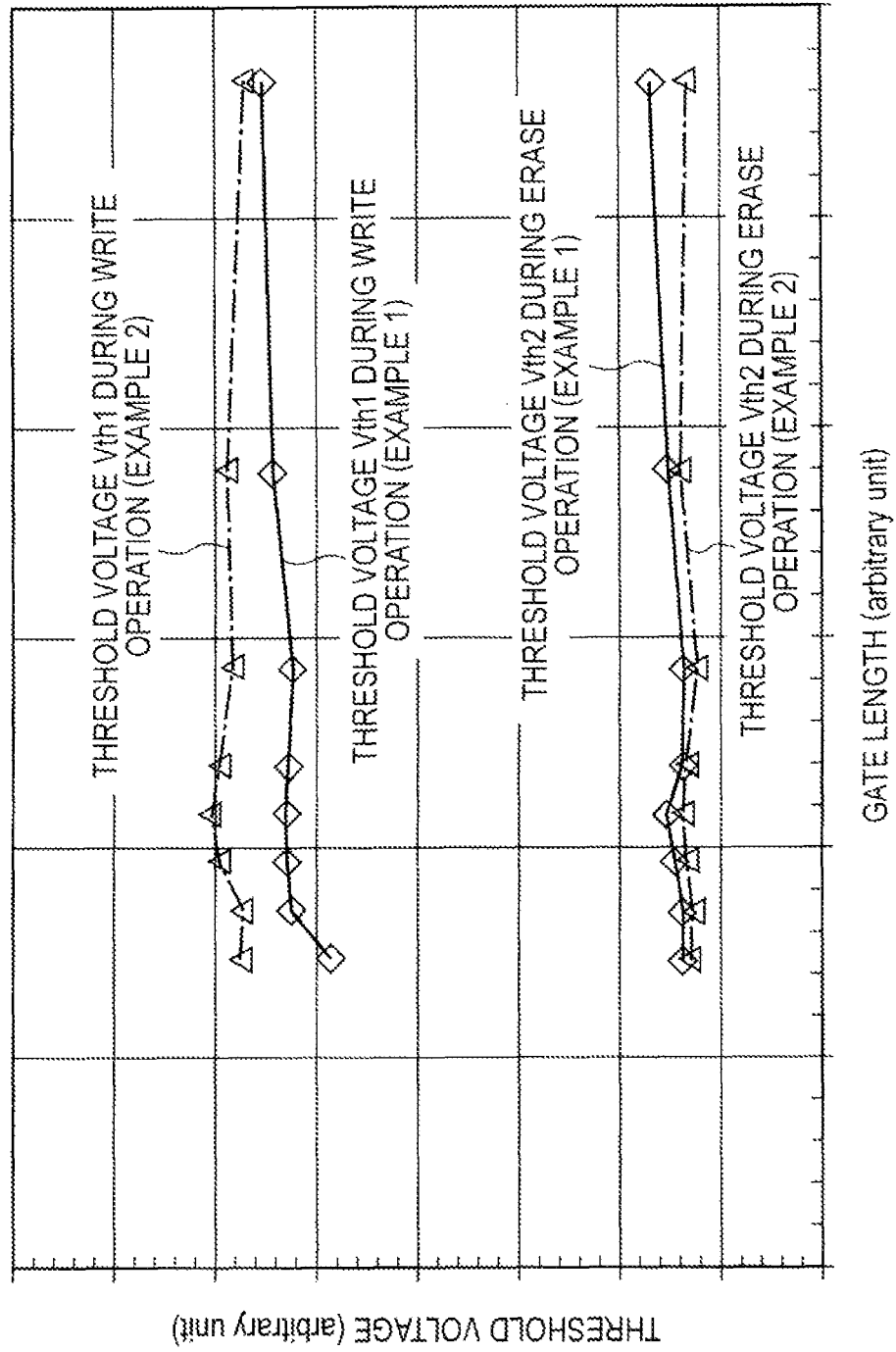
FIG. 41 is a graph showing the relationships between the gate length of a gate electrode and threshold voltages in a write operation and an erase operation in a MONOS transistor.

It is also possible to form the gate electrode GEL and the gate insulating film GIL in the lower-breakdown-voltage MISFET formation region LR and form the gate electrode GEH and the gate insulating film GIH in the higher-breakdown-voltage MISFET formation region HR before the n$^-$-type semiconductor regions LDM are formed in the memory formation region MR. Example 1 described later using FIG. 41 is manufactured by such a manufacturing method.

Alternatively, it is also possible to set the amount of offset OD2 to 0 without forming the offset spacers OF2.

Figure 36:
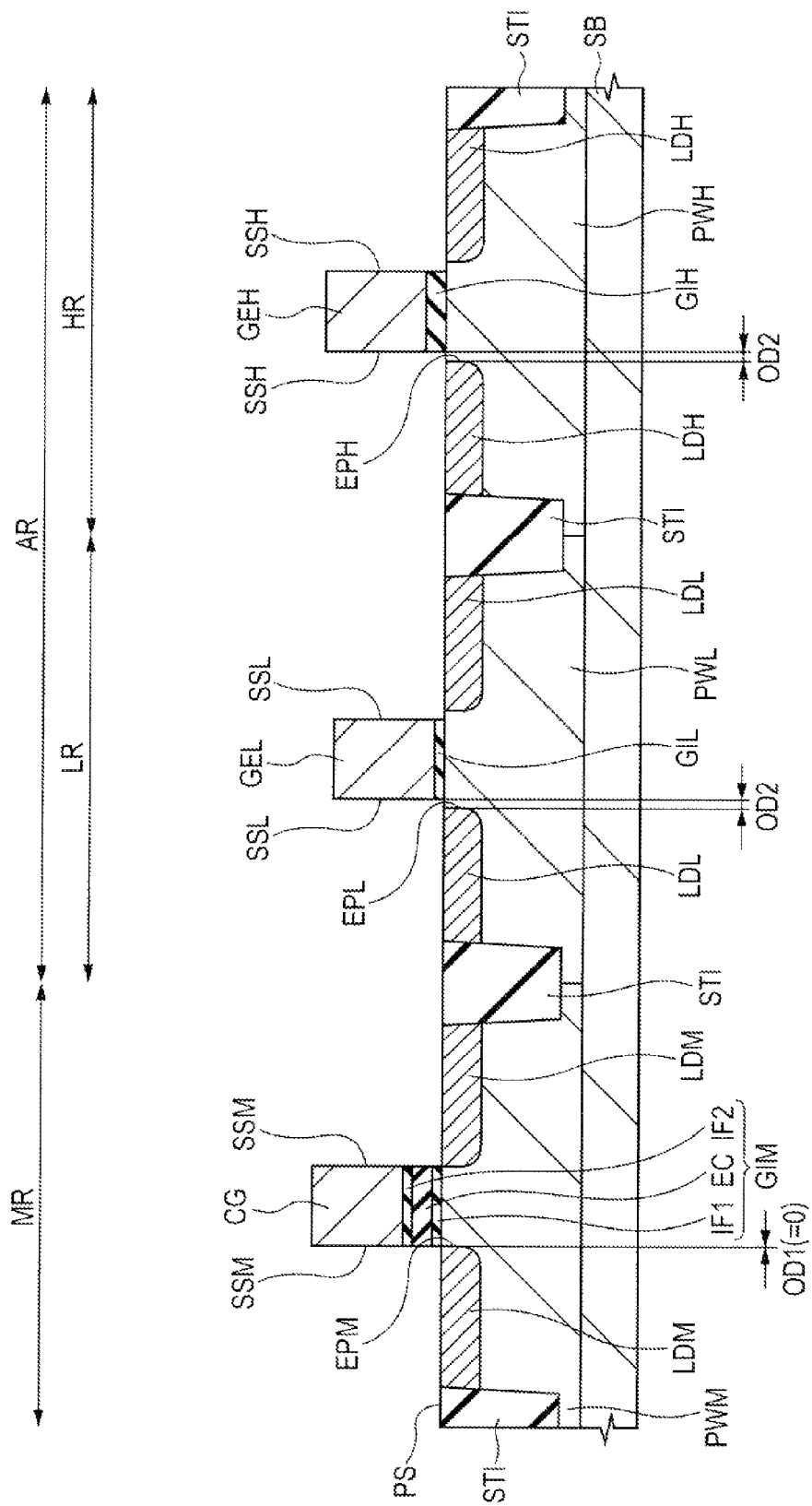
FIG. 36 is a main-portion cross-sectional view of the semiconductor device in Embodiment 11 during the manufacturing process thereof.
Figure 37:
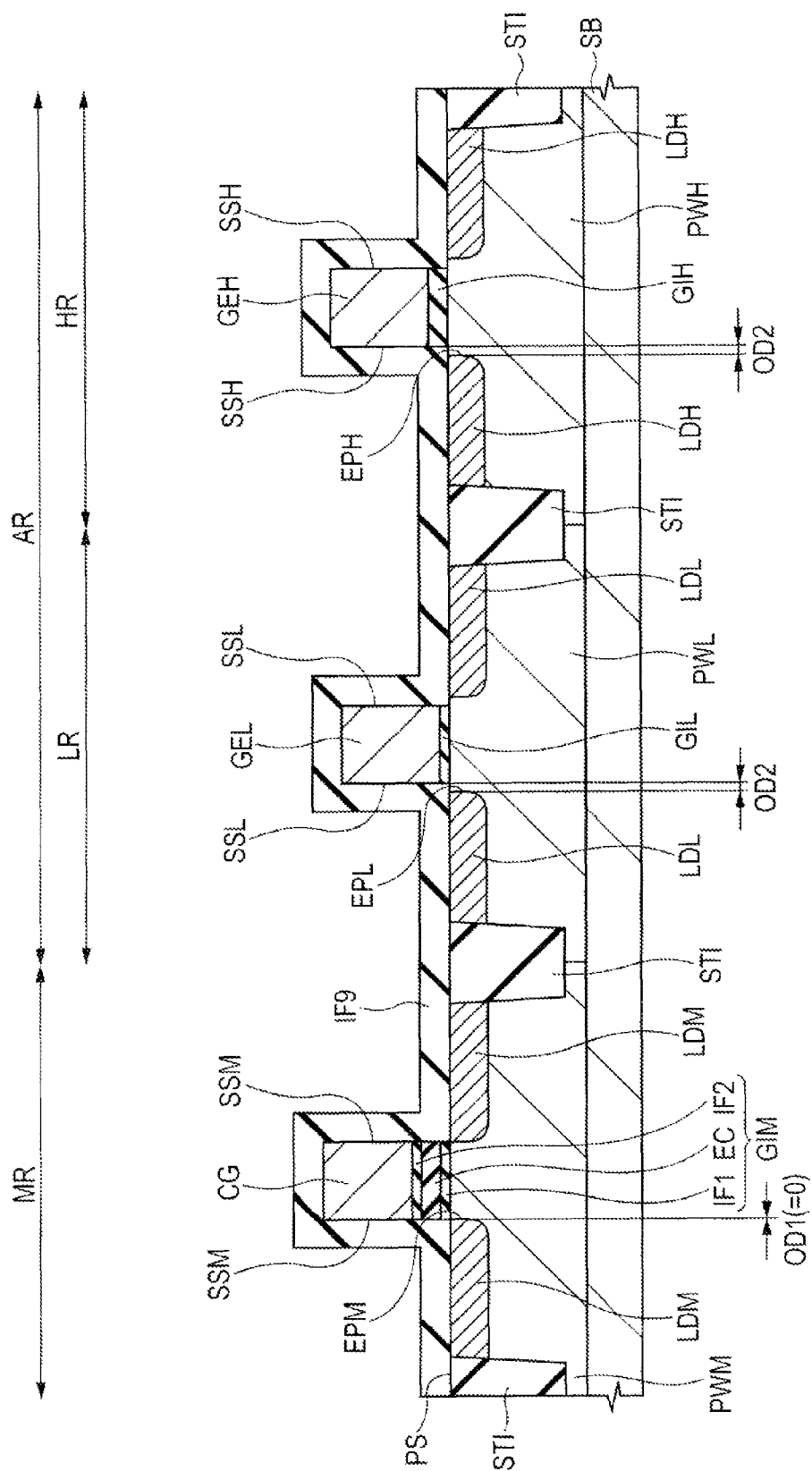
FIG. 37 is a main-portion cross-sectional view of the semiconductor device in Embodiment 1 during the manufacturing process thereof.
Figure 38:
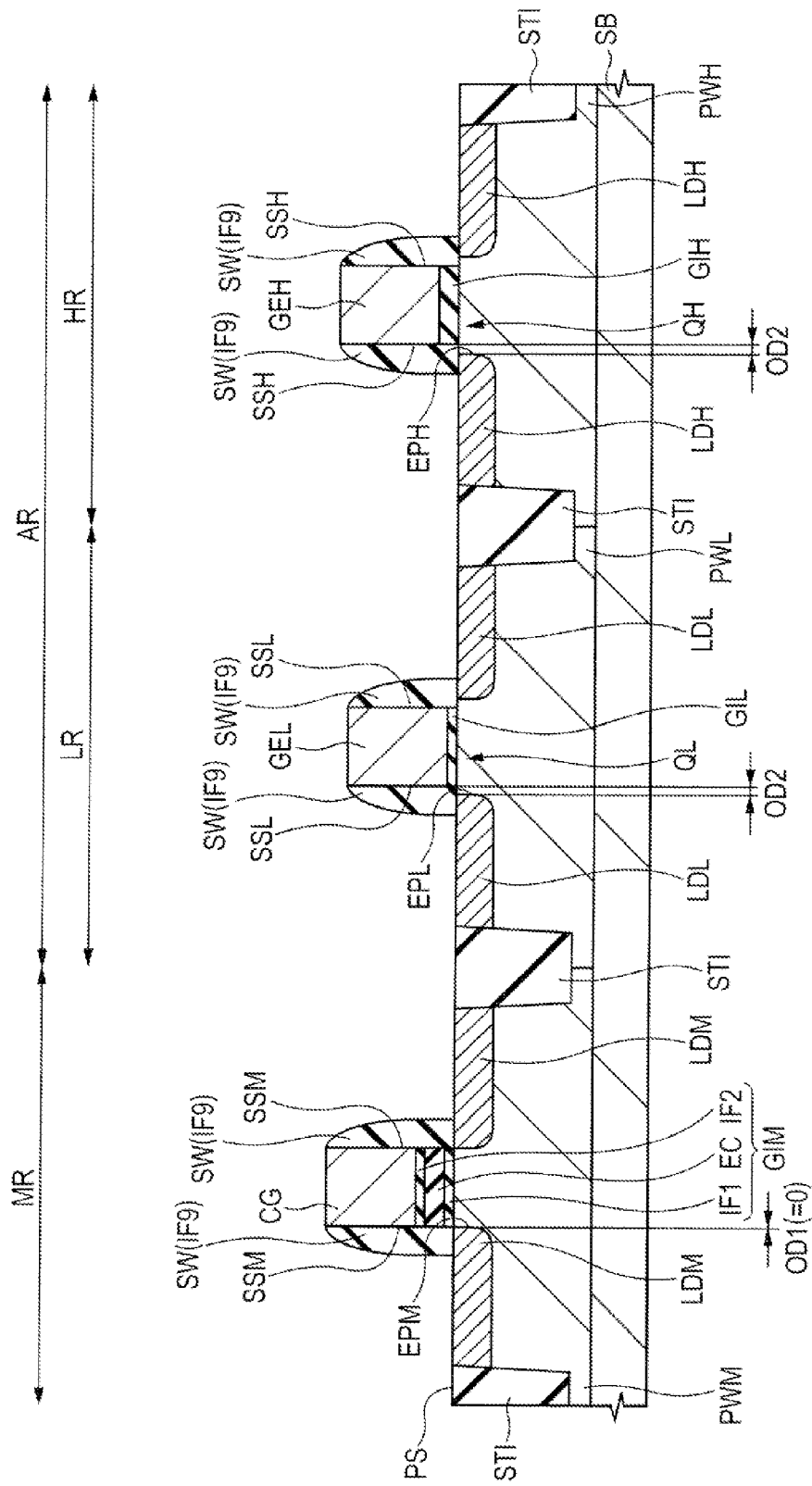
FIG. 38 is a main-portion cross-sectional view of the semiconductor device in Embodiment 1 during the manufacturing process thereof.

Next, as shown in FIGS. 36 to 38, the sidewall spacers SW are formed (Step S17 in FIG. 6).

In Step S17, first, as shown in FIG. 36, in the memory formation region MR, the two offset spacers OF2 formed individually over the both side surfaces SSM of the gate electrode CG are removed by wet etching using, e.g., a hydrofluoric acid (HF). Also, in the lower-breakdown-voltage MISFET formation region LR, the two offset spacers OF2 formed individually over the both side surfaces SSL of the gate electrode GEL are removed by wet etching using, e.g., a hydrofluoric acid. Also, in the higher-breakdown-voltage MISFET formation region HR, the two offset spacers OF2 formed individually over the both side surfaces SSL of the gate electrode GEH are removed by wet etching using, e.g., a hydrofluoric acid. Note that the offset spacers OF2 may also be left without being removed.

In Step S17, next, as shown in FIG. 37, over the entire upper surface PS of the semiconductor substrate SB, an insulating film IF9 for the sidewall spacers is formed. The insulating film IF9 is made of, e.g., an insulating film made of silicon dioxide, an insulating film made of silicon nitride, a laminated film thereof, or the like.

At this time, in the memory formation region MR, the insulating film IF9 is formed over the upper surfaces of the $n^-$-type semiconductor regions LDM, the side surfaces of the gate insulating film GIM, and the side and upper surfaces of the gate electrode CG. In the lower-breakdown-voltage MISFET formation region LR, the insulating film IF9 is formed over the upper surfaces of the $n^-$-type semiconductor regions LDL, the side surfaces of the gate insulating film GIL, and the side and upper surfaces of the gate electrodes GEL. In the higher-breakdown-voltage MISFET formation region HR, the insulating film IF9 is formed over the upper surfaces of the $n^-$-type semiconductor regions LDH, the side surfaces of the gate insulating film GIH, and the side and upper surfaces of the gate electrode GEH.

In Step S17, next, as shown in FIG. 38, the insulating film IF9 is etched back by, e.g., anisotropic etching. By thus selectively leaving the insulating film IF9 over the both side surfaces SSM of the gate electrode CG in the memory formation region MR, the sidewall spacers SW each made of the insulating film IF9 are formed individually over the both side surfaces SSM of the gate electrode CG. Note that the sidewall spacers SW are formed also over the both side surfaces of the gate insulating film GIM.

By also selectively leaving the insulating film IF9 over the both side surfaces SSL of the gate electrode GEL in the lower-breakdown-voltage MISFET formation region LR, the sidewall spacers SW each made of the insulating film IF9 are formed individually over the both side surfaces SSL of the gate electrode GEL. Note that the sidewall spacers SW are formed also over the respective side surfaces of the gate insulating film GIL.

By also selectively leaving the insulating film IF9 over the both side surfaces SSH of the gate electrode GEH in the higher-breakdown-voltage MISFET formation region HR, the sidewall spacers SW each made of the insulating film IF9 are formed individually over the both side surfaces SSH of the gate electrode GEH. Note that the sidewall spacers SW are formed also over the respective side surfaces of the gate insulating film GIH.

Preferably, the thickness of the insulating film IF9 is larger than the thickness TH2 (see FIG. 35) of each of the offset spacers OF2. Accordingly, the thickness of each of the sidewall spacers SW formed over the respective side surfaces of the gate electrodes CG, GEL, and GEH in the gate length direction is larger than the thickness TH2 of each of the offset spacers OF2.

Figure 39:
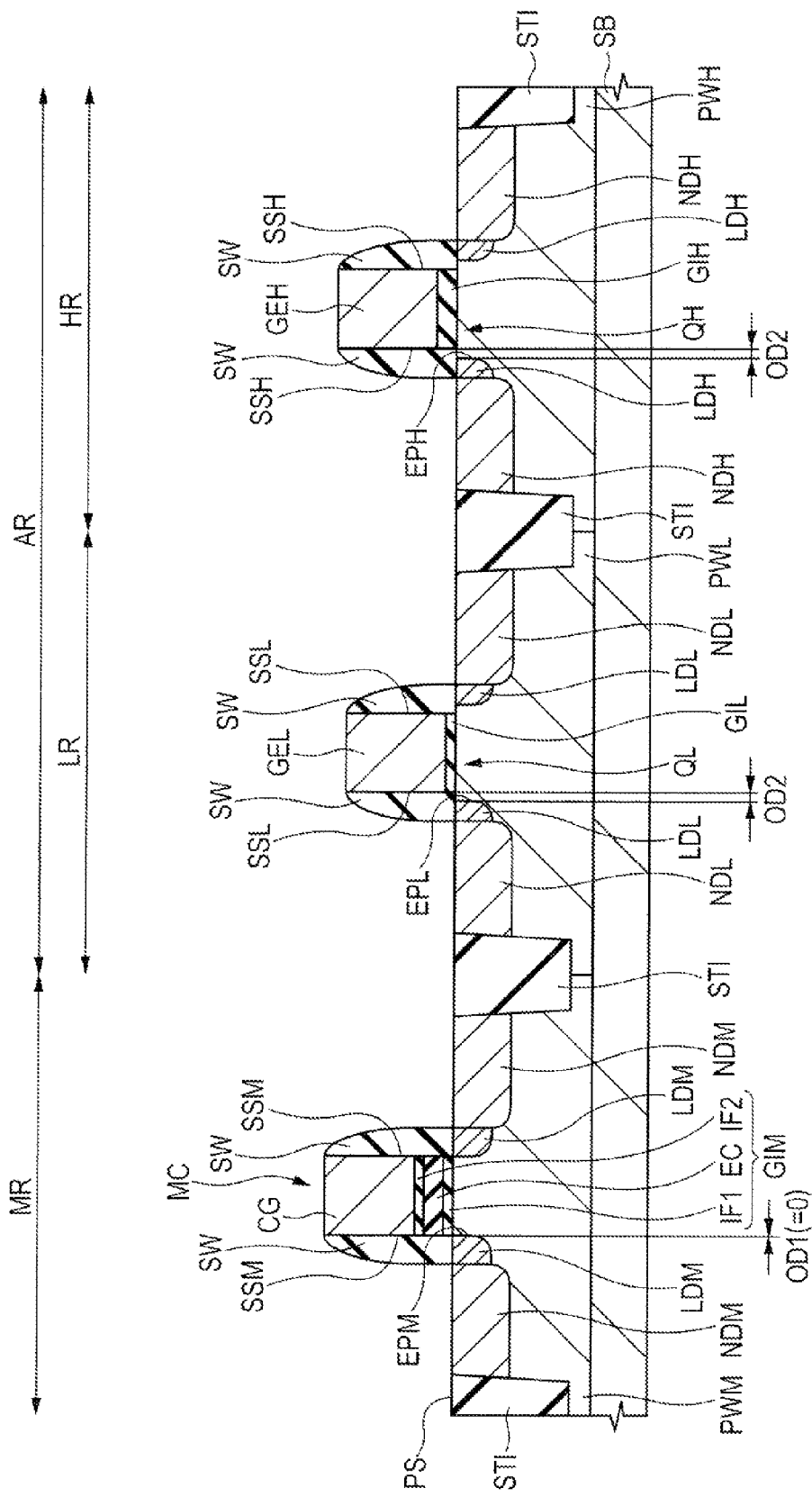
FIG. 39 is a main-portion cross-sectional view of the semiconductor device in Embodiment 1 during the manufacturing process thereof.

Next, as shown in FIG. 39, the $n^+$-type semiconductor regions NDM, NDL, and NDH are formed (Step S18 in FIG. 6). In Step S18, in the memory formation region MR, using the gate electrode CG and the two sidewall spacers SW as a mask, an n-type impurity such as, e.g., arsenic (As) or phosphorus (P) is introduced into the semiconductor substrate SB by an ion implantation method. Also, in the lower-breakdown-voltage MISFET formation region LR, using the gate electrode GEL and the two sidewall spacers SW as a mask, an n-type impurity such as, e.g., arsenic or phosphorus is introduced into the semiconductor substrate SB by an ion implantation method. Also, in the higher-breakdown-voltage MISFET formation region HR, using the gate electrode GEH and the two sidewall spacers SW as a mask, an n-type impurity such as, e.g., arsenic or phosphorus is introduced into the semiconductor substrate SB by an ion implantation method.

As a result, in the memory formation region MR, in the upper-layer portions of the parts of the p-type well PWM which are located opposite to the gate electrode CG relative to the sidewall spacers SW interposed therebetween in plan view, the $n^+$-type semiconductor regions NDM are formed. Also, in the lower-breakdown-voltage MISFET formation region LR, in the upper-layer portions of the parts of the p-type well PWL which are located opposite to the gate electrode GEL relative to the sidewall spacers SW interposed therebetween in plan view, the $n^+$-type semiconductor regions NDL are formed. Also, in the higher-breakdown-voltage MISFET formation region HR, in the upper-layer portions of the parts of the p-type well PWH which are located opposite to the gate electrode GEH relative to the sidewall spacers SW interposed therebetween in plan view, the $n^+$-type semiconductor regions NDH are formed.

In the memory formation region MR, the $n^+$-type semiconductor regions NDM are formed by self-alignment with the sidewall spacers SW. In the lower-breakdown-voltage MISFET formation region LR, the $n^+$-type semiconductor regions NDL are formed by self-alignment with the sidewall spacers SW. In the higher-breakdown-voltage MISFET formation region HR, the $n^+$-type semiconductor regions NDH are formed by self-alignment with the sidewall spacers SW.

As a result, as shown in FIG. 39, in the memory formation region MR, the p-type well PWM, the gate insulating film GIM, the gate electrode CG, the sidewall spacers SW, the $n^-$-type semiconductor regions LDM, and the $n^+$-type semiconductor regions NDM form the MONOS transistor MC. The MONOS transistor MC forms the memory cell as the nonvolatile memory.

On the other hand, as shown in FIG. 39, in the lower-breakdown-voltage MISFET formation region LR, the p-type well PWL, the gate insulating film GIL, the gate electrode GEL, the sidewall spacers SW, the $n^-$-type semiconductor regions LDL, and the $n^+$-type semiconductor regions NDL form the lower-breakdown-voltage MISFET QL. Also, in the higher-breakdown-voltage MISFET formation region HR, the p-type well PWH, the gate insulating film GIH, the gate electrode GEH, the sidewall spacers SW, the $n^-$-type semiconductor regions LDH, and the $n^+$-type semiconductor regions NDH form the higher-breakdown-voltage MISFET QH.

In Embodiment 1, as has been described using FIG. 28, in the memory formation region MR, impurity ions are implanted using the gate electrode CG as a mask to form the $n^-$-type semiconductor regions LDM. Accordingly, the amount of offset OD1 of each of the n⁻-type semiconductor regions LDM from the gate electrode CG is 0 or generally equal to 0.

On the other hand, as has been described using FIG. 35, in the lower-breakdown-voltage MISFET formation region LR, impurity ions are implanted using the mask body M2L including the gate electrode GEL and the two offset spacers OF2 as a mask to form the n⁻-type semiconductor regions LDL. Also, in the higher-breakdown-voltage MISFET formation region HR, impurity ions are implanted using the mask body M2H including the gate electrode GEH and the two offset spacers OF2 as a mask to form the n⁻-type semiconductor regions LDH. Accordingly, the amount of offset OD1 of each of the n⁻-type semiconductor regions LDM from the gate electrode CG is smaller than the amount of offset OD2 of each of the n⁻-type semiconductor regions LDL from the gate electrode GEL, i.e., the amount of offset OD2 of each of the n⁻-type semiconductor regions LDH from the gate electrode GEH.

Next, as shown in FIG. 3, the silicide films CS, the insulating film SNF, the interlayer insulating film IL1, and the plugs PG are formed (Step S19 in FIG. 5).

In Step S19, first, as shown in FIG. 3, the silicide films CS are formed. Over the entire upper surface PS of the semiconductor substrate SB, a metal film is formed so as to cover the n⁺-type semiconductor regions NDM, NDL, and NDH, the gate electrodes CG, GEL, and GEH, and the sidewall spacers SW. The metal film is made of, e.g., a cobalt (Co) film, a nickel (Ni) film, a nickel-platinum alloy film, or the like and can be formed using a sputtering method or the like. Then, by performing heat treatment on the semiconductor substrate SB, the respective upper-layer portions of the n⁺-type semiconductor regions NDM, NDL, and NDH and the gate electrodes CG, GEL, and GEH are caused to react with the metal film. Then, the unreacted metal film is removed.

By performing such a so-called salicide process, as shown in FIG. 3, the respective silicide films CS are formed over the n⁺-type semiconductor regions NDM, NDL, and NDH and the gate electrodes CG, GEL, and GEH. Each of the silicide films CS can be, e.g., a cobalt silicide layer, a nickel silicide layer, or a platinum-added nickel silicide layer.

In Step S19, next, as shown in FIG. 3, the insulating film SNF is formed. Over the entire upper surface PS of the semiconductor substrate SB, the insulating film SNF is formed so as to cover the n⁺-type semiconductor regions NDM, NDL, and NDH, the gate electrodes CG, GEL, and GEH, and the sidewall spacers SW. The insulating film SNF is made of, e.g., silicon nitride. The insulating film SNF can be formed by, e.g., a CVD method.

In Step S19, next, as shown in FIG. 3, the interlayer insulating film IL1 is formed over the insulating film SNF. The interlayer insulating film IL1 is made of, e.g., an insulating film made of silicon dioxide or a laminated film including an insulating film made of silicon nitride and an insulating film made of silicon dioxide. After the interlayer insulating film IL1 is formed by, e.g., a CVD method, the upper surface of the interlayer insulating film IL1 is planarized.

In Step S19, as shown in FIG. 3, the plugs PG are formed to extend through the interlayer insulating film IL1. First, using a resist pattern (not shown) formed over the interlayer insulating film IL1 using photolithography as an etching mask, the interlayer insulating film IL1 is dry-etched to be formed with the contact holes CNT. Then, in the contact holes CNT, the conductive plugs PG each made of tungsten (W) or the like are formed as, e.g., conductor portions.

To form the plugs PG, over, e.g., the interlayer insulating film IL1 including the inner surfaces of the contact holes CNT, a barrier conductor film made of, e.g., a titanium (Ti) film, a titanium nitride (TiN) film, or a laminated film thereof is formed. Then, over the barrier conductor film, a main conductor film made of, e.g., a tungsten (W) film or the like is formed so as to be embedded in the contact holes CNT. The unneeded main conductor film and the unneeded barrier conductor film over the interlayer insulating film IL1 are removed by a CMP method, an etch-back method, or the like. Thus, the plugs PG can be formed. Note that, for simpler illustration, in FIG. 3, the barrier conductor film and the main conductor film which are included in each of the plugs PG are integrally shown.

The contact holes CNT and the plugs PG embedded therein are formed over the respective n⁺-type semiconductor regions NDM, NDL, and NDH and formed also over the gate electrodes CG, GEL, GEH, and the like, though the illustration thereof is omitted. At the bottom portions of the contact holes CNT, parts of the silicide films CS over, e.g., the respective n⁺-type semiconductor regions NDM, NDL, and NDH are exposed, and parts of the silicide films CS over the respective gate electrodes CG, GEL, and GEH are also exposed, though the illustration thereof is omitted.

Next, as shown in FIG. 3, the interlayer insulating film IL2 and the wires ML1 are formed (Step S20 in FIG. 6).

In Step S20, first, as shown in FIG. 3, the interlayer insulating film IL2 made of, e.g., silicon dioxide is formed over the interlayer insulating film IL1 in which the plugs PG are formed. Then, using a photolithographic technique and an etching technique, wire trenches are formed in the interlayer insulating film IL2. Then, over the interlayer insulating film IL2 including the inner surfaces of the wire trenches, a copper (Cu) film is formed. Then, the copper film exposed over the interlayer insulating film IL2 except for the portions thereof embedded in the wire trenches is polished by, e.g., a CMP method to be removed. This allows the copper film to be left only in the wire trenches formed in the interlayer insulating film IL2 and form the wires ML1. In this manner, the semiconductor device in Embodiment 1 can be formed.

In Embodiment 1, the description has been given of the example in which the wires ML1 each made of the copper film are formed. However, the wires ML1 each made of, e.g., an aluminum (Al) film can also be formed.

<About Damage in Forming Gate Electrodes and Gate Insulating Films>

Figure 40:
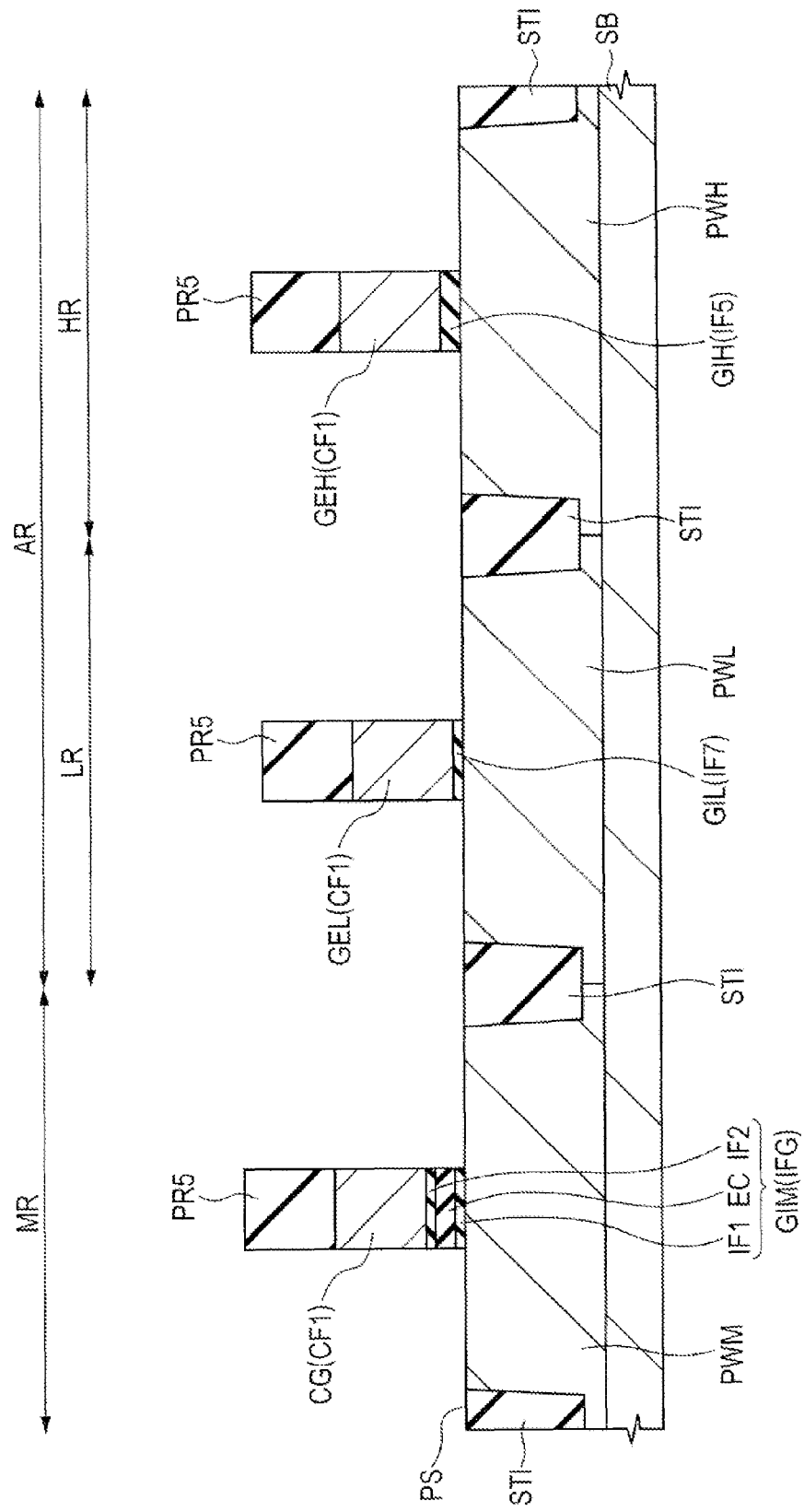
FIG. 40 is a main-portion cross-sectional view of a semiconductor device in a comparative example during the manufacturing process thereof.

Next, a description will be given of damage in forming the gate electrodes and the gate insulating films in comparison to that in a method of manufacturing a semiconductor device in a comparative example. FIG. 40 is a main-portion cross-sectional view of the semiconductor device in the comparative example during the manufacturing process thereof.

In the comparative example, in the same manner as in Embodiment 1, process steps equivalent to Steps S1 in FIG. 5 to S11 in FIG. 6 are performed. Then, in the comparative example, unlike in Embodiment 1, when the conductive film CF1 and the insulating film IFG are patterned in the memory formation region MR in a process step equivalent to Step S12 in FIG. 6, the conductive film CF1 and the insulating film IF7 are patterned in the lower-breakdown-voltage MISFET formation region LR. Also, when the conductive film CF1 and the insulating film IFG are patterned in the memory formation region MR, the conductive film CF1 and the insulating film IF5 are patterned in the higher-breakdown-voltage MISFET formation region HR.

As described above, the thickness of the insulating film IFG is larger than the thickness of the insulating film IF7. Accordingly, before the portion of the insulating film IFG which is located in the area other than the area where the gate electrode CG is to be formed is etched and completely removed, the portion of the insulating film IF7 which is located in the area of the lower-breakdown-voltage MISFET formation region LR other the area thereof where the gate electrode GEL is to be formed is etched and removed to expose the upper surface PS of the semiconductor substrate SB.

Then, during the period when the portion of the insulating film IFG which is located in the area other than the area where the gate electrode CG is to be formed is etched before completely removed, the exposed upper surface PS of the semiconductor substrate SB is etched in the area of the lower-breakdown-voltage MISFET formation region LR other than the area thereof where the gate electrode GEL is to be formed.

As a result, the surface layer of the upper surface PS of the semiconductor substrate SB may be damaged or removed by dry etching in the area of the lower-breakdown-voltage MISFET formation region LR other than the area thereof where the gate electrode GEL is to be formed. Alternatively, in the lower-breakdown-voltage MISFET formation region LR, in the $n^-$-type semiconductor regions LDL subsequently formed in the upper-layer portions of the parts of the p-type well PWL which are located on both sides of the gate electrode GEL in plan view, an electric property such as, e.g., mobility deteriorates or the reliability of such an electric property deteriorates. As a result, the transistor properties of the lower-breakdown-voltage MISFET QL deteriorate or the reliability of the lower-breakdown-voltage MISFET QL deteriorates to degrade the performance of the semiconductor device having the MONOS transistor MC or the lower-breakdown-voltage MISFET QL.

It can also be considered that, in the step of etching the conductive film CF1 and the insulating film IFG, the charge storage film EC included in the insulating film IFG and made of, e.g., silicon nitride is etched by wet etching using, e.g., a hot phosphoric acid. However, in the wet etching using the hot phosphoric acid, a resist film cannot be used as a mask. Accordingly, in the step of etching the conductive film CF1 and the insulating film IFG, because of using a resist film as a mask, the charge storage film EC included in the insulating film IFG and made of, e.g., silicon nitride needs to be etched by dry etching. As a result, as described above, as long as the conductive film CG1 and the insulating films IFG and IF7 are patterned by the same step in the main circuit formation region AR and the memory formation region MR, it is unavoidable to encounter the problem that the upper surface PS of the semiconductor substrate SB which is exposed earlier in the lower-breakdown-voltage MISFET formation region LR is damaged by dry etching.

In the same technique as the technique described in Patent Document 3 mentioned above, by patterning the conductive film in the main circuit formation region and the memory formation region, the respective gate electrodes are formed in the main circuit formation region and the memory formation region. Next, the sidewall spacers are formed over the respective side surfaces of the gate electrodes. Then, by etching an insulating film for gate insulating films using the gate electrodes having sidewall spacers formed over the both side surfaces thereof as a mask, gate insulating films are formed in the main circuit formation region and a gate insulating film having an internal charge storage portion is formed in the memory formation region.

However, in such a method, in the memory formation region, not only the portion of the insulating film for gate insulating films which is located under the gate electrode, but also the portions of the insulating film for gate insulating films which are located under the sidewall spacers formed over the side surfaces of the gate electrodes are left. To the portions of the insulating film for gate insulating films which are located under the sidewall spacers and to the portions of the channel region which are located thereunder, a voltage due to the gate electrode is less likely to be applied. As a result, e.g., the charges temporarily stored in the portions of the insulating film for gate insulating films which are located under the sidewall spacers are less likely to be subsequently released from the portions of the insulating film for gate insulating films which are located under the sidewall spacers. Due to this or other factors, the properties of the memory cell deteriorate.

In the same technique as the technique described in Patent Document 4 mentioned above, when an insulating film for gate insulating films made of silicon dioxide is formed over the upper surface of the semiconductor substrate made of silicon in the main circuit formation region, an insulating film made of silicon dioxide is formed over the upper surface of the charge storage film made of silicon nitride in the memory formation region. Also, in the technique described in Patent Document 4 described above, using the fact that an oxidation speed at the upper surface of the semiconductor substrate made of silicon is higher than an oxidation speed at the upper surface of the insulating film made of silicon nitride, the thickness of the insulating film for gate insulating films in the main circuit formation region is set larger than the thickness of the insulating film over the charge storage film in the memory formation region.

However, in such a method, depending on conditions for the step of forming the gate insulating film in the main circuit formation region, the thickness of the insulating film for gate insulating films in the memory formation region may vary. As a result, when versatility is required of the main circuits formed in the main circuit formation region and various thicknesses are set as the thicknesses of the gate insulating films in the main circuit formation region, the thicknesses of the gate insulating films in the memory formation region cannot be adjusted to optimum values so that the performance of the semiconductor device deteriorates.

Note that, when the thickness of the insulating film IFG is larger than the thickness of the insulating film IF5, not only the transistor properties of the lower-breakdown-voltage MISFET QL, but also the transistor properties of the higher-breakdown-voltage MISFET QH deteriorate. This degrades the performance of the semiconductor device including the MONOS transistor MC, the lower-breakdown-voltage MISFET QL, and the higher-breakdown-voltage MISFET QH.

By contrast, in Embodiment 1, when the conductive film CF1 and the insulating film IFG are patterned to form the gate electrode CG and the gate insulating film GIM in the memory formation region MR, the conductive film CF1 and the insulating film IF7 are not patterned in the lower-breakdown-voltage MISFET formation region LR of the main circuit formation region AR. Then, the conductive film CF1 and the insulating film IF7 are patterned in the lower-breakdown-voltage MISFET formation region LR to form the gate electrode GEL and the gate insulating film GIL.

This can prevent the surface layer of the upper surface PS of the semiconductor substrate SB from being damaged or removed in the area of the lower-breakdown-voltage MIS- FET formation region LR other than the area thereof where the gate electrode GEL is to be formed. In addition, in the lower-breakdown-voltage MISFET formation region LR, it is possible to prevent or inhibit an electric property such as, e.g., mobility and the reliability of such an electric property from deteriorating in the n⁻-type semiconductor regions LDL formed in the upper-layer portions of the parts of the p-type well PWL which are located on both sides of the gate electrode GEL interposed therebetween in plan view. As a result, it is possible to improve the transistor properties of the lower-breakdown-voltage MISFET QL, improve the reliability of the lower-breakdown-voltage MISFET QL, and improve the performance of the semiconductor device including the MONOS transistor MC and the lower-breakdown-voltage MISFET QL.

As stated previously, as long as the conductive film and the insulating films are simultaneously patterned in the main circuit formation region AR and the memory formation region MR, it is unavoidable to encounter the problem that the upper surface PS of the semiconductor substrate SB exposed earlier in the lower-breakdown-voltage MISFET formation region LR is damaged by dry etching. Accordingly, in Embodiment 1, it is possible to reliably prevent the upper surface PS of the semiconductor substrate SB from being damaged by dry etching in the lower-breakdown-voltage MISFET formation region LR.

Also, in Embodiment 1, unlike in the technique described in Patent Document 3 mentioned above, by continuously performing the step of patterning the conductive film CF1 and the step of patterning the insulating film IFG in the memory formation region MR, the gate electrode CG and the gate insulating film GIM are formed in the memory formation region MR. That is, in Embodiment 1, unlike in the technique described in Patent Document 3 mentioned above, when the insulating film IFG is patterned, the insulating film IFG is etched using the gate electrode CG as a mask in a state where the sidewall spacers SW are not formed over the side surfaces of the gate electrode CG.

As a result, in the memory formation region MR, the insulating film IFG is not left under the sidewall spacers SW formed over the side surfaces of the gate electrode CG. Accordingly, when, e.g., the portions of the insulating film IFG which are located under the sidewall spacers SW are left, it is possible to prevent a situation in which the charges temporarily stored in the portions of the insulating film IFG which are located under the sidewall spacers SW are less likely to be subsequently released from the portions of the insulating film IFG which are located under the sidewall spacers SW.

Also, in Embodiment 1, unlike in the technique described in Patent Document 4 mentioned above, in the memory formation region MR, the insulating film IF2 is formed over the charge storage film EC by another step other than the step of forming the insulating film IF7 or IF5 for gate insulating films in the main circuit formation region AR. Accordingly, it is possible to prevent the thickness of the insulating film IF2 over the charge storage film EC in the memory formation region MR from varying depending on conditions for the step of forming the insulating film IF7 or IF5 in the main circuit formation region AR. As a result, even when versatility is required of the main circuits formed in the main circuit formation region AR and various thicknesses are set as the thickness of the gate insulating film GIL or GIH, it is possible to adjust the thickness of the insulating film IF2 over the charge storage film EC to an optimum value and improve the performance of the semiconductor device.

Note that, when the thickness of the insulating film IFG is larger than the thickness of the insulating film IF5, it is possible to improve the transistor properties of the lower-breakdown-voltage MISFET QL and also improve the transistor properties of the higher-breakdown-voltage MISFET QH.

<About Formation of n⁻-Type Semiconductor Regions Before Formation of Offset Spacers>

As has been described above using FIG. 35, in the lower-breakdown-voltage MISFET formation region LR, using the mask body M2L including the gate electrode GEL and the two offset spacers OF2 as a mask, an impurity is ion-implanted into the semiconductor substrate SB to form the n⁻-type semiconductor regions LDL. As a result, it is possible to prevent the length of the portion of the n⁻-type semiconductor region LDL overlapping the gate electrode GEL in plan view in the gate length direction of the gate electrode GEL from increasing or varying as a result of the expansion of the n⁻-type semiconductor region LDL due to impurity diffusion during activation anneal.

On the other hand, in the higher-breakdown-voltage MISFET formation region HR, using the mask body M2H including the gate electrode GEH and the two offset spacers OF2 as a mask, an impurity is ion-implanted into the semiconductor substrate SB to form the n⁻-type semiconductor regions LDH. As a result, it is possible to prevent the length the portion of the n⁻-type semiconductor region LDH overlapping the gate electrode GEH in plan view in the gate length direction of the gate electrode GEH from increasing or varying as a result of the expansion of the n⁻-type semiconductor region LDH due to impurity diffusion during activation anneal.

Likewise, in the memory cell formation region MR also, the n⁻-type semiconductor regions LDM may be formed by forming the offset spacers OF2 over the both side surfaces SSM of the gate electrode CG and then ion-implanting an impurity into the semiconductor substrate SB using the mask body M2M including the gate electrode CG and the two offset spacers OF2 as a mask. However, the n⁻-type semiconductor regions LDM are preferably formed by ion-implanting an impurity into the semiconductor substrate SB using the gate electrode CG as a mask before the offset spacers OF2 are formed over the both side surfaces SSM of the gate electrode CG, as has been described using FIG. 28 described above. The following will describe the effect of forming the n⁻-type semiconductor regions LDM before the offset spacers OF2 are formed.

FIG. 41 is a graph showing the relationships between the gate length of a gate electrode and threshold voltages in a write operation and an erase operation in a MONOS transistor. The ordinate axis in FIG. 41 shows the threshold voltage in the write or erase operation, while the abscissa axis in FIG. 41 shows the gate length of the gate electrode CG. FIG. 41 also shows the case where the n⁻-type semiconductor regions LDM are formed after the offset spacers OF2 are formed over the both side surfaces SSM of the gate electrode CG as Example 1, while showing the case where the n⁻-type semiconductor regions LDM are formed before the offset spacers OF2 are formed over the both side surfaces SSM of the gate electrode CG as Example 2. Note that, in FIG. 41, each of an ordinate and an abscissa is shown in an arbitrary unit.

As shown in FIG. 41, in the case where the n⁻-type semiconductor regions LDM are formed after the offset spacers OF2 are formed (Example 1), the threshold voltage Vth1 during the write operation decreases as the gate length decreases. On the other hand, the threshold voltage Vth2 during the erase operation slightly decreases as the gate length decreases, but the decrement of the threshold voltage Vth2 with the decrease of the gate length during the erase operation is smaller than the decrement of the threshold voltage Vth1 with the decrease of the gate length during the write operation. Accordingly, the voltage difference between the threshold voltage Vth1 during the write operation and the threshold voltage Vth2 during the erase operation gradually decreases as the gate length decreases so that a short-channel effect is observed.

By contrast, as shown in FIG. 41, in the case where the n⁻-type semiconductor regions LDM are formed before the offset spacers OF2 are formed (Example 2), the threshold voltage Vth1 during the write operation is higher than in Example 1 and scarcely decreases as the gate length decreases. On the other hand, the threshold voltage Vth2 during the erase operation is lower than in Example 1 and scarcely decreases as the gate length decreases. Accordingly, the voltage difference between the threshold voltage Vth1 during the write operation and the threshold voltage Vth2 during the erase operation is larger than in Example 1 and scarcely decreases as the gate length decreases so that a short-channel effect is not observed.

In Example 2, the n⁻-type semiconductor regions LDM are formed before the offset spacers OF2 are formed. As a result, as shown in FIG. 3, the amount of offset OD1 of each of the n⁻-type semiconductor regions LDM from the gate electrode CG is 0 or smaller than the amount of offset OD2 of each of the n⁻-type semiconductor regions LDL from the gate electrode GEL.

Thus, Example 2 allows a reduction in the amount of offset OD1 of each of the n⁻-type semiconductor regions LDM from the gate electrode CG. As a result, in Example 2, even when the n⁻-type semiconductor region is expanded as a result of impurity diffusion during activation anneal, the length of the portion of the n⁻-type semiconductor region LDM overlapping the gate electrode CG in plan view in the gate length direction of the gate electrode CG increases so that an electric field due to the gate electrode CG is more likely to reach the channel region. Accordingly, it can be considered that, in Example 2, even when the gate length decreases in the MONOS transistor MC, the voltage difference between the threshold voltage Vth1 during the write operation and the threshold voltage Vth2 during the erase operation is less likely to decrease.

<Characteristic Features and Effects of Embodiment 1>

In the method of manufacturing the semiconductor device in Embodiment 1, over the insulating film IFG formed in the memory formation region MR and having the internal charge storage portion and over the insulating film IF7 formed in, e.g., the lower-breakdown-voltage MISFET formation region LR of the main circuit formation region AR, the conductive film CF1 is formed. Then, in the memory formation region MR, the conductive film CF1 and the insulating film IFG are patterned to form the gate electrode CG and the gate insulating film GIM while, in the lower-breakdown-voltage MISFET formation region LR, the conductive film CF1 and the insulating film IF7 are left. Then, in the lower-breakdown-voltage MISFET formation region LR, the conductive film CF1 and the insulating film IF7 are patterned to form the gate electrode GEL and the gate insulating film GIL.

As a result, in, e.g., the area of the lower-breakdown-voltage MISFET formation region LR other than area thereof where the gate electrode GEL is to be formed, it is possible to prevent the surface layer of the upper surface PS of the semiconductor substrate SB from being damaged or removed. In addition, in the lower-breakdown-voltage MISFET formation region LR, it is possible to prevent or inhibit an electric property such as, e.g., mobility and the reliability of such an electric property from deteriorating in the n⁻-type semiconductor regions LDL formed in the upper-layer portions of the parts of the p-type well PWL which are located on both sides of the gate electrode GEL interposed therebetween in plan view. This can consequently improve the transistor properties of the lower-breakdown-voltage MISFET QL, the reliability of the lower-breakdown-voltage MISFET QL, and the performance of the semiconductor device including the MONOS transistor MC and the lower-breakdown-voltage MISFET QL.

Note that, even when the thickness of the insulating film IFG is smaller than the thickness of the insulating film IF7, by patterning the conductive film CF1 and the insulating film IFG and then patterning the conductive film CF1 and the insulating film IF7, the transistor properties of the lower-breakdown-voltage MISFET QL can be improved.

Embodiment 2

In the method of manufacturing the semiconductor device in Embodiment 1, in a state where the offset spacers OF2 are not formed over the both side surfaces of the gate electrode CG, an impurity is introduced into the semiconductor substrate SB to form the n⁻-type semiconductor regions LDM. By contrast, in a method of manufacturing a semiconductor device in Embodiment 2, in a state where offset spacers OF1 each having a thickness larger than that of each of the offset spacers OF2 are formed over the both side surfaces of the gate electrode CG, an impurity is introduced into the semiconductor substrate SB to form the n⁻-type semiconductor regions LDM.

Note that, in Embodiment 2 also, the layout of a semiconductor chip and circuit blocks in a nonvolatile memory can be the same as in Embodiment 1.

<Structure of Semiconductor Device>

Figure 42:
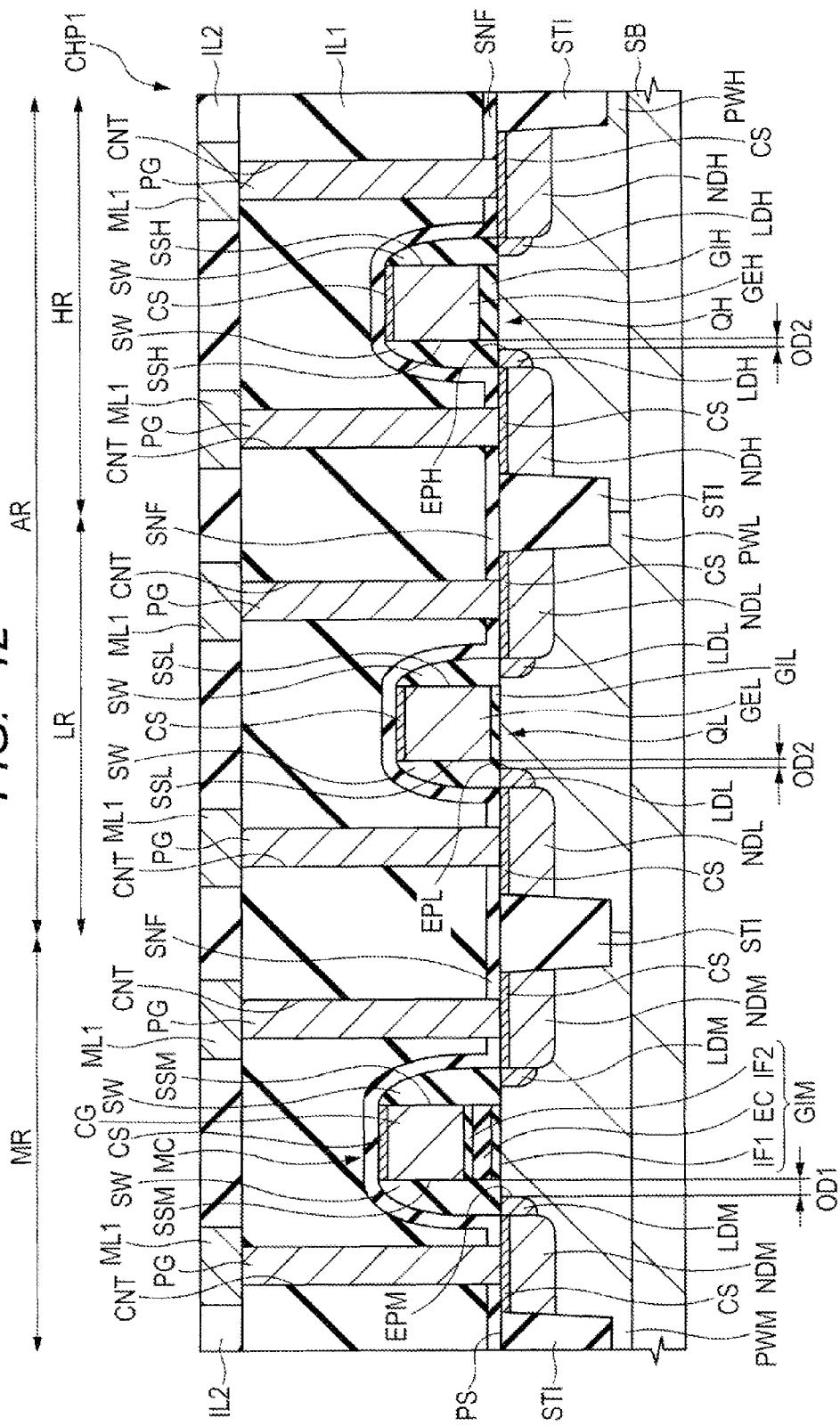
FIG. 42 is a main-portion cross-sectional view of a semiconductor device in Embodiment 2.

Next, the structure of the semiconductor chip CHP1 as the semiconductor device in Embodiment 2 will be described with reference to the drawings. FIG. 42 is a main-portion cross-sectional view of the semiconductor device in Embodiment 2.

As shown in FIG. 42, of the semiconductor chip CHP1 as the semiconductor device in Embodiment 2, the individual portions other than the amount of offset OD1 of each of the n⁻-type semiconductor regions LDM from the gate electrode CG can be the same as the individual portions of the semiconductor chip CHP1 as the semiconductor device in Embodiment 1 shown in FIG. 3 so that a description thereof is omitted.

In Embodiment 2, the amount of offset OD1 of each of the n⁻-type semiconductor regions LDM from the gate electrode CG is larger than the amount of offset OD2 of each of the n⁻-type semiconductor regions LDL from the gate electrode CGL. Also, the amount of offset OD1 of each of the n⁻-type semiconductor regions LDM from the gate electrode CG is larger than the amount of offset OD2 of each of the n⁻-type semiconductor regions LDH from the gate electrode GEH.

This can increase the amount of offset of each of the n⁻-type semiconductor regions LDM from the gate electrode CG. As a result, it is possible to prevent the n⁻-type semiconductor regions LDM from expanding as a result of impurity diffusion during activation anneal and overlapping the gate electrode CG in plan view and form the n⁻-type semiconductor regions LDM to deeper positions from the upper surface PS of the semiconductor substrate SB. This can improve the junction breakdown voltage between the drain region and the source region, between the drain region and the p-type well, or between the source region and the p-type well without changing process conditions when the lower-breakdown-voltage MISFET QL and the higher-breakdown-voltage MISFET QH are formed in the main circuit formation region AR.

<Manufacturing Process of Semiconductor Device>

Figure 43:
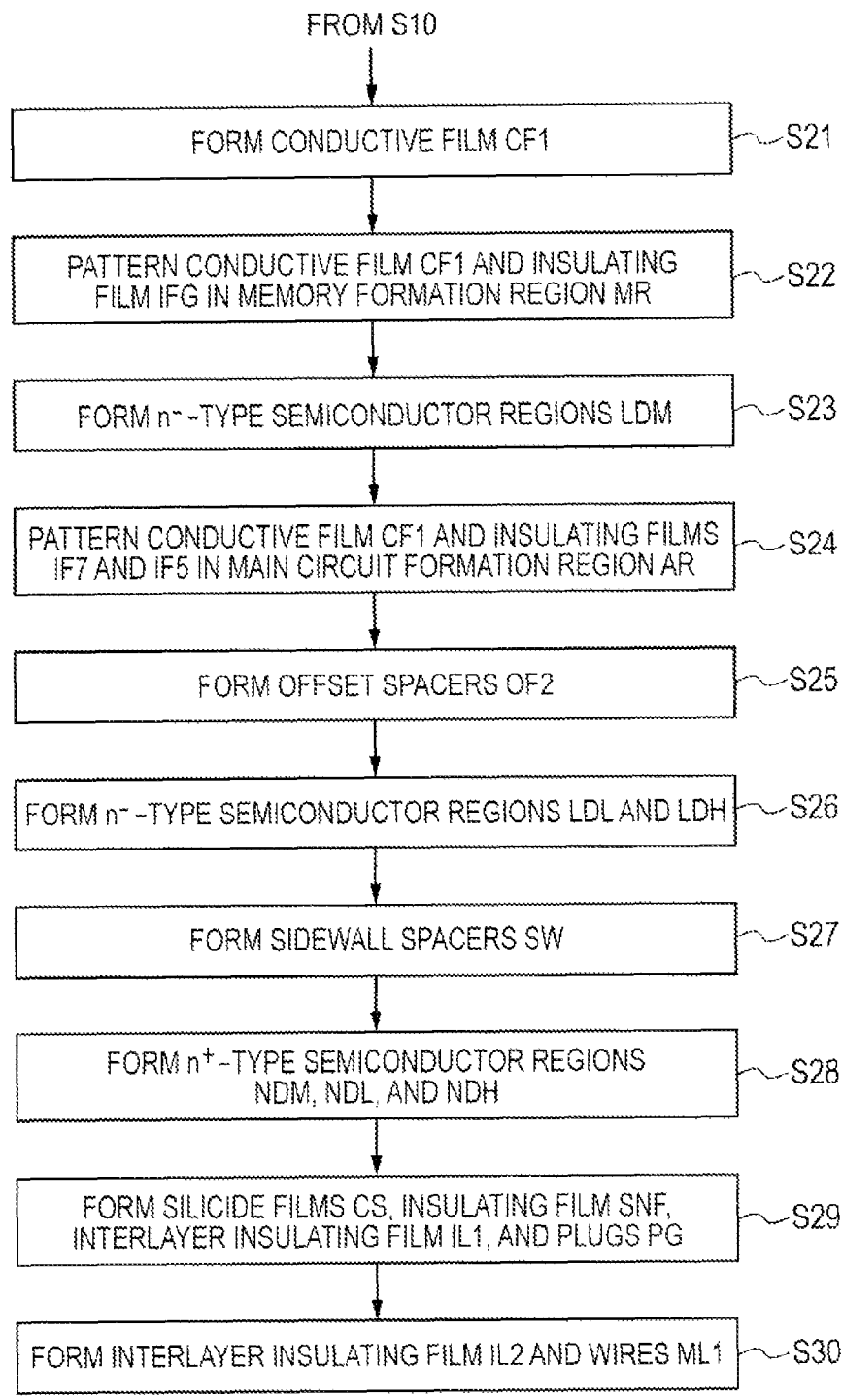
FIG. 43 is a process flow chart showing a part of the manufacturing process of the semiconductor device in Embodiment 2.

FIG. 43 is a process flow chart showing a part of the manufacturing process of the semiconductor device in Embodiment 2. FIGS. 44 to 56 are main-portion cross-sectional views of the semiconductor device in Embodiment 2 during the manufacturing process thereof. FIGS. 44 to 56 show main-portion cross-sectional views of the memory formation region MR and the main circuit formation region AR.

In a method of manufacturing the semiconductor device in Embodiment 2, in the same manner as in the method of manufacturing the semiconductor device in Embodiment 1, first, process steps corresponding to Steps S1 to S10 in FIG. 5 are performed. Then, the same process step (Step S21 in FIG. 43) as Step S11 in FIG. 6 is performed to form the conductive film CF1, as shown in FIG. 25.

Figure 44:
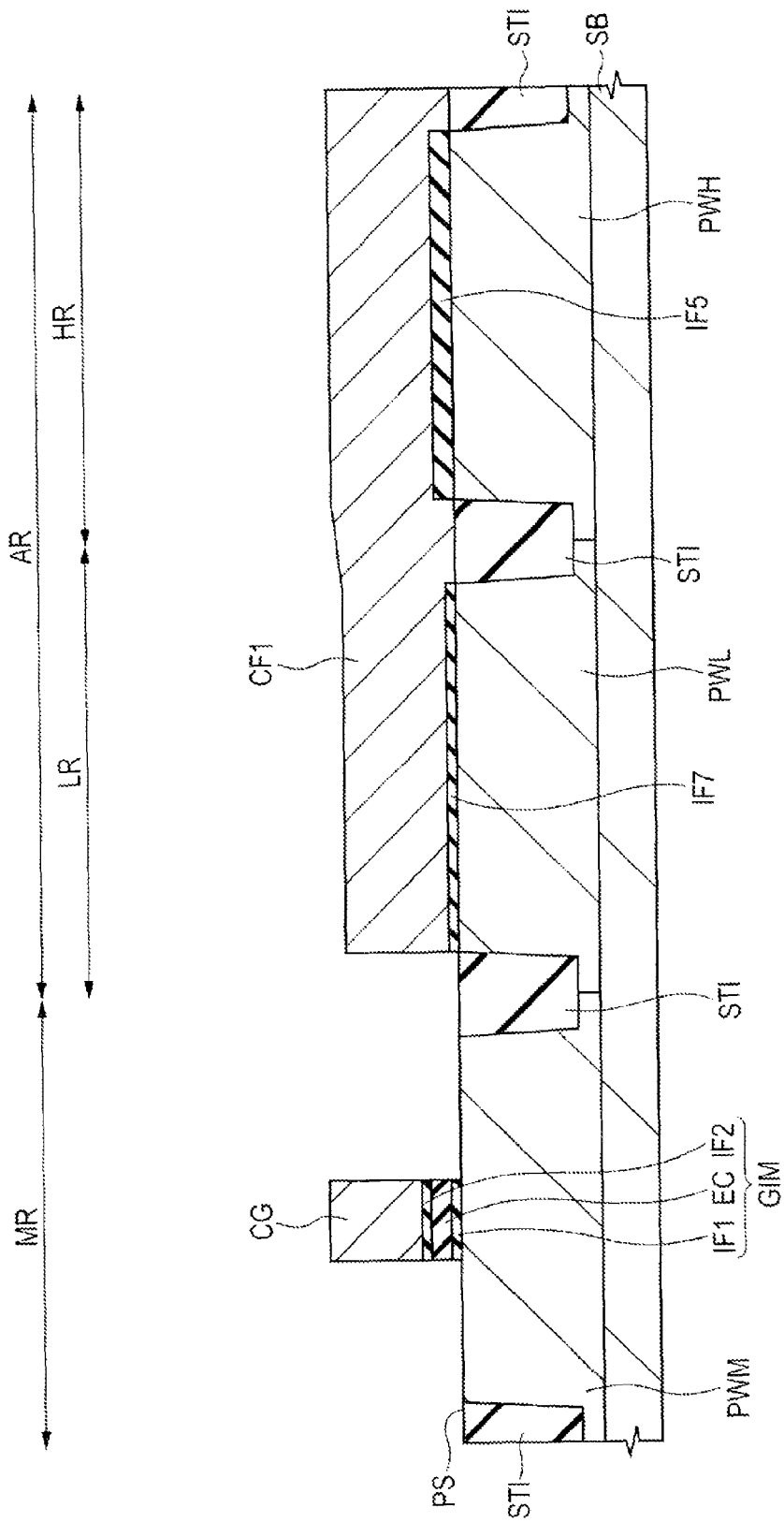
FIG. 44 is a main-portion cross-sectional view of the semiconductor device in Embodiment 2 during the manufacturing process thereof.

Next, the same process step (Step S22 in FIG. 43) as Step S12 in FIG. 6 is performed to pattern the conductive film CF1 and the insulating film IFG in the memory formation region MR and thus form the gate electrode CG and the gate insulating film GIM, as shown in FIGS. 26 and 27. However, in Embodiment 2, unlike in Embodiment 1, after the gate electrode CG and the gate insulating film GIN are formed, as shown in FIG. 44, the patterned resist film PR5 (see FIG. 27) is removed by, e.g., ashing.

Figure 45:
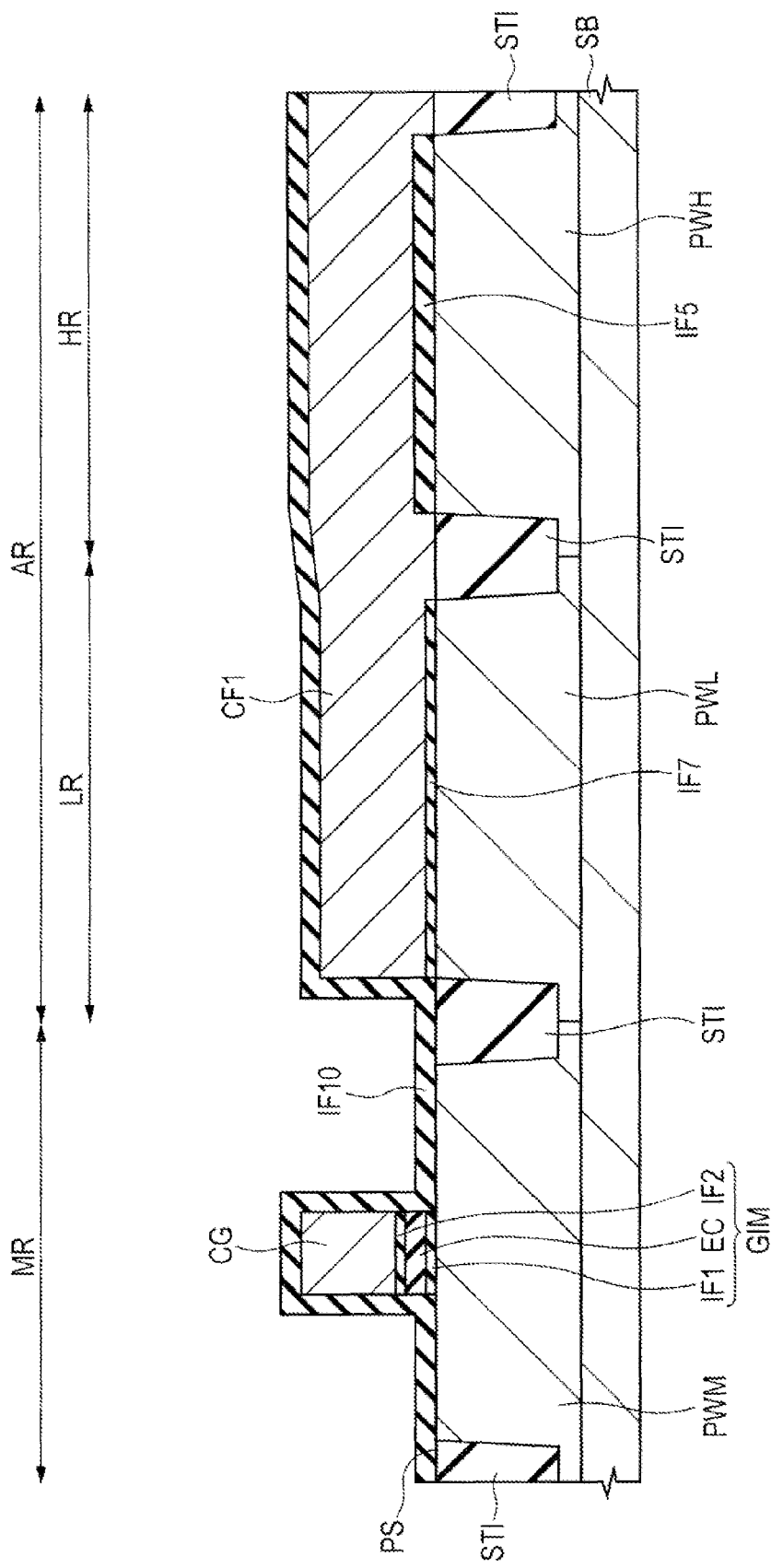
FIG. 45 is a main-portion cross-sectional view of the semiconductor device in Embodiment 2 during the manufacturing process thereof.
Figure 46:
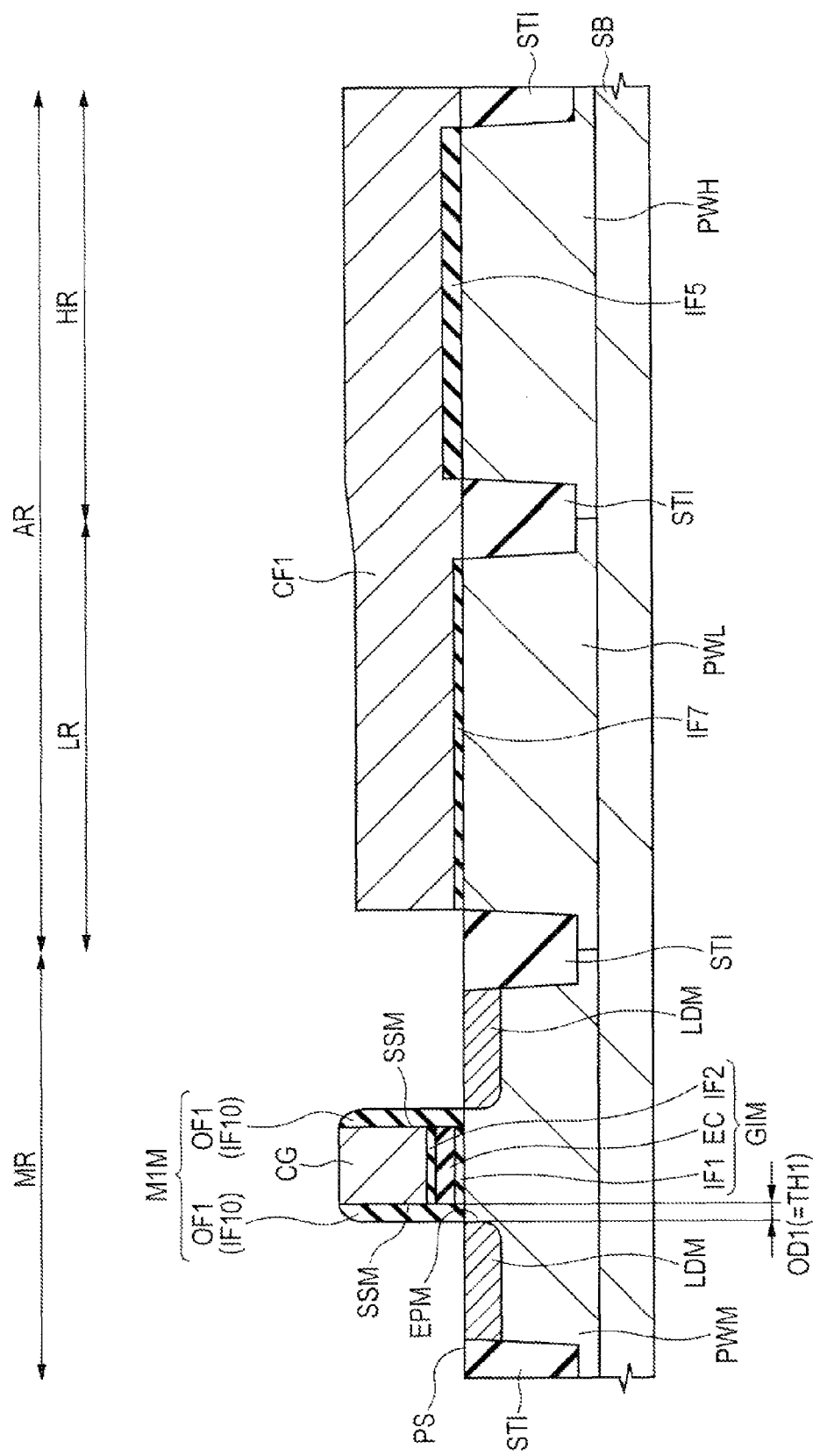
FIG. 46 is a main-portion cross-sectional view of the semiconductor device in Embodiment 2 during the manufacturing process thereof.

Next, as shown in FIGS. 45 and 46, the n⁻-type semiconductor regions LDM are formed (Step S23 in FIG. 43).

In Step S23, first, as shown in FIG. 45, an insulating film IF10 for offset spacers is formed over the entire upper surface PS of the semiconductor substrate SB by, e.g., a CVD method. The insulating film IF10 is made of, e.g., an insulating film made of, e.g., silicon dioxide, an insulating film made of silicon nitride, a laminated film thereof, or the like. Note that the insulating film IF10 can also be formed by a thermal oxidation method.

At this time, in the memory formation region MR, the insulating film IF10 is formed over the upper surface of the p-type well PWM, the side surfaces of the gate insulating film GIM, and the side and upper surfaces of the gate electrode CG. In the lower-breakdown-voltage MISFET formation region LR and the higher-breakdown-voltage MISFET formation region HR, the insulating film IF10 is formed over the upper and side surfaces of the portion of the conductive film CF1 which is left in the lower-breakdown-voltage MISFET formation region LR and the higher-breakdown-voltage MISFET formation region HR.

In Step S23, next, as shown in FIG. 46, the insulating film IF10 is etched back by, e.g., anisotropic etching. Thus, in the memory formation region MR, the insulating film is selectively left over the both side surfaces SSM of the gate electrode CG to form the offset spacers OF1 as side-wall portions each made of the insulating film IF10. Thus, a mask body M1M including the gate electrode CG and the two offset spacers OF1 is formed.

In Step S23, offset spacers are formed also over the side surfaces of the portion of the conductive film CF1 which is left in the lower-breakdown-voltage MISFET formation region LR and the higher-breakdown-voltage MISFET formation region HR. However, the offset spacers formed over the side surfaces of the conductive film CF1 are subsequently removed.

As shown in FIG. 46, the thickness of each of the offset spacers OF1 is assumed to be a thickness TH1. The thickness TH1 is equal to the thickness of the insulating film IF10. In the memory formation region MR, the thickness TH1 is the thickness of the offset spacer OF1 in the gate length direction of the gate electrode CG, i.e., in a direction perpendicular to the side surfaces SSM of the gate electrode CG. The thickness TH1 of the offset spacer OF1 is larger than the thickness TH2 (see FIG. 51) of each of the offset spacers OF2.

In Step S23, next, as shown in FIG. 46, in the memory formation region MR, using the mask body M1M including the gate electrode CG and the two offset spacers OF1 as a mask, an n-type impurity such as, e.g., arsenic (As) or phosphorus (P) is introduced into the semiconductor substrate SB by an ion implantation method. At this time, in the memory formation region MR, using the gate electrode CG and the offset spacers OF1 as a mask, n-type impurity ions are implanted into the semiconductor substrate SB.

As a result, in the memory formation region MR, in the upper-layer portions of the parts of the p-type well PWM which are located on both sides of the mask body M1M interposed therebetween in plan view and including the gate electrode CG and the two offset spacers OF1, the n⁻-type semiconductor regions LDM are formed. In the memory formation region MR, the n⁻-type semiconductor regions LDM are formed by self-alignment with the both side surfaces of the mask body M1M. That is, in the upper-layer portions of the parts of the p-type well PWM which are adjacent to the gate electrode CG via the offset spacers OF1 in plan view, the n⁻-type semiconductor regions LDM are formed.

As shown in FIG. 46, the amount of offset OD1 of each of the n⁻-type semiconductor regions LDM from the gate electrode CG is equal to the thickness TH1 of each of the offset spacers OF1.

Figure 47:
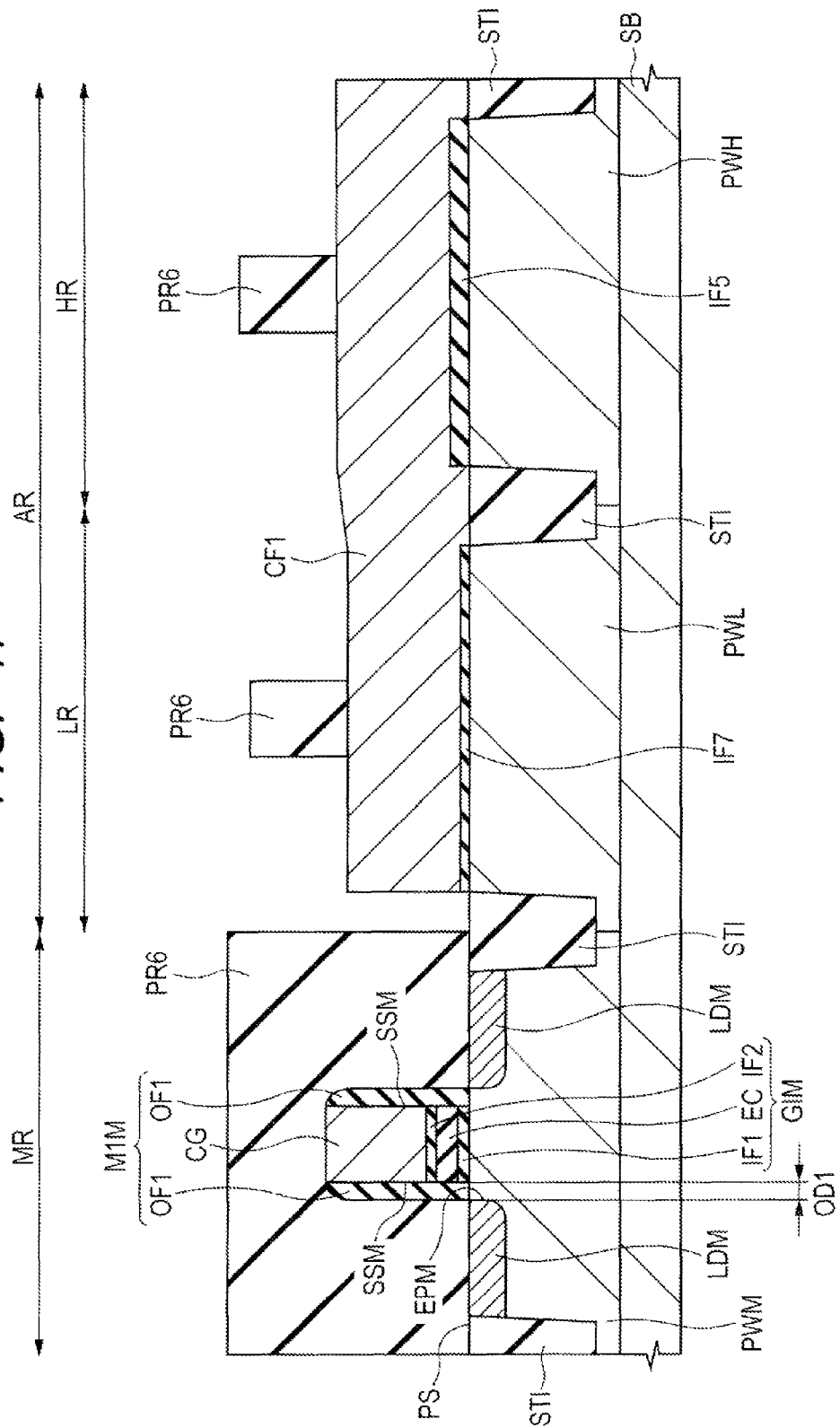
FIG. 47 is a main-portion cross-sectional view of the semiconductor device in Embodiment 2 during the manufacturing process thereof.
Figure 48:
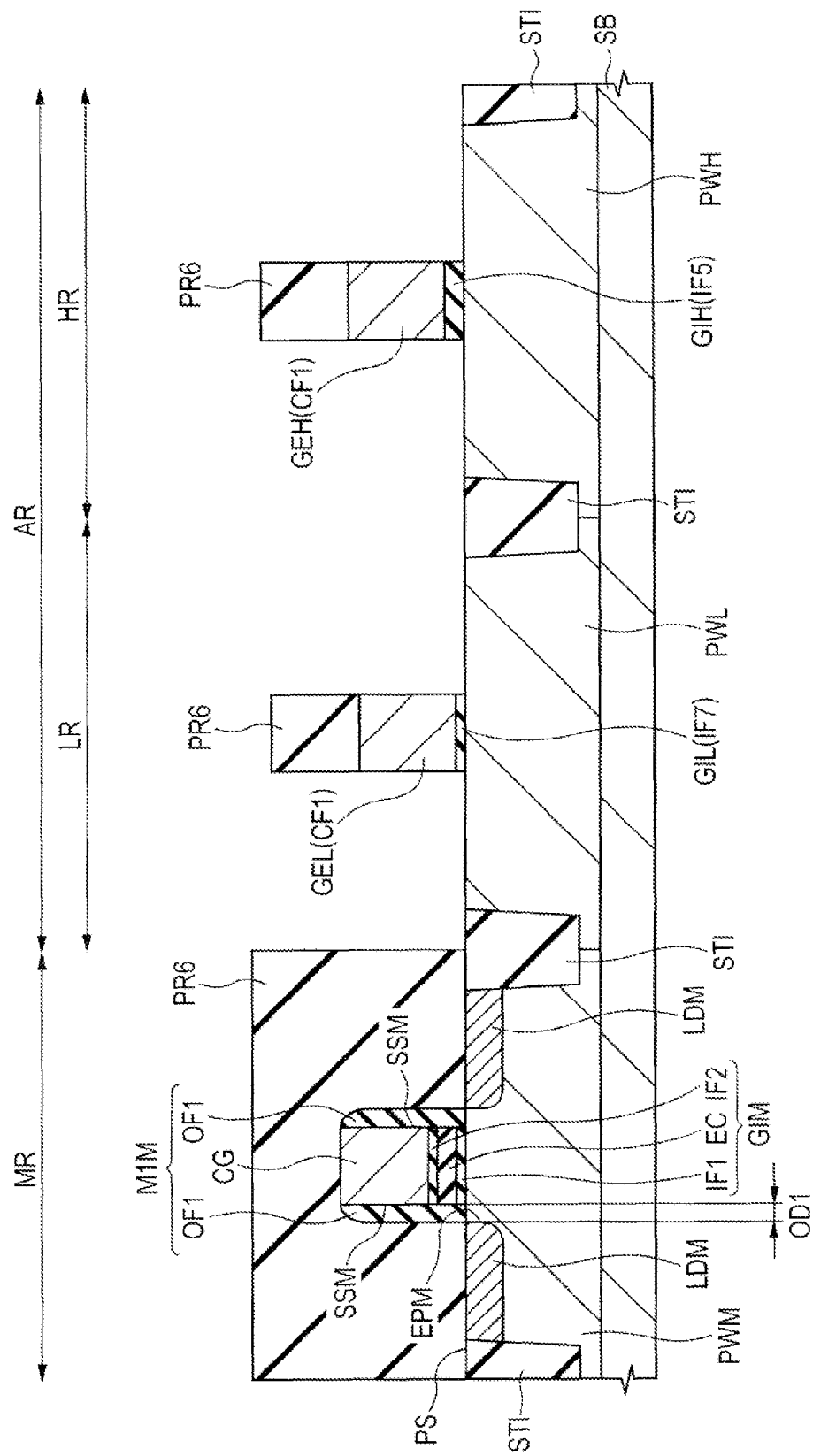
FIG. 48 is a main-portion cross-sectional view of the semiconductor device in Embodiment 2 during the manufacturing process thereof.
Figure 49:
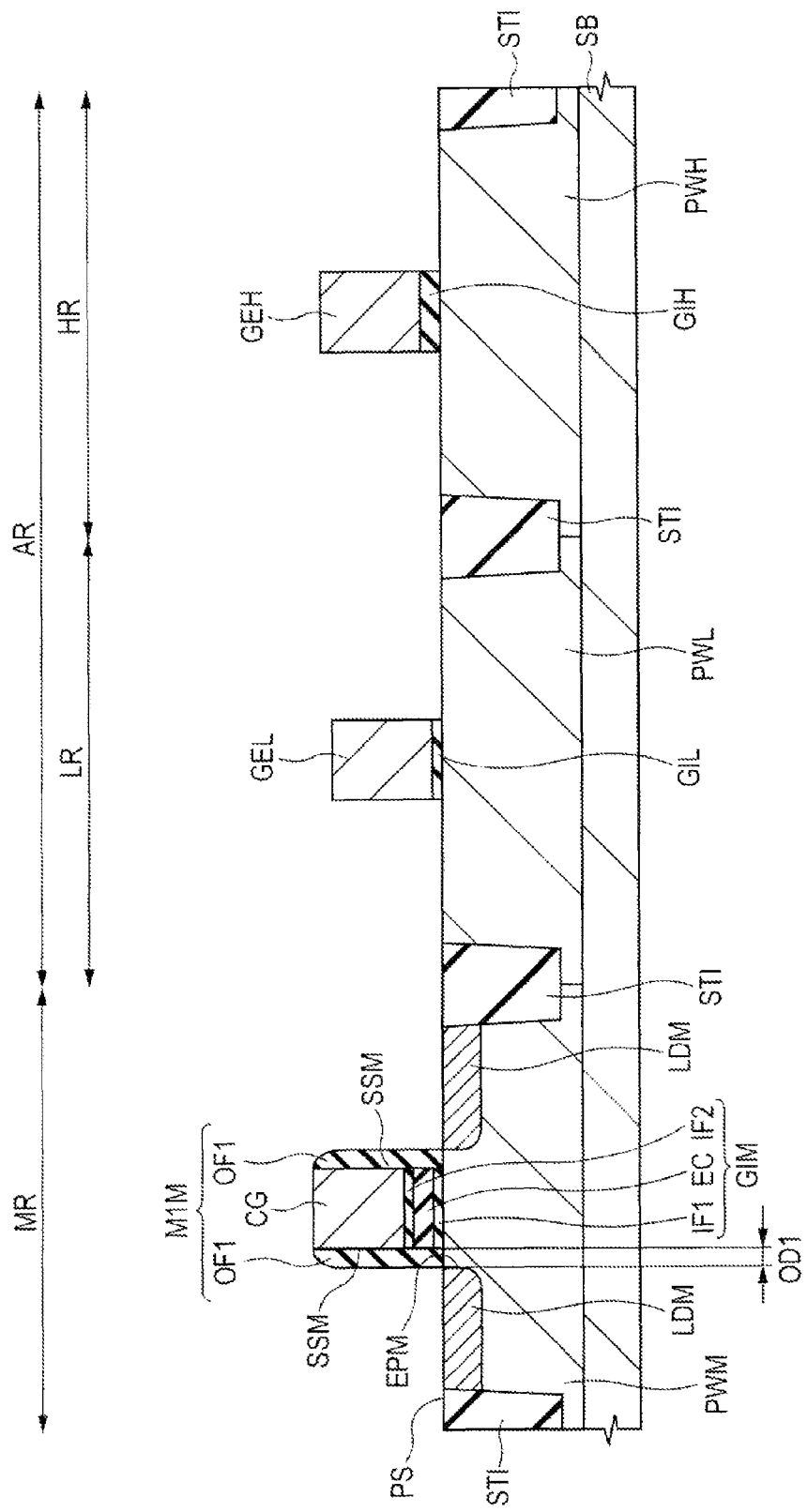
FIG. 49 is a main-portion cross-sectional view of the semiconductor device in Embodiment 2 during the manufacturing process thereof.

Next, the same process step (Step 324 in FIG. 43) as Step S14 in FIG. 6 is performed to pattern the conductive film CF1 and the insulating films IF7 and IF5 in the main circuit formation region AR, as shown in FIGS. 47 to 49.

In Step S24, first, the same process step as the process step described above using FIG. 30 is performed to apply the resist film PR6 to the upper surface PS of the semiconductor substrate SB, as shown in FIG. 47. Then, using a photolithographic technique, the resist film PR6 is patterned. The resist film PR6 is patterned so as to cover the portion of the conductive film CF1 which is located in the area of the lower-breakdown-voltage MISFET formation region LR where the gate electrode GEL is to be formed. The resist film PR6 is also patterned so as to cover the portion of the conductive film CF1 which is located in the area of the higher-breakdown-voltage MISFET formation region HR where the gate electrode GEH is to be formed. The resist film PR6 is also patterned so as to cover the gate electrode CG and the offset spacers OF1 in the memory formation region MR.

In Step S24, next, the same process step as the process step described above using FIG. 31 is performed. Thus, as shown in FIG. 48, using the patterned resist film PR6 as a mask, the conductive film CF1 and the insulating films IF7 and IF5 are etched by, e.g., dry etching or the like to be patterned.

As a result, in the lower-breakdown-voltage MISFET formation region LR, the gate electrode GEL made of the conductive film CF1 is formed, and the gate insulating film GIL made of the portion of the insulating film IF7 which is located between the gate electrode GEL and the p-type well PWL of the semiconductor substrate SB is formed. On the other hand, in the higher-breakdown-voltage MISFET formation region HR, the gate electrode GEH made of the conductive film CF1 is formed, and the gate insulating film GIH made of the portion of the insulating film IF5 which is located between the gate electrode GEH and the p-type well PWH of the semiconductor substrate SB is formed.

In Step S24, next, as shown in FIG. 49, the patterned resist film R6 is removed by, e.g., ashing.

Figure 50:
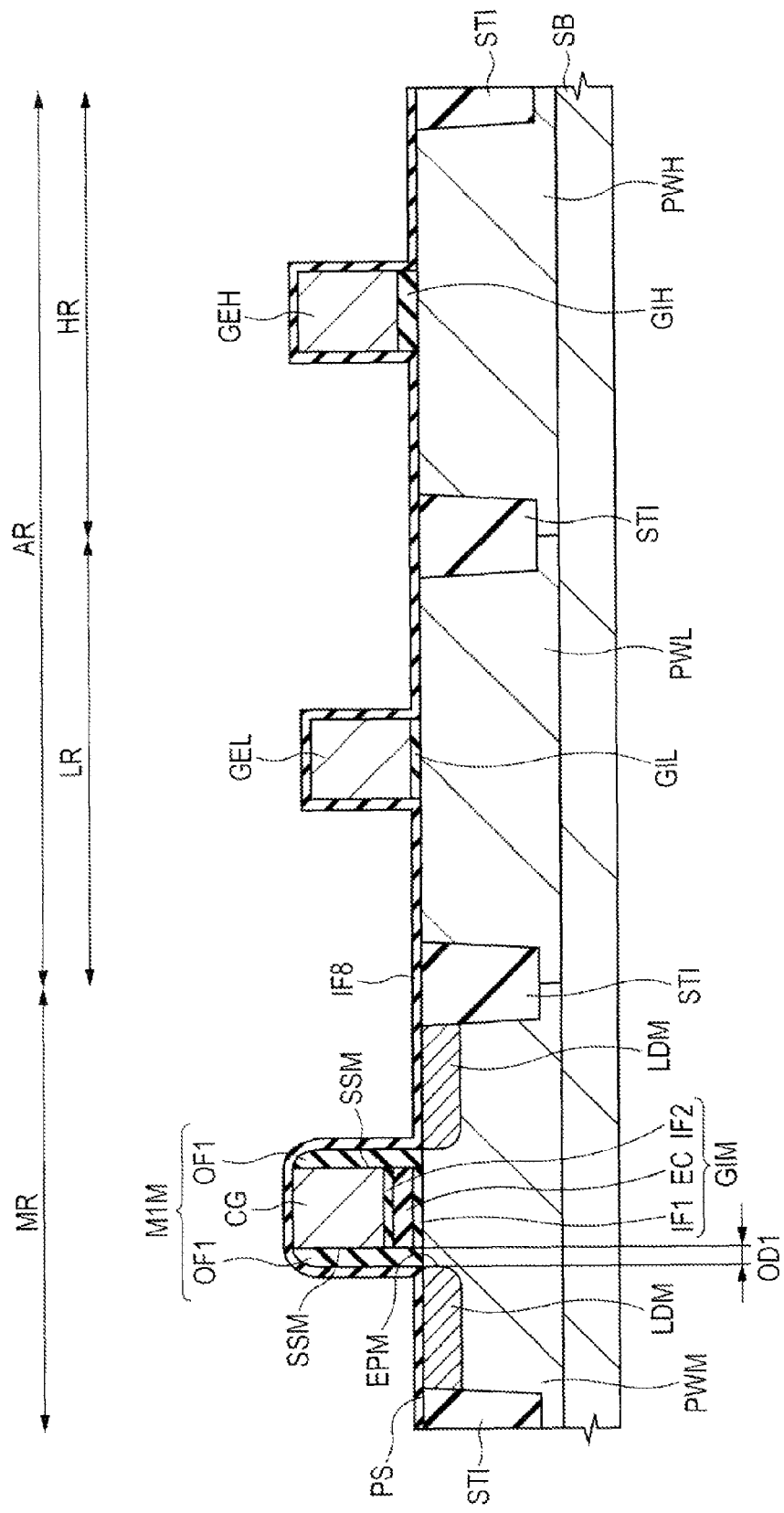
FIG. 50 is a main-portion cross-sectional view of the semiconductor device in Embodiment 2 during the manufacturing process thereof.
Figure 51:
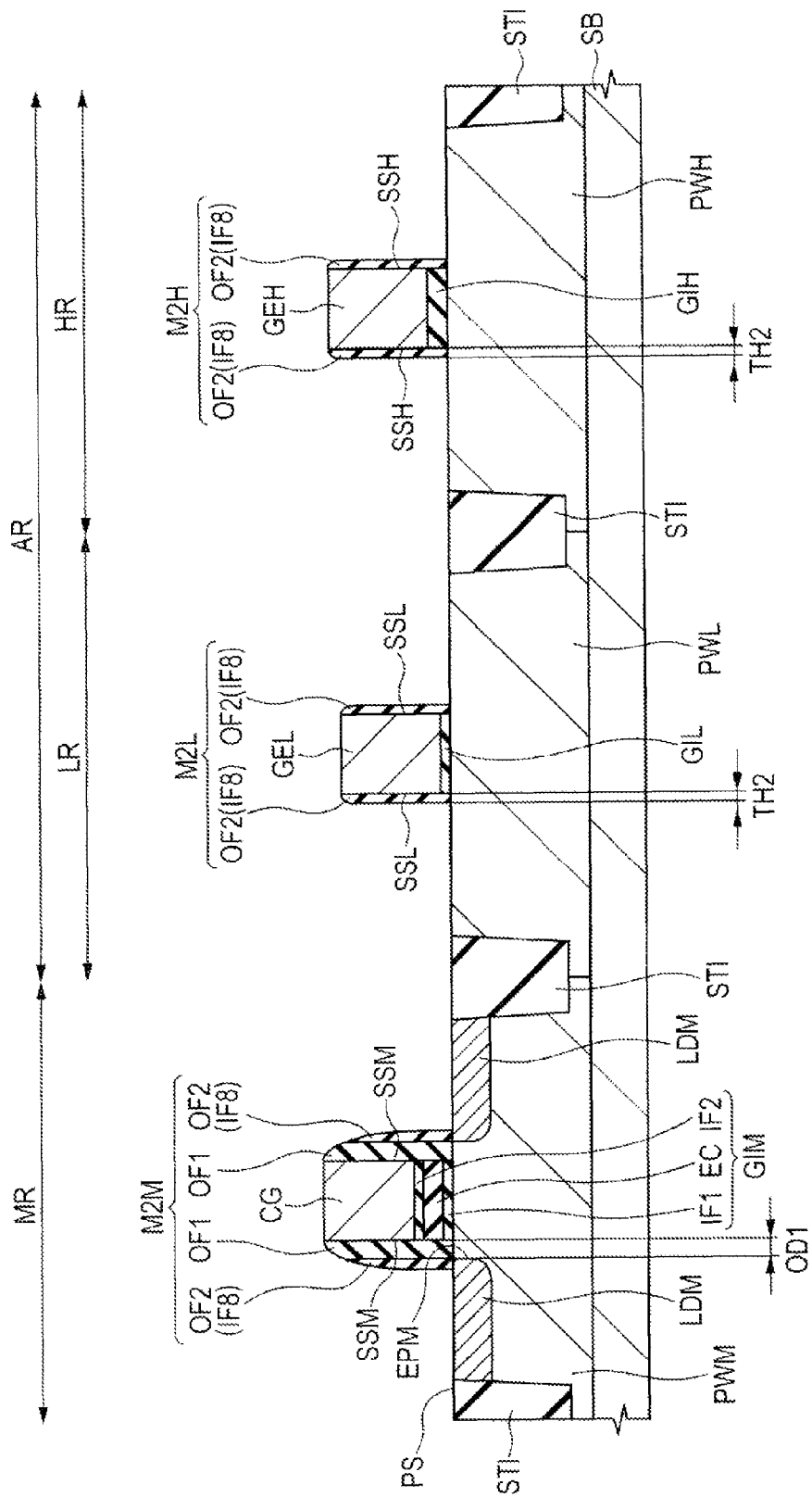
FIG. 51 is a main-portion cross-sectional view of the semiconductor device in Embodiment 2 during the manufacturing process thereof.

Next, the same process step (Step S25 in FIG. 43) as Step S15 in FIG. 6 is performed to form the offset spacers OF2, as shown in FIGS. 50 and 51.

In Step S25, first, the same process as the process step described above using FIG. 33 is performed to form the insulating film IF8 for offset spacers by, e.g., a CVD method over the entire upper surface PS of the semiconductor substrate SB, as shown in FIG. 50. The insulating film IF8 is made of, e.g., an insulating film made of silicon dioxide, an insulating film made of silicon nitride, a laminated film thereof, or the like. Note that the insulating film IF8 can also be formed by a thermal oxidation method.

At this time, in the memory formation region MR, the insulating film IF8 is formed over the upper surfaces of the $n^-$-type semiconductor regions LDM, the side surfaces of the gate insulating film GIM, and the side and upper surfaces of the gate electrode CG. Over the side surfaces of the gate insulating film GIM and the side surfaces of the gate electrode CG, the insulating film IF8 is formed via the offset spacers OF1.

In Step S25, next, the same process step as the process step described above using FIG. 34 is performed to etch back the insulating film IF8 by, e.g., anisotropic etching. Thus, in the memory formation region MR, over the respective side surfaces of the offset spacers OF1 formed over the both side surfaces SSM of the gate electrode CG, the insulating film IF8 is selectively left. Thus, over the both side surfaces SSM of the gate electrode CG, the offset spacers OF2 as side-wall portions each made of the insulating film IF8 are formed via the respective offset spacers OF1. Also, the mask body M2M including the gate electrode CG, the two offset spacers OF1, and the two offset spacers OF2 is formed. Note that the offset spacers OF2 are formed also over the respective side surfaces of the gate insulating film GIM via the offset spacers OF1.

The thickness TH2 of each of the offset spacers OF2 is equal to the thickness of the insulating film IF8. In the lower-breakdown-voltage MISFET formation region LR, the thickness TH2 is the thickness of each of the offset spacers OF2 in the gate length direction of the gate electrode GEL, i.e., in a direction perpendicular to the side surfaces SSL of the gate electrode GEL. In the higher-breakdown-voltage MISFET formation region HR, the thickness TH2 is the thickness of each of the offset spacers OF2 in the gate length direction of the gate electrode GEH, i.e., in a direction perpendicular to the side surfaces SSH of the gate electrode GEH. The thickness TH2 of the offset spacer OF2 is smaller than the thickness TH1 (see FIG. 46) of the offset spacer OF1.

Figure 52:
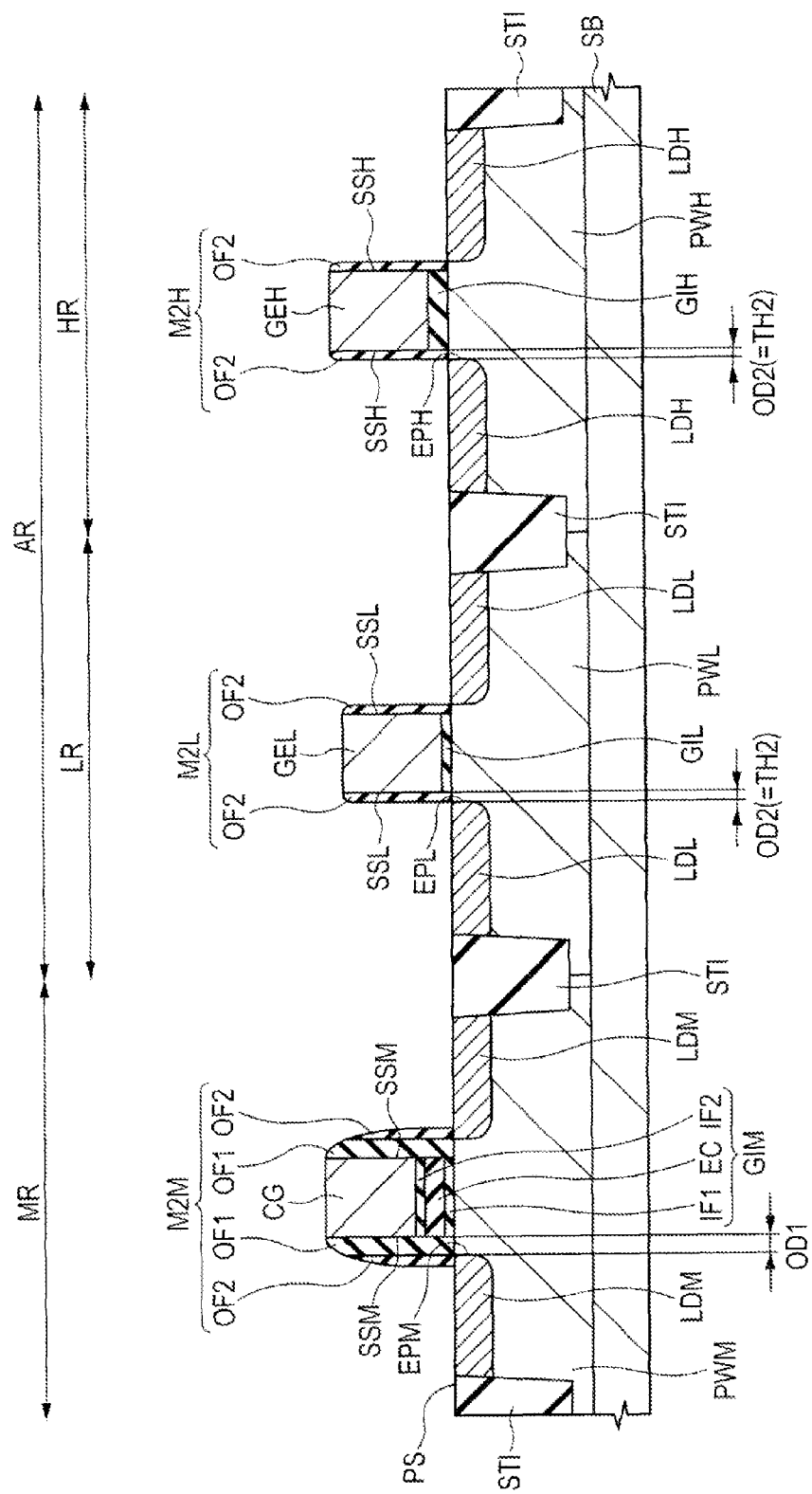
FIG. 52 is a main-portion cross-sectional view of the semiconductor device in Embodiment 2 during the manufacturing process thereof.

Next, the same process step (Step S26 in FIG. 43) as Step S16 in FIG. 6 is performed to form the $n^-$-type semiconductor regions LDL and LDH, as shown in FIG. 52 (Step S26 in FIG. 5).

Thus, in the lower-breakdown-voltage MISFET formation region LR, in the respective upper-layer portions of the parts of the p-type well PWL which are located on both sides of the mask body M2L interposed therebetween in plan view, the $n^-$-type semiconductor regions LDL are formed. Also, in the higher-breakdown-voltage MISFET formation region HR, in the respective upper-layer portions of the parts of the p-type well PWH which are located on both sides of the mask body M2H interposed therebetween in plan view, the $n^-$-type semiconductor regions LDH are formed. In the lower-breakdown-voltage MISFET formation region LR, the $n^-$-type semiconductor regions LDL are formed by self-alignment with the both side surfaces of the mask body M2L. In the higher-breakdown-voltage MISFET formation region HR, the $n^-$-type semiconductor regions LDH are formed by self-alignment with the both side surfaces of the mask body M2H.

As shown in FIG. 52, the amount of offset OD2 is equal to the thickness TH2 of each of the offset spacers OF2. Also, as stated previously, the thickness TH2 of the offset spacer OF2 is smaller than the thickness TH1 (see FIG. 46) of the offset spacer OF1. Accordingly, the amount of offset OD2 of each of the $n^-$-type semiconductor regions LDL from the gate electrode GEL, i.e., the amount of offset OD2 of each of the $n^-$-type semiconductor regions LDH from the gate electrode GEL is smaller than the amount of offset OD1 of each of the $n^-$-type semiconductor regions LDM from the gate electrode CG.

Figure 53:
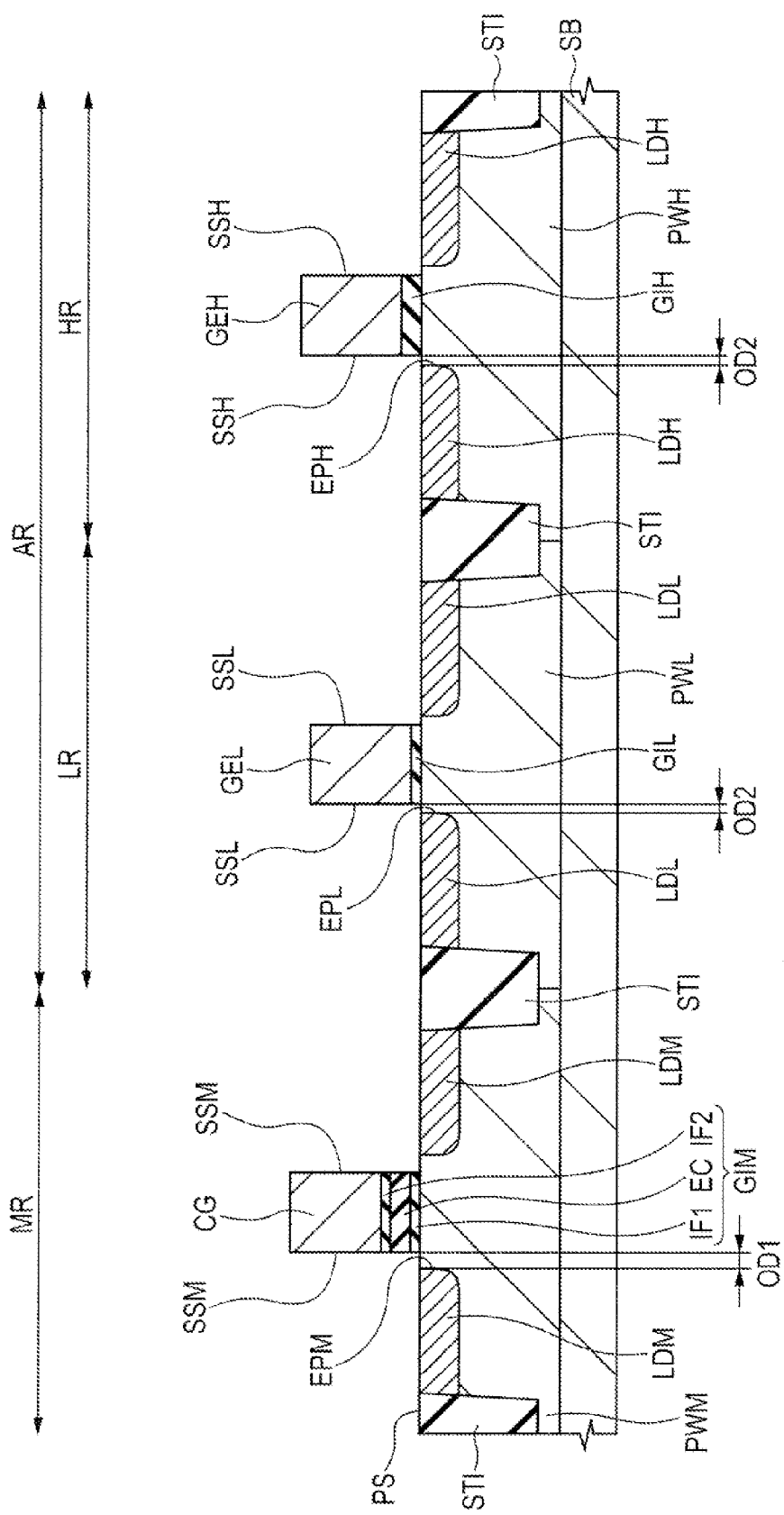
FIG. 53 is a main-portion cross-sectional view of the semiconductor device in Embodiment 2 during the manufacturing process thereof.
Figure 54:
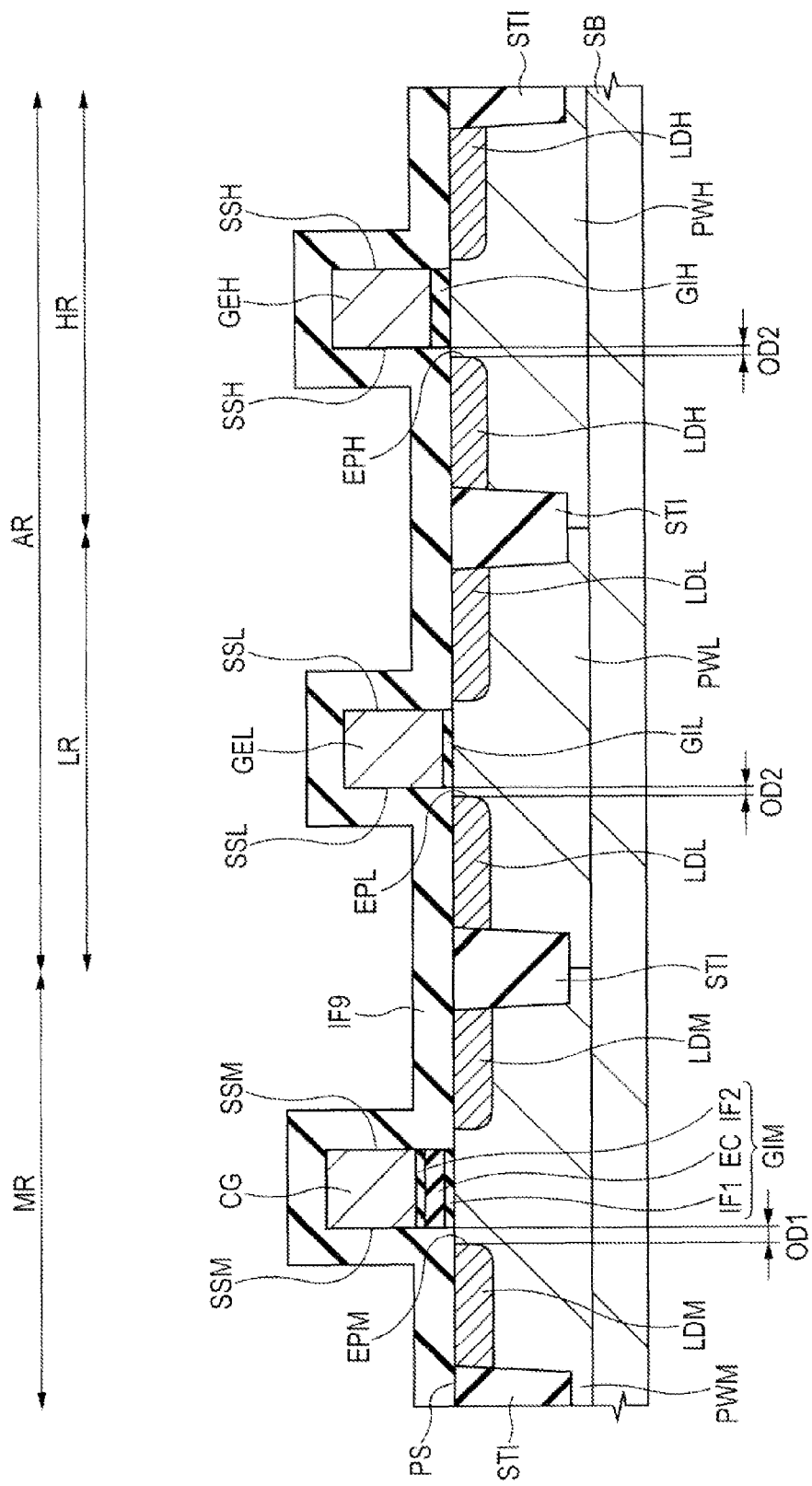
FIG. 54 is a main-portion cross-sectional view of the semiconductor device in Embodiment 2 during the manufacturing process thereof.
Figure 55:
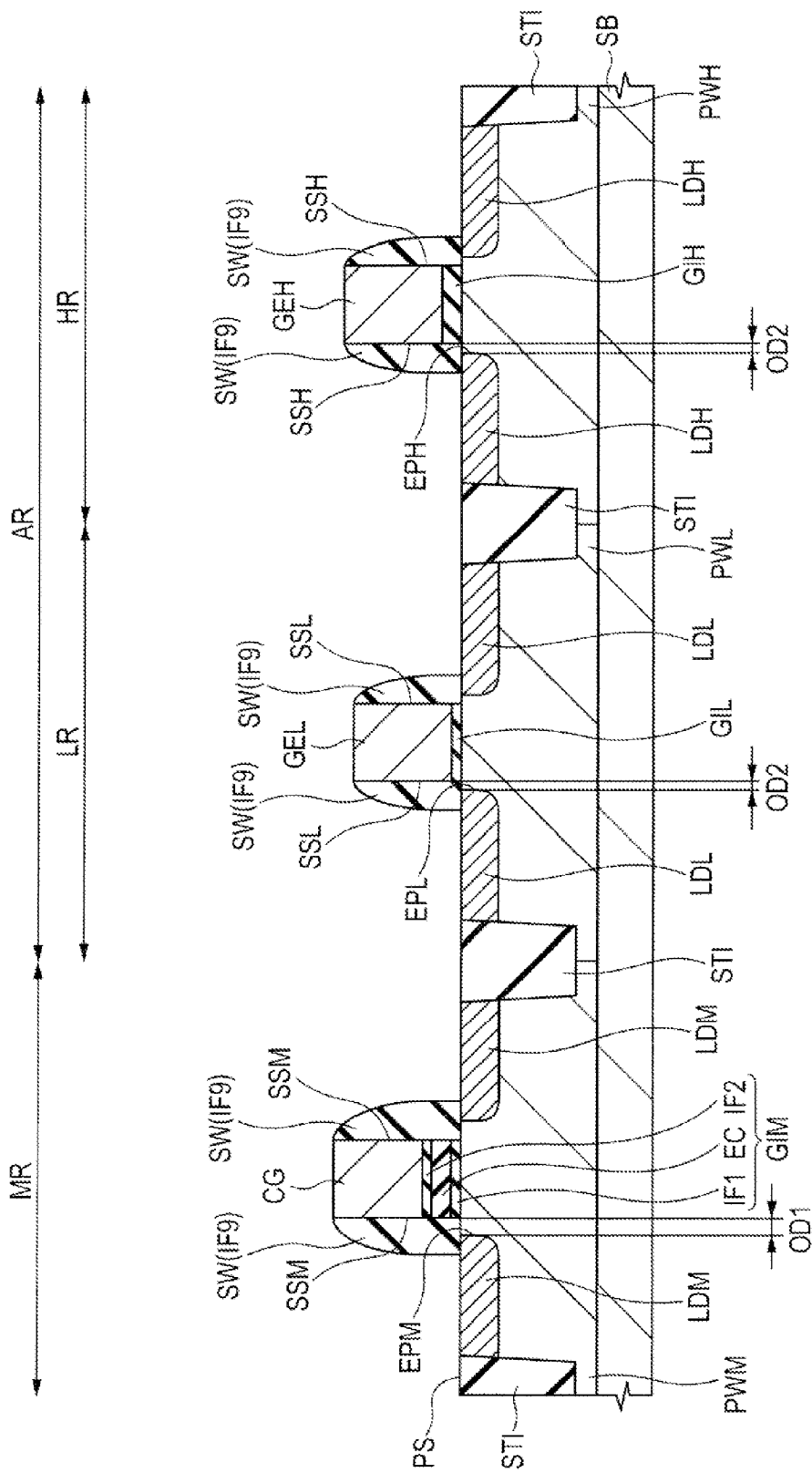
FIG. 55 is a main-portion cross-sectional view of the semiconductor device in Embodiment 2 during the manufacturing process thereof.

Next, the same process step (Step S7 in FIG. 43) as Step S17 in FIG. 6 is performed to form the sidewall spacers SW, as shown in FIGS. 53 to 55.

In Step S27, first, the same process step as the process step described above using FIG. 36 is performed. Thus, as shown in FIG. 53, from the memory formation region MR and the main circuit formation region AR, the offset spacers OF1 and OF2 are removed by wet etching using, e.g., a hydrofluoric acid (HF). Note that the offset spacers OF1 and OF2 may also be left without being removed.

In Step 327, next, the same process step as the process step described above using FIG. 37 is performed to form the insulating film IF9 for sidewall spacers over the entire upper surface PS of the semiconductor substrate SB, as shown in FIG. 54.

In Step S27, next, the same process step as the process step described above using FIG. 38 is performed. Thus, the sidewall spacers SW each made of the insulating film IF9 are formed individually over the both side surfaces SSM of the gate electrode CG. Also, in the lower-breakdown-voltage MISFET formation region LR, the sidewall spacers SW each made of the insulating film IF9 are formed individually over the both side surfaces SSL of the gate electrode GEL. Also, in the higher-breakdown-voltage MISFET formation region HR, the respective sidewall spacers SW each made of the insulating film IF9 are formed individually over the both side surfaces SSH of the gate electrode GEH.

Preferably, the thickness of the insulating film IF9 is larger than the thickness TH1 (see FIG. 46) of the offset spacer OF1. Accordingly, the thickness of each of the sidewall spacers SW formed over the respective side surfaces of the gate electrodes CG, GEL, and GEH in the gate length direction is larger than the thickness TH1 of the offset spacer OF1.

Figure 56:
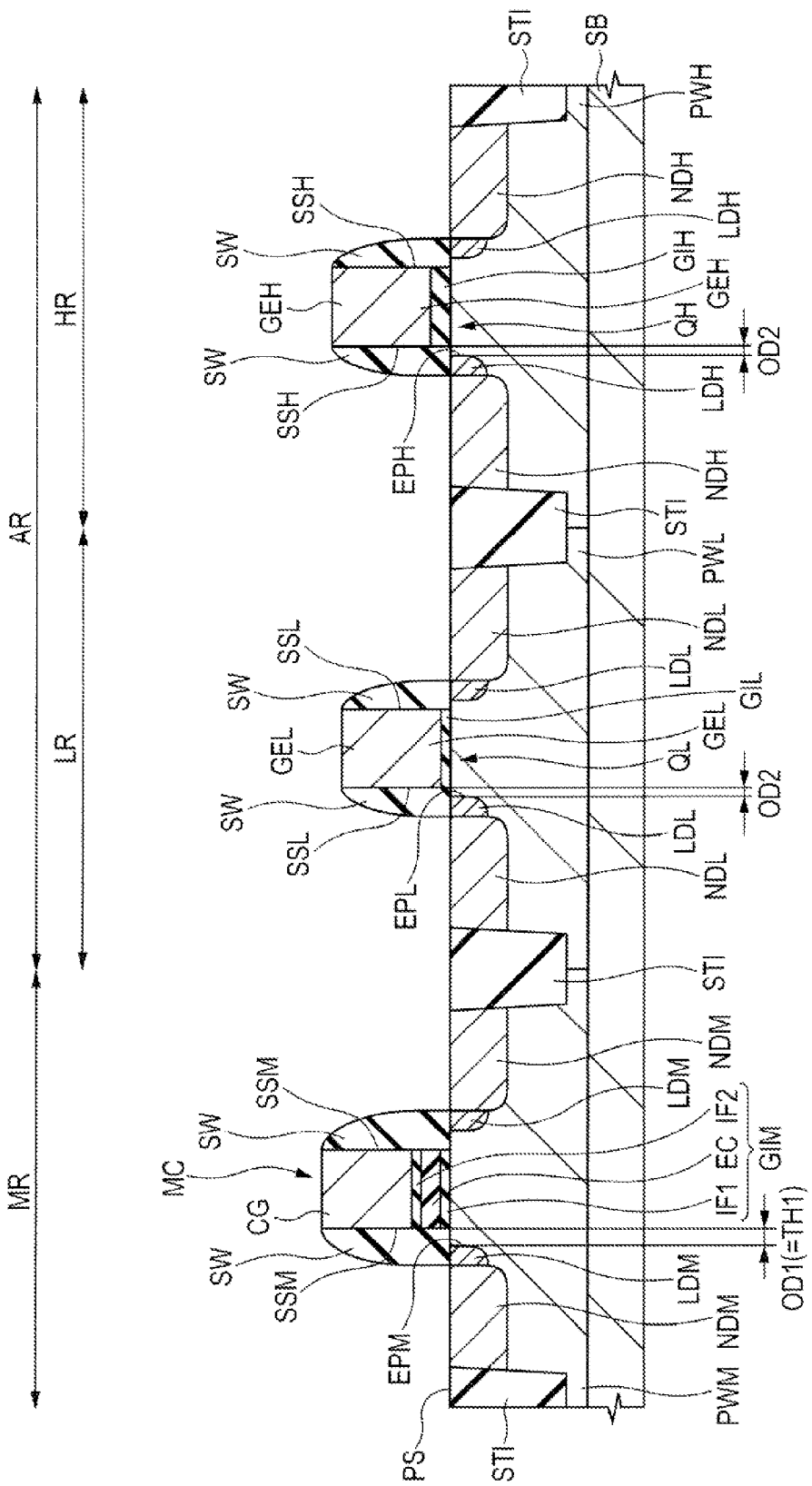
FIG. 56 is a main-portion cross-sectional view of the semiconductor device in Embodiment 2 during the manufacturing process thereof.

Next, the same process step (Step S28 in FIG. 43) as Step S18 in FIG. 6 is performed to form the $n^+$-type semiconductor regions NDM, NDL, and NDH, as shown in FIG. 56. At this time, in the memory formation region MR, in the upper-layer portions of the parts of the p-type well PWM which are located opposite to the gate electrode CG relative to the sidewall spacers SW interposed therebetween in plan view, the n$^+$-type semiconductor regions NDM are formed. Also, in the lower-breakdown-voltage MISFET formation region LR, in the upper-layer portions of the parts of the p-type well PWL which are located opposite to the gate electrode GEL relative to the sidewall spacers SW interposed therebetween in plan view, the n$^+$-type semiconductor regions NDL are formed. Also, in the higher-breakdown-voltage MISFET formation region HR, in the upper-layer portions of the parts of the p-type well PWH which are located opposite to the gate electrode GEH relative to the sidewall spacers SW interposed therebetween in plan view, the n$^+$-type semiconductor regions NDH are formed.

Thus, as shown in FIG. 56, in the memory formation region MR, the MONOS transistor MC is formed. In the lower-breakdown-voltage MISFET formation region LR, the lower-breakdown-voltage MISFET QL is formed. In the higher-breakdown-voltage MISFET formation region HR, the higher-breakdown-voltage MISFET QH is formed.

In Embodiment 2, as has been described using FIG. 46, in the memory formation region MR, the n$^-$-type semiconductor regions LDM are formed by ion-implanting impurity ions using the mask body M1M including the gate electrode CG and the two offset spacers OF1 as a mask.

Also, in Embodiment 2, as has been described using FIG. 52, in the lower-breakdown-voltage MISFET formation region LR, the n$^-$-type semiconductor regions LDL are formed by ion-implanting impurity ions using the mask body M2L including the gate electrode GEL and the two offset spacers OF2 as a mask. Also, in the higher-breakdown-voltage MISFET formation region HR, the n$^-$-type semiconductor regions LDH are formed by ion-implanting impurity ions using the mask body M2H including the gate electrode GEH and the two offset spacers OF2 as a mask.

The thickness TH1 (see FIG. 46) of the offset spacer OF1 is larger than the thickness TH2 (see FIG. 51) of the offset spacer OF2. Accordingly, the amount of offset OD1 of each of the n$^-$-type semiconductor regions LDM from the gate electrode CG is larger than the amount of offset OD2 of each of the n$^-$-type semiconductor regions LDL from the gate electrode GEL, i.e., the amount of offset OD2 of each of the n$^-$-type semiconductor regions LDH from the gate electrode GEH.

Then, by performing the same process steps (Steps S29 and S30 in FIG. 43) as Steps S19 and S20 in FIG. 6, the semiconductor device in Embodiment 2 can be formed, as shown in FIG. 42.

<About Offset Spacers in Memory Formation Region>

As stated previously using FIG. 41 in Embodiment 1, when the amount of offset OD1 of each of the n$^-$-type semiconductor regions LDM from the gate electrode CG is reduced, the voltage difference between the threshold voltage Vth1 during a write operation and the threshold voltage Vth2 during an erase operation scarcely decreases as the gate length decreases so that a short-channel effect is not observed.

On the other hand, there is a case where, in order to increase the speed of a write operation or an erase operation to a memory cell, it is unavoidable to set a write voltage or an erase voltage high. In such a case, in the MONOS transistor MC, the need arises to improve the junction breakdown voltage between the drain region and the source region, between the drain region and the p-type well, or between the source region and the p-type well. In such a case, when it is difficult to change process conditions such as, e.g., temperature during the formation of the lower-breakdown-voltage MISFET QL and the higher-breakdown-voltage MISFET QH in the main circuit formation region AR, it is necessary to increase the amount of offset OD1 of each of the n$^-$-type semiconductor regions LDM from the gate electrode CG.

In Embodiment 2, the thickness TH1 of each of the offset spacers OF1 for forming the n$^-$-type semiconductor regions LDM in the memory formation region MR is larger than the thickness TH2 of each of the offset spacers OF2 for forming the n$^-$-type semiconductor regions LDL and LDH in the main circuit formation region AR. Accordingly, the amount of offset OD1 of each of the n$^-$-type semiconductor regions LDM from the gate electrode CG is larger than the amount of offset OD2 of each of the n$^-$-type semiconductor regions LDL from the gate electrode GEL, i.e., the amount of offset OD2 of each of the n$^-$-type semiconductor regions LDH from the gate electrode GEH.

This can increase the amount of offset OD1 of each of the n$^-$-type semiconductor regions LDM from the gate electrode CG. As a result, it is possible to prevent the n$^-$-type semiconductor regions LDM from expanding as a result of impurity diffusion during activation anneal and overlapping the gate electrode CG in plan view and form the n$^-$-type semiconductor regions LDM to deeper positions from the upper surface PS of the semiconductor substrate SB. This can improve the junction breakdown voltage between the drain region and the source region, between the drain region and the p-type well, or between the source region and the p-type well without changing process conditions when the lower-breakdown-voltage MISFET QL and the higher-breakdown-voltage MISFET QH are formed in the main circuit formation region AR.

<Main Characteristic Features and Effects of Embodiment 2>

In the method of manufacturing the semiconductor device in Embodiment 2, in the same manner as in the method of manufacturing the semiconductor device in Embodiment 1, the conductive film CF1 is formed over the insulating film IFG formed in the memory formation region MR and over the insulating film IF7 formed in, e.g., the lower-breakdown-voltage MISFET formation region LR of the main circuit formation region AR. Then, in the memory formation region MR, the conductive film CF1 and the insulating film IFG are patterned to form the gate electrode CG and the gate insulating film GIM while, in the lower-breakdown-voltage MISFET formation region LR, the conductive film CF1 and the insulating film IF7 are left. Then, in the lower-breakdown-voltage MISFET formation region LR, the conductive film CF1 and the insulating film IF7 are patterned to form the gate electrode GEL and the gate insulating film GIL.

As a result, in the same manner as in Embodiment 1, it is possible to prevent the surface layer of the upper surface PS of the semiconductor substrate SB from being damaged or removed in, e.g., the area of the lower-breakdown-voltage MISFET formation region LR other than the area thereof where the gate electrode GEL is to be formed. Accordingly, in the same manner as in Embodiment 1, it is possible to improve the transistor properties of the lower-breakdown-voltage MISFET QL and improve the reliability of the lower-breakdown-voltage MISFET QL.

On the other hand, in Embodiment 2, the thickness TH1 of each of the offset spacers OF1 for forming the n$^-$-type semiconductor regions LDM in the memory formation region MR is larger than the thickness TH2 of each of the offset spacers OF2 for forming the n$^-$-type semiconductor regions LDL in, e.g., the lower-breakdown-voltage MISFET formation region LR of the main circuit formation region AR. This can increase the amount of offset OD1 of each of the n$^-$-type semiconductor regions LDM from the gate electrode CG. Therefore, it is possible to improve the junction breakdown voltage between the drain region and the source region, between the drain region and the p-type well, or between the source region and the p-type well.

Embodiment 3

In the method of manufacturing the semiconductor device in Embodiment 1, in the memory formation region MR, the insulating film IFG having the internal charge storage portion is patterned by dry etching. By contrast, in Embodiment 3, the insulating film IFG having the internal charge storage portion is patterned by wet etching.

Note that the structure of a semiconductor device in Embodiment 3 is the same as the structure of the semiconductor device in Embodiment 1.

<Manufacturing Process of Semiconductor Device>

Figure 57:
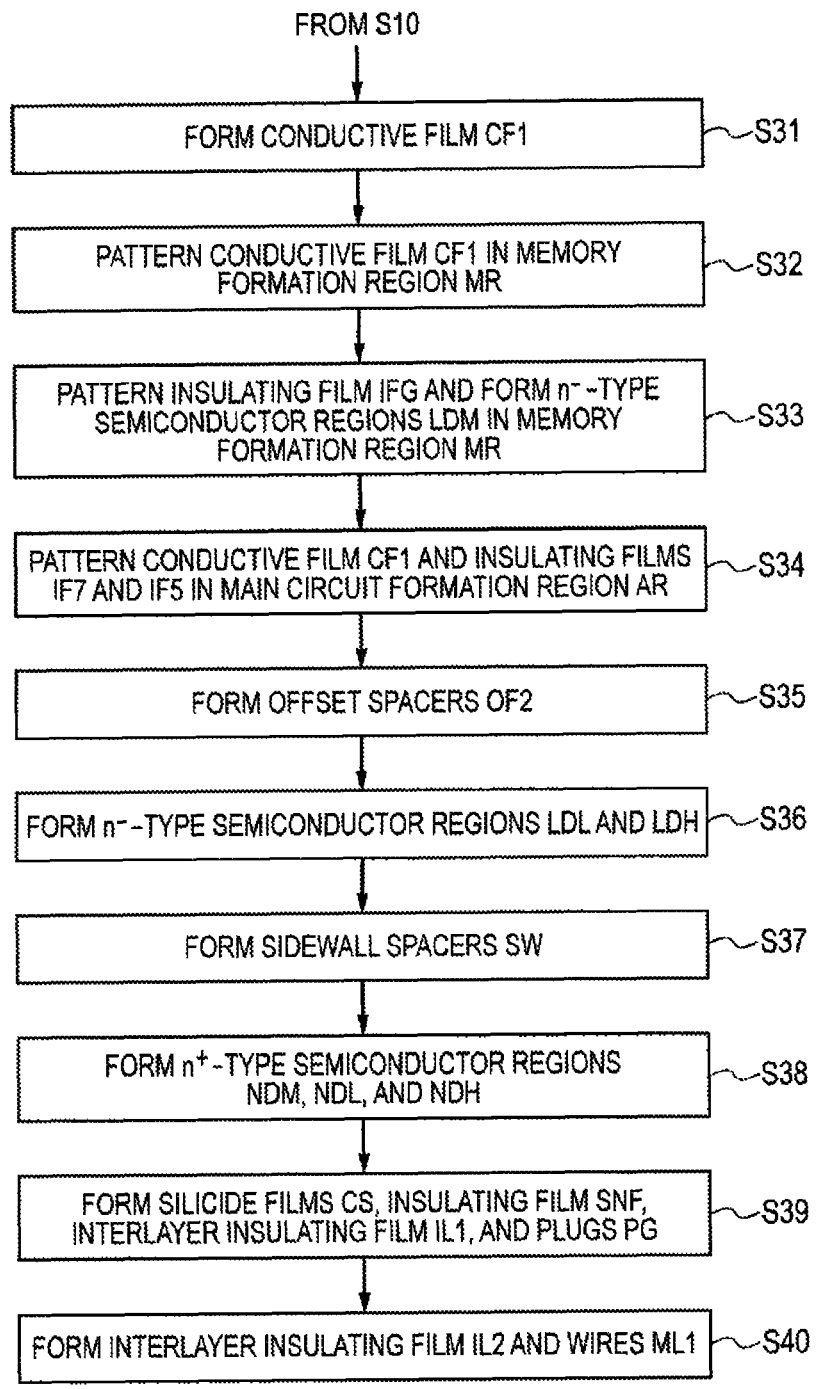
FIG. 57 is a process flow chart showing a part of the manufacturing process of a semiconductor device in Embodiment 3.

FIG. 57 is a process flow chart showing a part of the manufacturing process of the semiconductor device in Embodiment 3. FIGS. 58 to 61 are main-portion cross-sectional views of the semiconductor device in Embodiment 3 during the manufacturing process thereof. FIGS. 58 to 61 show main-portion cross-sectional views of the memory formation region MR and the main circuit formation region AR.

In a method of manufacturing the semiconductor device in Embodiment 3, in the same manner as in the method of manufacturing the semiconductor device in Embodiment 1, first, process steps corresponding to Steps S1 to S10 in FIG. 5 are performed. Then, the same process step (Step S31 in FIG. 57) as Step S11 in FIG. 6 is performed to form the conductive film CF1, as shown in FIG. 25.

Figure 58:
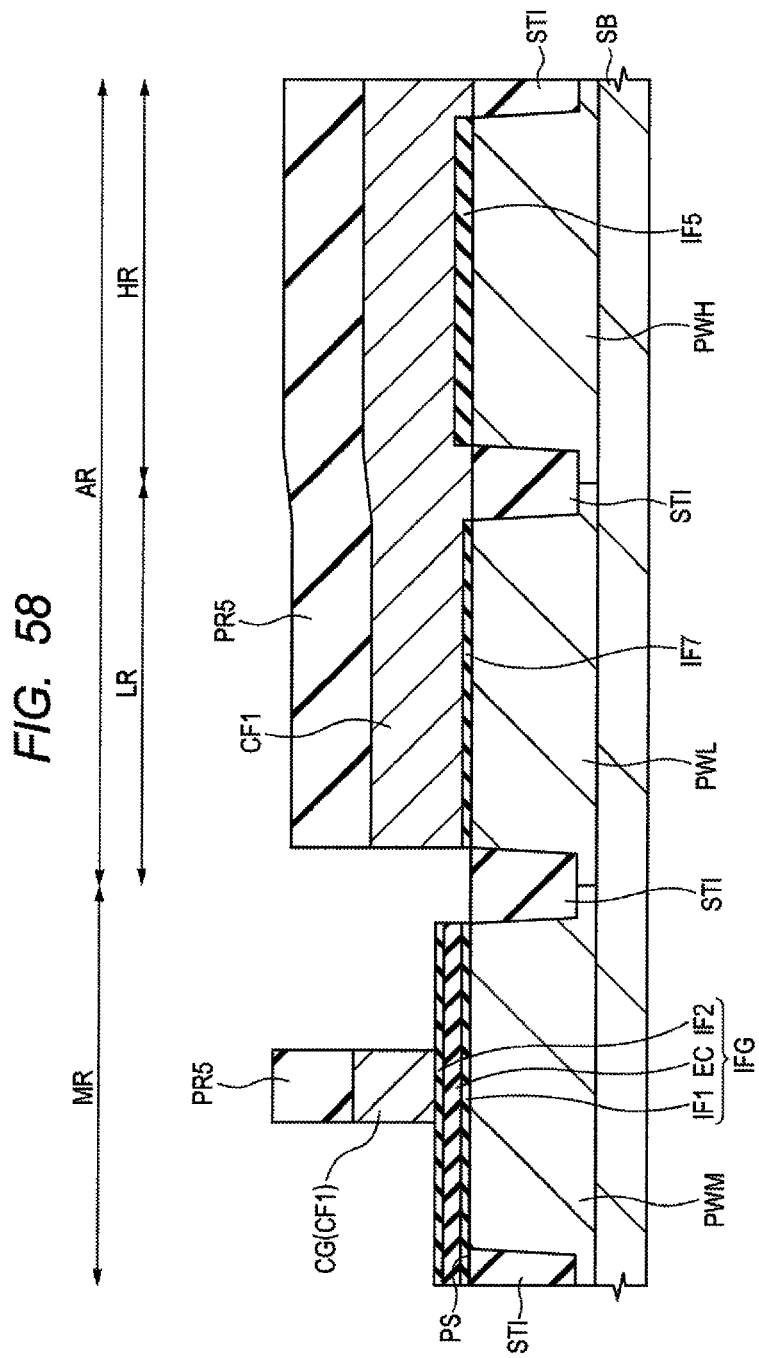
FIG. 58 is a main-portion cross-sectional view of the semiconductor device in Embodiment 3 during the manufacturing process thereof.
Figure 59:
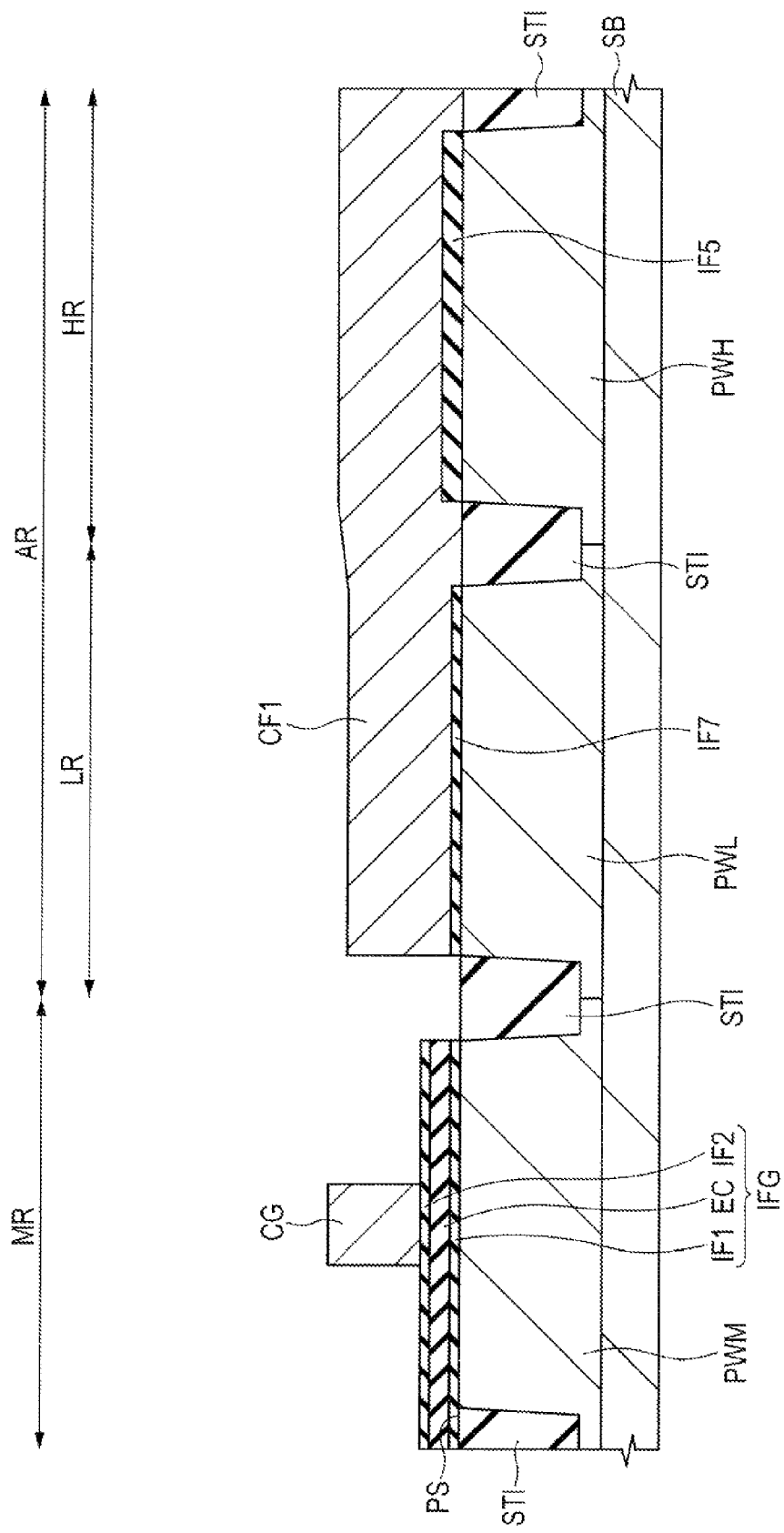
FIG. 59 is a main-portion cross-sectional view of the semiconductor device in Embodiment 3 during the manufacturing process thereof.

Next, as shown in FIGS. 58 and 59, in the memory formation region MR, the conductive film CF1 is patterned (Step S32 in FIG. 57).

In Step S32, first, the same process step as the process step described above using FIG. 26 is performed. Thus, the resist film PR5 is applied to the upper surface PS of the semiconductor substrate SB and then patterned using a photolithographic technique.

In Step S32, next, as shown in FIG. 58, using the patterned resist film PR5 as a mask, the conductive film CF1 is etched by, e.g., dry etching or the like to be patterned. As a result, in the memory formation region MR, the gate electrode CG made of the conductive film CF1 is formed. On the other hand, in the lower-breakdown-voltage MISFET formation region LR and the higher-breakdown-voltage MISFET formation region HR, the conductive film CF1 is left.

In Step S32, next, as shown in FIG. 59, the patterned resist film PR5 is removed by, e.g., ashing.

Figure 60:
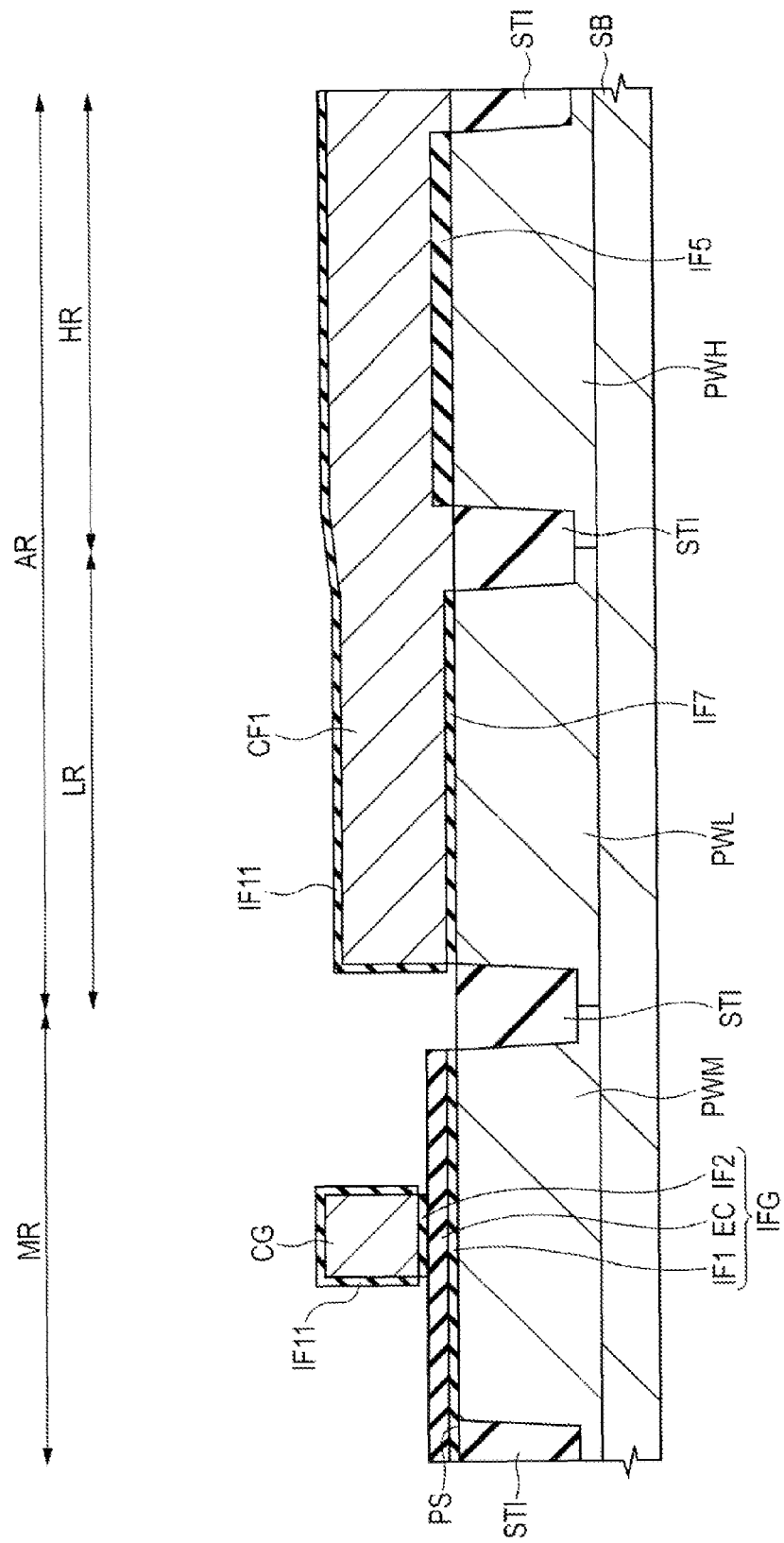
FIG. 60 is a main-portion cross-sectional view of the semiconductor device in Embodiment 3 during the manufacturing process thereof.
Figure 61:
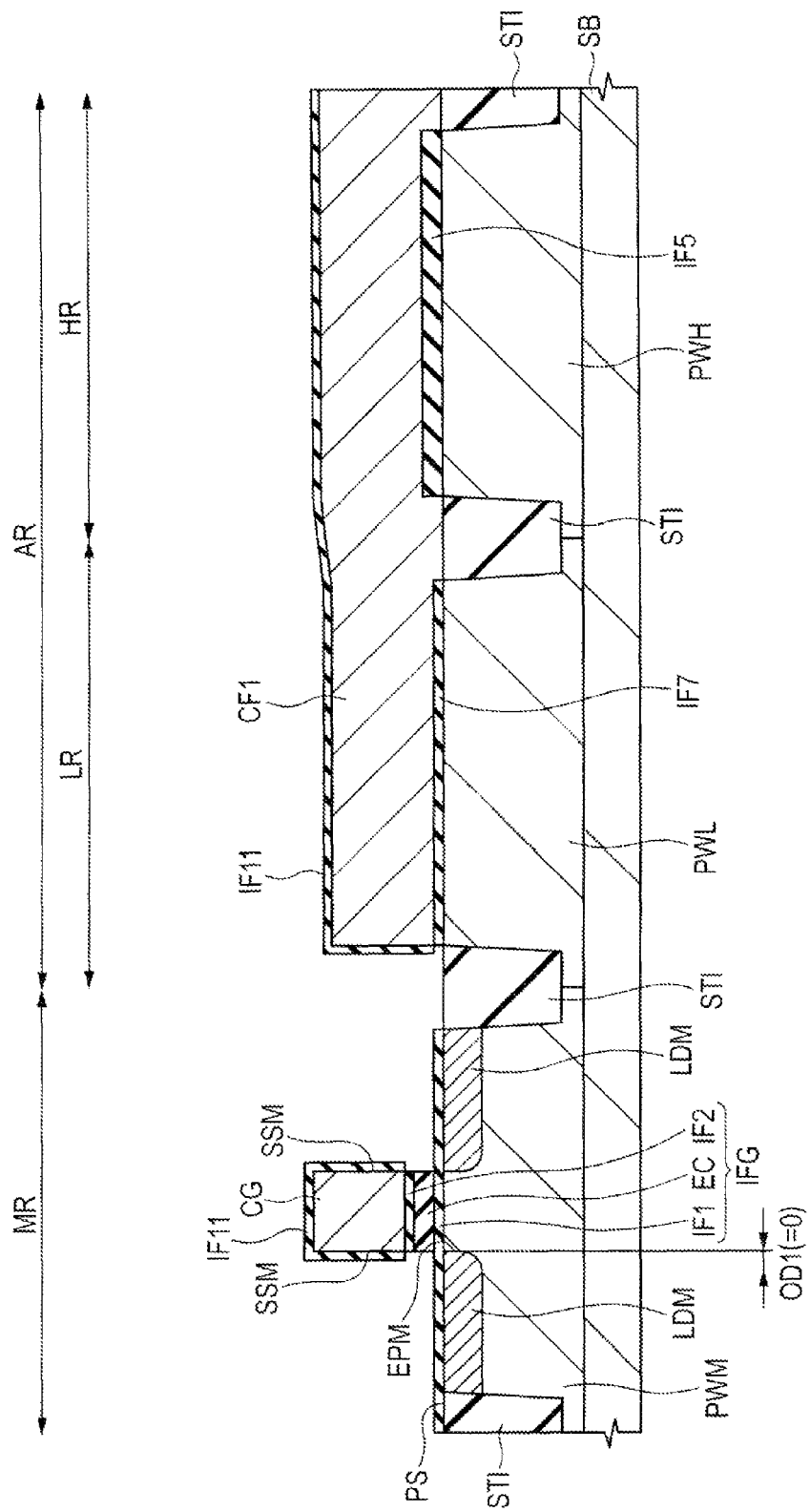
FIG. 61 is a main-portion cross-sectional view of the semiconductor device in Embodiment 3 during the manufacturing process thereof.

Next, as shown in FIGS. 60 and 61, in the memory formation region MR, the insulating film IFG is patterned to form the n$^-$-type semiconductor regions LDM (Step S33 in FIG. 57).

In Step S33, first, as shown in FIG. 60, in the memory formation region MR, the portions of the insulating film IF2 made of, e.g., silicon dioxide which are exposed from the gate electrode CG, i.e., which are located on both sides of the gate electrode CG interposed therebetween in plan view are removed by wet etching using, e.g., a hydrofluoric acid (HF). As a result, in the memory formation region MR, the portions of the insulating film IF made of, e.g., silicon dioxide which are located on both sides of the gate electrodes CG interposed therebetween in plan view are removed. Consequently, the portions of the charge storage film EC made of, e.g., silicon nitride which are located on both sides of the gate electrode CG interposed therebetween in plan view are exposed from the insulating film IF2.

In Step S33, next, as shown in FIG. 60, in the memory formation region MR, the side and upper surfaces of the gate electrode CG made of, e.g., a polysilicon film are oxidized by, e.g., a thermal oxidation method or the like to form an insulating film IF11 made of silicon dioxide over the side and upper surfaces of the gate electrode CG. At this time, in the lower-breakdown-voltage MISFET formation region LR and the higher-breakdown-voltage MISFET formation region HR, over the upper and side surfaces of the conductive film CF1 made of, e.g., a polysilicon film also, the insulating film IF11 made of, e.g., silicon dioxide is formed. On the other hand, in the memory formation region MR, the upper surface of the portion of the charge storage film EC made of, e.g., silicon nitride which is exposed from the insulating film IF2 is not oxidized.

In Step S33, next, as shown in FIG. 61, in the memory formation region MR, the portions of the charge storage film EC made of, e.g., silicon nitride which are exposed from the gate electrode CG and the insulating film IF2, i.e., which are located on both sides of the gate electrode CG interposed therebetween in plan view are removed by wet etching using, e.g., a hot phosphoric acid. As a result, in the memory formation region MR, the portions of the charge storage film EC made of, e.g., silicon nitride which are located on both sides of the gate electrode CG interposed therebetween in plan view are removed. Consequently, the portions of the insulating film IF1 made of, e.g., silicon dioxide which are located on both sides of the gate electrode CG interposed therebetween are exposed from the charge storage film EC. On the other hand, the insulating film IF11 made of, e.g., silicon dioxide and formed over the top surfaces of the gate electrode CG and the conductive film CF1 is left without being removed to be able to protect the gate electrode CG and the conductive film CF1 from the hot phosphoric acid.

In Step S33, next, as shown in FIG. 61, the n$^-$-type semiconductor regions LDM are formed. In the step of forming the n$^-$-type semiconductor regions LDM, first, in the memory formation region MR, using the gate electrode CG as a mask, an n-type impurity such as, e.g., arsenic (As) or phosphorus (P) is introduced into the p-type well PWM of the semiconductor substrate SB. At this time, in the memory formation region MR, using the gate electrode CG as a mask, n-type impurity ions are implanted into the semiconductor substrate SB.

As a result, in the memory formation region MR, in the respective upper-layer portions of the parts of the p-type well PWM which are located on both sides of the gate electrode CG interposed therebetween in plan view, the n$^-$-type semiconductor regions LDM are formed. The n$^-$-type semiconductor regions LDM are formed by self-alignment with the both side surfaces of the gate electrode CG. That is, the n$^-$-type semiconductor regions LDM are formed in the upper-layer portions of the parts of the p-type well PWM which are adjacent to the gate electrode CG in plan view.

In Step S33, next, in the memory formation region MR, the portions of the insulating film IF11 made of, e.g., silicon dioxide which are exposed from the charge storage film EC, i.e., which are located on both sides of the gate electrode CG interposed therebetween in plan view are removed by wet etching using, e.g., a hydrofluoric acid (HF). Also, the insulating film IF11 made of, e.g., silicon dioxide and formed over the side and upper surfaces of the gate electrode CG is removed by wet etching using, e.g., a hydrofluoric acid (HF). At this time, in the lower-breakdown-voltage MISFET formation region LR and the higher-breakdown-voltage MISFET formation region HR, the insulating film IF11 made of, e.g., silicon dioxide and formed over the upper and side surfaces of the conductive film CF1 is removed. As a result, the structure shown in FIG. 29 is obtained, and the gate insulating film GIM made of the portion of the insulating film IFG which is located between the gate electrode CG and the p-type well PWM of the semiconductor substrate SB is formed.

Then, by performing the same process steps (Step S34 to S40 in FIG. 57) as Steps S14 to S20 in FIG. 5, the same semiconductor device as the semiconductor device in Embodiment 1 shown in FIG. 3 can be formed.

<About Damage in Forming Gate Insulating Film by Dry Etching>

In Embodiment 1, in the memory formation region MR, the insulating film IFG having the internal charge storage portion is patterned by dry etching to form the gate insulating film GIM. In such a case, in the area of the memory formation region MR other than the area thereof where the gate electrode CG is to be formed, the surface layer of the upper surface PS of the semiconductor substrate SB may be damaged or removed by dry etching.

Alternatively, in the memory formation region MR, in the n⁻-type semiconductor region LDM formed in the upper surface PS of each of the portions of the semiconductor substrate SB which are located on both sides of the gate electrode CG interposed therebetween in plan view, an electric property such as, e.g., mobility deteriorates or the reliability of such an electric property deteriorates. As a result, due to the degradation of transistor properties caused by, e.g., hot carriers or the like, the transistor properties of the MONOS transistor MC deteriorate or the reliability of the MONOS transistor deteriorates.

By contrast, in Embodiment 3, in the memory formation region MR, the insulating film IFG having the internal charge storage portion is patterned by wet etching to form the gate insulating film GIM. As a result, in the area of the memory formation region MR other than the area thereof where the gate electrode CG is to be formed, it is possible to more reliably inhibit the surface layer of the upper surface PS of the semiconductor substrate SB from being damaged or removed than in Embodiment 1.

Alternatively, in the memory formation region MR, in the n⁻-type semiconductor region LDM formed in the upper surface PS of each of the portions of the semiconductor substrate SB which are located on both sides of the gate electrode CG interposed therebetween in plan view, it is possible to more reliably inhibit an electric property such as, e.g., mobility or the reliability of such an electric property from deteriorating than in Embodiment 1. As a result, it is possible to inhibit the transistor properties from deteriorating due to, e.g., hot carriers, improve the transistor properties of the MONOS transistor MC, and improve the reliability of the MONOS transistor MC. This can more significantly improve the performance of the semiconductor device having the MONOS transistor MC than in Embodiment 1.

Note that, in Embodiment 3, when the side and upper surfaces of the gate electrode CG are oxidized in the memory formation region MR in Step S33, the upper surface PS of the semiconductor substrate SB in the lower-breakdown-voltage MISFET formation region LR and the higher-breakdown-voltage MISFET formation region HR is covered with the conductive film CF1 and is therefore not oxidized. Accordingly, the oxidation of the side and upper surfaces of the gate electrode CG in Step S33 does not affect the properties of the lower-breakdown-voltage MISFET QL and the higher-breakdown-voltage MISFET QH which are formed in the lower-breakdown-voltage MISFET formation region LR and the higher-breakdown-voltage MISFET formation region HR.

<Main Characteristic Features and Effects of Embodiment 3>

In the method of manufacturing the semiconductor device in Embodiment 3, in the same manner as in the method of manufacturing the semiconductor device in Embodiment 1, the conductive film CF1 is formed over the insulating film IFG formed in the memory formation region MR and over the insulating film IF7 formed in, e.g., the lower-breakdown-voltage MISFET formation region LR of the main circuit formation region AR. Then, in the memory formation region MR, the conductive film CF1 and the insulating film IFG are patterned to form the gate electrode CG and the gate insulating film GIM while, in the lower-breakdown-voltage MISFET formation region LR, the conductive film CF1 and the insulating film IF7 are left. Then, in the lower-breakdown-voltage MISFET formation region LR, the conductive film CF1 and the insulating film IF7 are patterned to form the gate electrode GEL and the gate insulating film GIL. As a result, Embodiment 3 also has the same effects as those of Embodiment 1.

On the other hand, in Embodiment 3, in the memory formation region MR, the insulating film IFG having the internal charge storage portion is patterned by wet etching to form the gate insulating film GIM. Accordingly, in the area of the memory formation region MR other than the area thereof where the gate electrode CG is to be formed, it is possible to more reliably inhibit the surface layer of the upper surface PS of the semiconductor substrate SB from being damaged or removed than in Embodiment 1. This can more significantly improve the performance of the semiconductor device including the MONOS transistor MC than in Embodiment 1.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising:
   (a) providing a semiconductor substrate;
   (b) forming a first insulating film, having an internal charge storage portion, directly contacting a main surface of the semiconductor substrate located in a first region;
   (c) after (b), forming a second insulating film over the main surface of the semiconductor substrate located in a second region;
   (d) forming a conductive film over the first and second insulating films;
   (e) patterning the conductive film and the first insulating film in the first region to form a first gate electrode made of the conductive film and form a first gate insulating film made of a portion of the first insulating film which is located between the first gate electrode and the semiconductor substrate, while leaving the conductive film and the second insulating film in the second region; and
   (f) after (e), patterning the conductive film and the second insulating film in the second region to form a second gate electrode made of the conductive film and form a second gate insulating film made of a portion of the second insulating film which is located between the second gate electrode and the semiconductor substrate.

2. The method of manufacturing the semiconductor device according to claim 1, further comprising:
(g) forming a first semiconductor region having a first conductivity type in the main surface of the semiconductor substrate located in the first region; and
(h) implanting first impurity ions having a second conductivity type opposite to the first conductivity type into the semiconductor substrate located in the first region using the first gate electrode as a mask,
wherein, in (b), after (g), the first insulating film is formed over the first semiconductor region,
wherein, in (h), a second semiconductor region having the second conductivity type is formed in an upper-layer portion of a part of the first semiconductor region which is adjacent to the first gate electrode in a plan view, and
wherein, in (f), after (h), the conductive film and the second insulating film are patterned to form the second gate electrode and the second gate insulating film.

3. The method of manufacturing the semiconductor device according to claim 2,
wherein (h) includes:
(h1) forming a first offset spacer over a first side surface of the first gate electrode; and
(h2) implanting the first impurity ions into the semiconductor substrate located in the first region using the first gate electrode and the first offset spacer as a mask, and
wherein, in (h2), the second semiconductor region is formed in an upper-layer portion of a part of the first semiconductor region which is located in the first region to be adjacent to the first gate electrode via the first offset spacer in the plan view.

4. The method of manufacturing the semiconductor device according to claim 3, further comprising:
(i) forming a third semiconductor region having the first conductivity type in the main surface of the semiconductor substrate located in the second region; and
(j) implanting second impurity ions having the second conductivity type opposite to the first conductivity type into the semiconductor substrate located in the second region using the second gate electrode as a mask,
wherein, in (c), after (i), the second insulating film is formed over the third semiconductor region,
wherein (j) includes:
(j1) forming a second offset spacer over a second side surface of the second gate electrode; and
(j2) implanting the second impurity ions into the semiconductor substrate located in the second region using the second gate electrode and the second offset spacer as a mask,
wherein, in (j2), a fourth semiconductor region having the second conductivity type is formed in an upper-layer portion of a part of the third semiconductor region which is located in the second region to be adjacent to the second gate electrode via the second offset spacer in the plan view, and
wherein a thickness of the first offset spacer in a direction perpendicular to the first side surface of the first gate electrode is larger than a thickness of the second offset spacer in a direction perpendicular to the second side surface of the second gate electrode.

5. The method of manufacturing the semiconductor device according to claim 2, further comprising:
(k) forming a fifth semiconductor region having the first conductivity type in the main surface of the semiconductor substrate located in the second region; and
(l) implanting third impurity ions having the second conductivity type opposite to the first conductivity type into the semiconductor substrate located in the second region using the second gate electrode as a mask,
wherein, in (c), after (k), the second insulating film is formed over the fifth semiconductor region,
wherein (l) includes:
(l1) forming a third offset spacer over a third side surface of the second gate electrode; and
(l2) implanting the third impurity ions into the semiconductor substrate located in the second region using the second gate electrode and the third offset spacer as a mask, and
wherein, in (l2), a sixth semiconductor region having the second conductivity type is formed in an upper-layer portion of a part of the fifth semiconductor region which is located in the second region to be adjacent to the second gate electrode via the third offset spacer in the plan view.

6. The method of manufacturing the semiconductor device according to claim 1,
wherein the first insulating film includes a third insulating film, a fourth insulating film over the third insulating film, and a fifth insulating film over the fourth insulating film,
wherein the third insulating film is made of a silicon dioxide, the fourth insulating film is made of a silicon nitride, and the fifth insulating film is made of a silicon dioxide, and
wherein (b) includes:
(b1) forming the third insulating film over the main surface of the semiconductor substrate located in the first region;
(b2) forming the fourth insulating film over the third insulating film; and
(b3) forming the fifth insulating film over the fourth insulating film.

7. The method of manufacturing the semiconductor device according to claim 6,
wherein (e) includes:
(e1) patterning the conductive film in the first region to form the first gate electrode made of the conductive film;
(e2) removing portions of the fifth insulating film which are located on both sides of the first gate electrode interposed therebetween in the plan view by wet etching using a hydrofluoric acid;
(e3) after (e2), forming a sixth insulating film made of a silicon dioxide over a top surface of the first gate electrode;
(e4) after (e3), removing portions of the fourth insulating film which are located on both sides of the first gate electrode interposed therebetween in the plan view by wet etching using a hot phosphoric acid; and
(e5) after (e4), removing respective portions of the third and sixth insulating films which are located on both sides of the first gate electrode interposed therebetween in the plan view by wet etching using a hydrofluoric acid.

8. The method of manufacturing the semiconductor device according to claim 6, further comprising:
(m) forming a seventh semiconductor region having seventh conductivity type in the main surface of the semiconductor substrate located in the second region, wherein (b) further includes:
(b4) forming a seventh insulating film made of a silicon nitride over the fifth insulating film,
wherein (m) includes:
(m1) forming an eighth insulating film made of a silicon dioxide over the main surface of the semiconductor substrate located in the second region;
(m2) after (m1), implanting fourth impurity ions having the seventh conductivity type into the semiconductor substrate located in the second region to form the seventh semiconductor region; and
(m3) after (m2) and (b4), removing the eighth insulating film by wet etching using a hydrofluoric acid, and
wherein, in (c), after (m3), the second insulating film is formed.

9. The method of manufacturing the semiconductor device according to claim 8, further comprising:
(n) forming a ninth insulating film made of a silicon dioxide over the main surface of the semiconductor substrate located in a third region,
wherein, in (a), the semiconductor substrate made of silicon is provided,
wherein (n) includes:
(n1) forming a tenth insulating film containing oxygen and silicon over the seventh insulating film located in the first region by an in situ steam generation (ISSG) oxidation method, forming an eleventh insulating film made of a silicon dioxide over the main surface of the semiconductor substrate located in the second region by the ISSG oxidation method, and forming the ninth insulating film over the main surface of the semiconductor substrate located in the third region by the ISSG oxidation method;
(n2) removing the tenth insulating film from the first region by wet etching using a hydrofluoric acid, leaving the eleventh insulating film in the second region, and leaving the ninth insulating film in the third region;
(n3) after (n2), removing the seventh insulating film from the first region by wet etching using a hot phosphoric acid; and
(n4) after (n3), removing the eleventh insulating film from the second region by wet etching using a hydrofluoric acid, leaving the fifth insulating film in the first region, and leaving the ninth insulating film in the third region,
wherein, in (c), after (n4), the second insulating film is formed,
wherein, in (d), the conductive film is formed over each of the first, second and ninth insulating films,
wherein, in (e), the conductive film and the ninth insulating film are left in the third region,
wherein, in (f), the conductive film and the ninth insulating film are patterned in the third region to form a third gate electrode made of the conductive film and form a third gate insulating film made of a portion of the ninth insulating film which is located between the third gate electrode and the semiconductor substrate, and
wherein a thickness of the ninth insulating film is larger than a thickness of the second insulating film.

10. The method of manufacturing the semiconductor device according to claim 8, further comprising:
(o) forming a twelfth insulating film over the main surface of the semiconductor substrate located in a fourth region,
wherein, in (d), the conductive film is formed over the first, second, and twelfth insulating films,
wherein, in (e), the conductive film and the twelfth insulating film are left in the fourth region,
wherein, in (f), the conductive film and the twelfth insulating film are patterned in the fourth region to form a fourth gate electrode made of the conductive film and form a fourth gate insulating film made of a portion of the twelfth insulating film which is located between the fourth gate electrode and the semiconductor substrate, and
wherein a thickness of the twelfth insulating film is larger than a thickness of the second insulating film.

11. The method of manufacturing the semiconductor device according to claim 1,
wherein a thickness of the first insulating film is larger than a thickness of the second insulating film.

12. The method of manufacturing the semiconductor device according to claim 1,
wherein the semiconductor device includes a nonvolatile memory, and
wherein the nonvolatile memory is formed of the first gate electrode and the first gate insulating film.

13. The method of manufacturing the semiconductor device according to claim 1, wherein a bottom surface of the first insulating film contacts the main surface of the semiconductor substrate in the first region.

14. The method of manufacturing the semiconductor device according to claim 1, wherein, in (d), the conductive film is a continuous film that contacts both the first and second insulating films.

* * * * *